United States Patent [19]
Reipur et al.

[11] Patent Number: 5,686,815
[45] Date of Patent: Nov. 11, 1997

[54] METHOD AND APPARATUS FOR CONTROLLING THE CHARGING OF A RECHARGEABLE BATTERY TO ENSURE THAT FULL CHARGE IS ACHIEVED WITHOUT DAMAGING THE BATTERY

[75] Inventors: John Reipur, Klampenborg; Ebbe Juul-Hansen, Stenløse, both of Denmark

[73] Assignee: Chartec Laboratories A/S, Denmark

[21] Appl. No.: 388,680

[22] Filed: Feb. 14, 1995

Related U.S. Application Data

[63] Continuation-in-part of Ser. No. 104,123, filed as PCT/DK92/00047, Feb. 14, 1992, and a continuation-in-part of PCT/DK93/00267, Aug. 16, 1993.

[51] Int. Cl.[6] .................. H01M 10/44; H01M 10/46; H01M 10/48

[52] U.S. Cl. .................. 320/21; 320/22; 320/48; 429/90; 324/426

[58] Field of Search .................. 320/2, 5, 21, 22, 320/30, 31, 39, 48, 35; 324/426, 427; 340/635; 429/90

[56] References Cited

U.S. PATENT DOCUMENTS

| | | |
|---|---|---|
| 4,031,450 | 6/1977 | Hammel et al. . |
| 4,052,656 | 10/1977 | Lavell et al. . |
| 4,179,648 | 12/1979 | Samsioe . |
| 4,302,714 | 11/1981 | Yefsky . |
| 4,361,809 | 11/1982 | Bil et al. . |
| 4,371,826 | 2/1983 | Shelly . |
| 4,388,582 | 6/1983 | Saar et al. . |
| 4,392,101 | 7/1983 | Saar et al. . |
| 4,468,605 | 8/1984 | Fitzgerald et al. . |
| 4,503,378 | 3/1985 | Jones et al. . |
| 4,622,508 | 11/1986 | Matteau et al. . |
| 4,639,655 | 1/1987 | Westhaver et al. . |
| 4,667,143 | 5/1987 | Cooper et al. . |
| 4,670,703 | 6/1987 | Williams . |
| 4,710,694 | 12/1987 | Sutphin et al. . |
| 4,746,854 | 5/1988 | Baker et al. . |
| 4,947,124 | 8/1990 | Hauser . |
| 4,961,043 | 10/1990 | Koenck . |
| 5,013,992 | 5/1991 | Eavenson et al. . |
| 5,049,803 | 9/1991 | Palanisamy . |
| 5,121,047 | 6/1992 | Goedken et al. . |
| 5,136,231 | 8/1992 | Faulk . |
| 5,157,320 | 10/1992 | Kuriloff . |
| 5,179,335 | 1/1993 | Nor . |
| 5,198,743 | 3/1993 | McClure et al. . |

FOREIGN PATENT DOCUMENTS

| | | |
|---|---|---|
| 0 005 841 A2 | 12/1979 | European Pat. Off. . |
| 0 034 003 | 8/1981 | European Pat. Off. . |
| 0 074 444 A1 | 3/1983 | European Pat. Off. . |
| 0 121 325 A2 | 10/1984 | European Pat. Off. . |
| 0 124 739 A1 | 11/1984 | European Pat. Off. . |

(List continued on next page.)

*Primary Examiner*—Edward Tso
*Attorney, Agent, or Firm*—Michael A. Lechter; James H. Phillips

[57] ABSTRACT

In order to optimally control the charging of a rechargeable battery of one or more cells to ensure that full and rapid charge is achieved without damaging the battery, a maximum safe value (or sequence of values during the charging process) for one or more charging parameters is determined during a test charge, and subsequent charges of the battery are performed without exceeding the predetermined maximum value(s) for the charging parameter(s). Among the charging parameters contemplated for use are: the charging voltage potential placed across the battery terminals, the charging current supplied to the battery, the temperature of the battery cell and internal pressure of the battery cell as well as rates of changes of the parameters. In accordance with apparatus for practicing the invention, the value(s) of one or more predetermined maximum parameters are stored, and the corresponding actual charging parameter values are measured during the charging process and compared to the stored values to develop signals for controlling the charging process and thereby maintain the monitored parameter(s) no higher than the predetermined maximum value(s).

130 Claims, 32 Drawing Sheets

FOREIGN PATENT DOCUMENTS

| | | |
|---|---|---|
| 0 139 988 | 5/1985 | European Pat. Off. . |
| 0 181 112 | 5/1986 | European Pat. Off. . |
| 0 293 664 | 12/1988 | European Pat. Off. . |
| 0 361 859 | 4/1990 | European Pat. Off. . |
| 0 399 821 | 11/1990 | European Pat. Off. . |
| 0 432 690 | 6/1991 | European Pat. Off. . |
| 0 523 526 A2 | 1/1993 | European Pat. Off. . |
| 0 526 874 A2 | 2/1993 | European Pat. Off. . |
| 0 545 633 A1 | 6/1993 | European Pat. Off. . |
| 27 30 195 A1 | 1/1979 | Germany . |
| 33 08 515 | 9/1983 | Germany . |
| 90 10972.4 | 8/1990 | Germany . |
| 39 24 499 A1 | 1/1991 | Germany . |
| 40 27 146 A1 | 3/1992 | Germany . |
| 2 182 155 | 5/1987 | United Kingdom . |
| 2 219 151 | 11/1989 | United Kingdom . |
| 2 237 696 | 5/1991 | United Kingdom . |
| 2 259 615 | 3/1993 | United Kingdom . |
| 2 260 231 | 4/1993 | United Kingdom . |
| WO 86/00418 | 1/1986 | WIPO . |
| WO 89/08940 | 9/1989 | WIPO . |
| WO 90/03682 | 4/1990 | WIPO . |
| WO 91/19343 | 12/1991 | WIPO . |
| WO 92/15142 | 9/1992 | WIPO . |
| WO 92/16991 | 10/1992 | WIPO . |
| WO 94/01913 | 1/1994 | WIPO . |
| WO 94/01914 | 1/1994 | WIPO . |

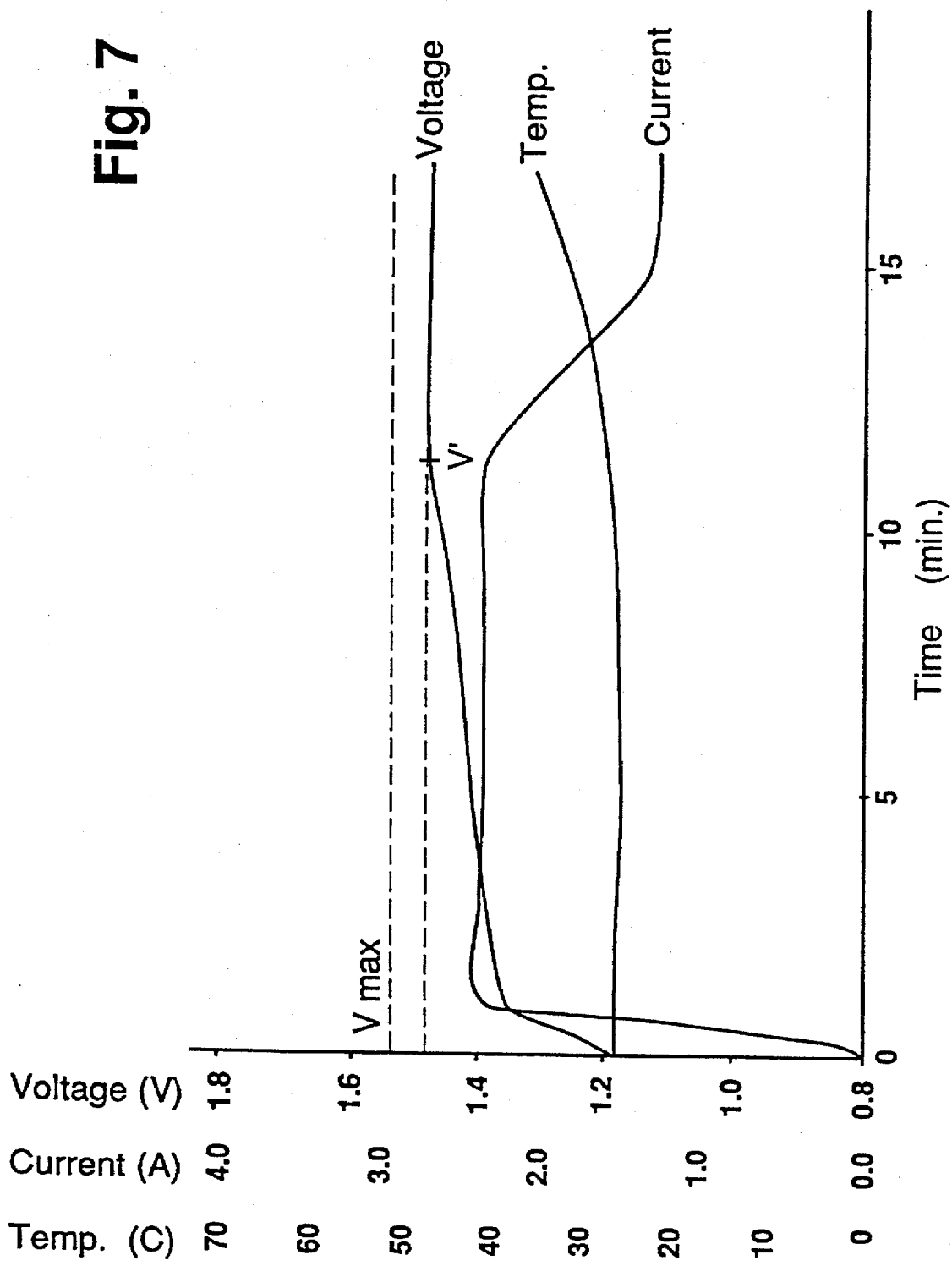

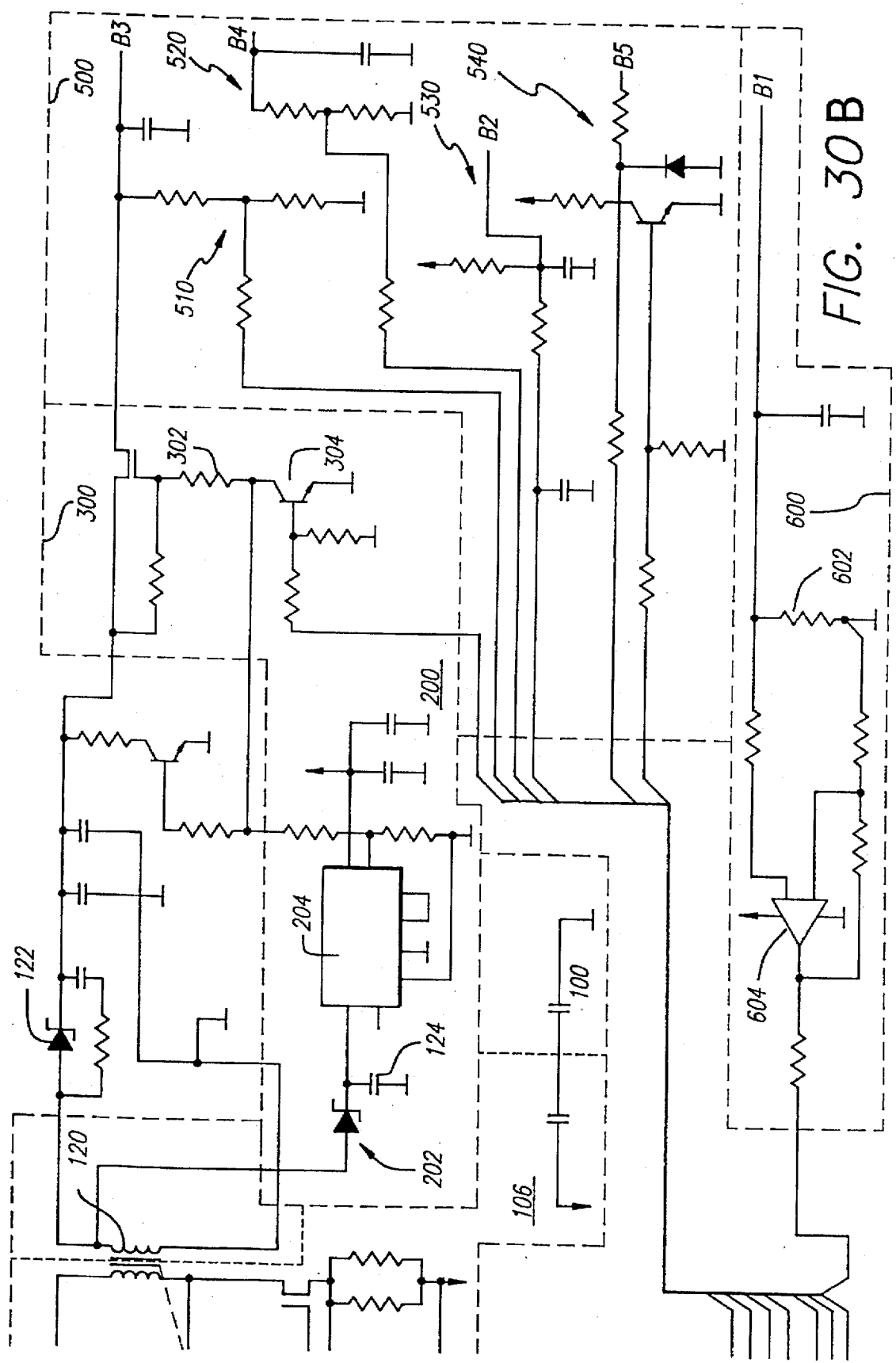

FIG. 31

| | | |
|---|---|---|
| CHARGE TIME COUNTER | | 3102 |
| CURRENT (AVERAGE) | | 3104 |
| CHARGE VOLTAGE | | 3106 |
| TEMPERATURE | | 3108 |
| BATT. VOLTAGE | | 3110 |
| BATT. CODE | | 3112 |
| CURRENT(1) ... 3116 ... CURRENT(10) | CHARGE VOLTAGE(1) 3118 ... CHARGE VOLTAGE(10) | TEMP.(1) 3120 ... TEMP.(10) | BATT. VOLTAGE(1) 3122 ... BATT. VOLTAGE(10) | AVERAGING STACKS | 3114 |
| CHARGE FLAG | | 3124 |
| BATT. INFO TABLE | | 3126 |
| Tshort | | 3128 |
| Thicharge | | 3130 |
| Tlowcharge | | 3132 |
| Tcutmin | | 3134 |
| Tdisconnect | | 3136 |
| Vmax($temp_1$) ... Vmax($temp_n$) | | 3138 |
| Vrecharge($temp_1$) ... Vrecharge($temp_n$) | | 3140 |
| Imax | | 3142 |
| Itrickle | | 3144 |
| VOLTAGE LEVEL COUNT | | 3146 |
| TARGET VOLTAGE | | 3148 |
| Vmax | | 3150 |
| Vrecharge | | 3150 |

METHOD AND APPARATUS FOR CONTROLLING THE CHARGING OF A RECHARGEABLE BATTERY TO ENSURE THAT FULL CHARGE IS ACHIEVED WITHOUT DAMAGING THE BATTERY

CROSS-REFERENCE TO RELATED APPLICATIONS

The present application is a continuation-in-part application of: (1) U.S. Pat. application Ser. No. 08/104,123, filed on Sep. 16, 1993, which is a U.S. national phase patent application of PCT application No. PCT/DK92/00047, filed Feb. 14, 1992, and (2) PCT application No. PCT/DK93/00267, international filing date of Aug. 16, 1993.

BACKGROUND OF THE INVENTION

The present invention relates to methods and apparatus for controlling the charging of a rechargeable battery and, more particularly, to optimizing the charging or discharging process of such batteries to ensure that full charge is achieved without damaging the battery.

Rechargeable storage cells or batteries are electrochemical devices for storing and retaining an electrical charge and later delivering that charge as useful power. A battery may typically have a number of storage cells connected together to form a battery having specific voltage or current delivery capability. A familiar example of a rechargeable battery is the nickel-cadmium, NiCd, battery used in portable electronic devices such as cameras and mobile telephones.

When charging a rechargeable battery, such as, for example, an NiCd battery, an electrical voltage greater than the terminal voltage of the battery is applied to the terminals of the battery, so that current flows through the battery. This current initiates a chemical process by which energy is stored in the battery.

When the battery has reached a full charge condition, the chemical process stops and the added energy is instead converted into heat. Because the battery is constructed as a sealed container, the pressure in the battery increases, and tends to cause mechanical and chemical destruction. Chemical destruction may reduce the capacity of the battery, and the capacity may eventually be reduced significantly after several such chargings. To optimize the battery utilization, it is therefore important to ensure not only that the battery will be charged fully, but also that charging is interrupted before the generation of heat becomes too great. Thus, it is desirable to accurately control the charging process to obtain an almost optimum charging and/or to interrupt charging at a proper time.

Accurate control of the charging process is especially important when it is desired to charge the battery as quickly as possible. Frequently, it is desirable that the charging period for a battery (the period of time necessary to charge the battery) be as brief as possible. This has led to the use of greater and greater charging currents. Higher levels of current, however, may tend to accelerate the heat-generating process within the battery. Because the heat-generating process may be accelerated, it is particularly important to interrupt (e.g., terminate) the charging at the proper time. If the charging is interrupted too late, the result is heat generation and mechanical and chemical destruction as mentioned, and if the charging is cut off too early, the battery will be charged only to part of its full capacity.

In a typical charging process, the voltage across the battery initially increases evenly as the battery is charged. However, as the battery approaches its full state of charge, the voltage increases more steeply to a peak (the full state of charge). The voltage then drops again; after the full charge is reached, temperature increases, and the temperature coefficient of the voltage is negative. Correspondingly, the charging current typically falls to a minimum at full charge and then increases.

A number of methods are known which attempt to terminate charging at the proper time. However, they have all been found to be lacking in precision.

For example, one known method comprises measuring the temperature of the battery and cutting off the charging when an increase in temperature is observed. However, by the time the increase in temperature is sufficiently high to measure, it is often too late. It is also difficult to measure the temperature with sufficient accuracy, because among other things, there may be variations in the ambient temperature. This is the case, e.g., if a battery from an automobile telephone is moved in winter from a cold car to a charger which is at room temperature.

Other known methods involve measuring the voltage across the battery or the magnitude of the charging current and terminating charging when the voltage or current assumes a specific level. However, it is very difficult to determine the voltage (or current) at which charging should be terminated. For example, voltage, at full capacity, often varies somewhat from battery to battery, even in case of batteries of the same type. Moreover, the voltage is temperature dependent. Similarly, it is possible to measure the charging current, and the same observations apply here as well.

Many known chargers use a fixed period of time; charging is simply terminated after the elapse of this time. However, the time period necessary to charge the battery is strongly dependent upon the initial charge on the battery (whether the battery is completely or only partially discharged), and the battery charge state. This might be solved by fully discharging the battery prior to the charging. However, such an approach is unsatisfactory, in addition to the waste of energy involved, it takes a certain time, and there will still be a good deal of difference between the necessary charging time from battery to battery.

A more advanced method is to measure the voltage change (or current change) as a function of time, i.e. the slope of a curve showing the voltage as a function of time. For example, U.S. Pat. No. 4,052, 656 discloses a method which detects the point at which this slope is zero, corresponding to the peak occurring where the battery is fully charged. However, it is difficult to determine this point accurately since the curve approaching the peak may be very flat. Further, there may be other points on the curve where the slope is zero, resulting in premature termination of charging.

U.S. Pat. No. 4,747,854 describes a system which detects when the voltage curve assumes a negative slope exceeding a reference value. The observations made with respect to zero slope detection also apply here. Moreover, by the time the negative slope occurs, the battery may have already been overcharged to a point sufficient to damage the battery.

U.S. Pat. No. 4,388,582 similarly describes a system which measures the slope of the voltage curve to find the point where the slope of the curve begins to decrease after having been increasing. While the battery will rarely be overcharged using this method, the systems remain susceptible to premature termination of charging; the battery is often only charged to part of its full capacity. Further, there is also risk of incorrect measurements if, e.g., the charging current or the voltage supply is changed during charging.

Use of a combination of various of the above-mentioned methods is also known. For example, U.S. Pat. No. 4,639,655 describes a system which uses four stop criteria, viz. a voltage limit, a predetermined time limit, a calculated increase on the voltage curve, as well as the point where the slope of the voltage curve is zero. The charging is interrupted if any one of these criteria is satisfied. The predetermined time limit is selected after the charging has begun; an initial voltage measurement is made, a short or a long charging time is selected, e.g., 1 hour or 1.75 hours on the basis of the measurement. The advantage of such an approach is that the battery discharge state and the number of cells in the battery can be taken into consideration from the beginning. However, such a system is rather imprecise, and remains susceptible to battery overcharging.

SUMMARY OF THE INVENTION

The methods of the present invention ensure full charging, but stop the charging process before heat generation within the battery becomes high enough to cause damage to the battery.

This is achieved according to various aspects of the present invention by monitoring a value and/or sequence of values (e.g., curve or plot) of at least one characteristic parameter of the charging process during at least part of the process of charging the battery, comparing the measured value and/or sequence of values of the charging parameter(s) with corresponding reference values and/or sequences, and determining the remaining period necessary to charge the battery.

In accordance with another aspect of the present invention, the reference values suitably include sets of values representing ideal or desirable charging processes for different types of batteries and/or different battery conditions, and one may be selected based on the comparison of the measured values with the stored sets of reference parameters. At least part of the process of charging the battery is then controlled on the basis of one or more reference parameters of the selected set.

In accordance with various aspects of the invention, a first characteristic parameter may be controlled during at least part of the process of charging to obtain a predetermined desired sequence of a second of the characteristic parameters. For example, the first parameter may be the charging current while the second parameter may be the charging voltage.

When a battery is to be charged for the first time, or when the battery has been stored for a long time without charging, such battery (hereinafter called a "virgin battery") cannot immediately accept the normal full charging current. Therefore, the process of charging such virgin battery cannot be controlled in the same manner as another battery of the same type and with the same state of charge, but not being a virgin battery. Consequently, it would be advantageous to test the battery to be charged prior to actual charging in order to find out whether the battery is a virgin battery, which needs an individual "nursing" program which may, for example, involve a relatively low charging current for a shorter or longer period of time. Also, batteries which are not virgins may show some kind of anomaly.

Therefore, according to another aspect of the present invention, a rechargeable battery is charged by connecting the terminals of the battery to an electrical power source, initially test charging the battery by supplying a first test charging current to the terminals of the battery for a short first period of time, monitoring or measuring at least one test parameter at least during part of the test charging process or at the end thereof, subsequently test discharging the battery for a short, second period of time, monitoring or measuring at least one test discharging parameter during at least part of the test discharging process or at the end thereof, selecting or determining a sequence or values of at least one charging parameter based on the monitoring or measurements of the test charging and/or discharging processes, and subsequently at least partly charging the battery substantially in accordance with the sequence or values selected for the charging parameter(s).

The test charging of the battery may take place in any suitable manner. As an example, a predetermined fixed test charging voltage may be applied to the terminals of the battery for a predetermined period of time. Alternatively, the test charging voltage may be increased gradually or step-wise in a predetermined manner. In both cases, the charging current, the temperature of the battery, and/or the inner pressure of the battery may be surveyed or measured currently or at one or more selected points of the charging and/or discharging process.

Another possibility would be to control the test charging voltage to maintain the charging current at a predetermined level or to gradually or step-wise increase the test charging current in a predetermined manner. In the latter case, the charging voltage, the temperature of the battery, and/or the inner pressure of the battery may be monitored or measured.

It may be advantageous to repeat the test charging and discharging processes one or more times. If so, the sequence of the controlled test parameter (charging voltage or charging current) may be chosen differently for successive test charging processes.

Preferably, a relatively low test charging current is supplied to the battery, for example in the order of 0.2 C/h (CmA×h being the capacity of the battery) to prevent the temperature and/or the inner pressure of the battery from attaining values which could have a detrimental effect on the battery.

Each test charging period is preferably relatively short compared to the time period for the subsequent actual charging. As an example, each test charging may take a few seconds, such as 1 or 2 seconds.

The nursing program selected on the basis of the testing described above may comprise the total charging process of the battery and even a subsequent discharging process and a new charging process. If the nursing program selected is terminated before the battery is fully charged, the battery may be further charged. The further charging comprises: monitoring the value and/or sequence of at least one characteristic parameter of the charging process during at least part of the process of charging the battery; comparing the value and/or sequence of the charging parameter(s) with corresponding values and/or sequences of stored reference parameters representing ideal or desirable charging processes for different types of battery and/or different battery conditions; selecting based on the comparison one of the stored sets of reference parameters; and controlling at least part of the process of charging the battery on the basis of one or more reference parameters of the selected set.

A smaller or greater number of empirically determined reference parameters may be stored (such as graphs where values of the reference parameter are plotted versus the period of time lapsed since starting of the charging process), for example by electronic storing means, such as a memory.

When it is desired to rapidly charge the rechargeable battery without substantially deteriorating the battery, the ideal or desirable charging process mainly depends on the state of charge of the battery prior to starting the charging process. Therefore, the reference parameter sequences stored represent idealistic or desirable processes of charging for different starting states of charge of the battery. If the state of charge of the battery to be recharged is known or may be determined, the reference sequence with the starting state of charge closest to the actual state of charge of the battery to be recharged may be selected, and the process of charging the battery may be controlled to approximate the sequence of the parameter(s) to the selected reference sequence, whereby it may be secured that the battery is not at any time exposed to unduly high voltage or charging current or to undue heating.

In principle, the state of charge of the battery to be recharged may be determined by a special measuring step, and the corresponding reference parameter sequence adapted to the same or a similar starting state of charge may then be selected, for example, by providing the relevant information to an electronic control unit by suitable keys. In the preferred embodiment, however, the relevant reference sequence is selected automatically by an electronic control circuit.

The charging parameter may, for example, comprise the potential across the battery terminals, the electric charging current supplied to the battery, the temperature of the battery cell, the rate of change of any such parameter, and any combination of such parameters and/or rate of change.

It should be understood that the charging process may be controlled in any suitable manner by which the sequence of the charging parameter may be approximated to the selected reference parameter sequence. In the preferred embodiment, however, the process of charging is controlled by controlling the voltage supplied to the terminals of the battery. The voltage is preferably controlled so that the charging current applied to the battery is relatively low at the beginning of the charging process, while the charging current is preferably maintained at substantially the same maximum value during a subsequent major part of the charging process, to accelerate the same.

As mentioned previously, the selection of reference parameters may depend on the state of charge of the battery. Such state of charge may be determined by briefly supplying a voltage to the battery prior to the initiation of the charging process to measure one or more charging parameters. If the battery is fully charged, the charging process will not be initiated. If the battery is partly charged, such information may be used in selecting proper reference parameters for the charging process.

Controlling the charging process may comprise determining the remaining period of charging time when the value of at least one characteristic parameter fulfills a certain predetermined condition or predetermined conditions, and terminating the charging process when the remaining period of time has expired. In one embodiment according to the invention, the remaining period of charging time is determined when the characteristic parameter, such as charging voltage, charging current, battery temperature, or inner battery pressure, reaches a predetermined value.

Towards the end of the charging process, the internal resistance of the battery cell may increase so that the charging voltage tends to increase when the charging current is to be maintained at a relatively high predetermined value. A too high voltage may cause a detrimental temperature increase within the battery cells. Therefore, the voltage supplied to the terminals of the battery is preferably limited to a predetermined maximum, the charging process being terminated at the expiration of a predetermined remaining period of time starting when the voltage has reached the maximum. This means that the charging voltage is preferably kept at its maximum value during the predetermined remaining period of time, and as the inner resistance of the battery cells is increasing, the charging current will normally decrease gradually during this period of time, which is preferably selected so that the battery is substantially fully charged when the period of time has expired. Preferably, the predetermined remaining period of time is related to the reference sequence selected, which means that each reference parameter sequence includes information about not only the maximum charging voltage to be supplied to the battery, but also about the period of time in which such maximum voltage should be maintained at the end of the charging period.

As mentioned above, the reference parameter sequences to be compared with the actual parameter sequence may be curves or graphs, and the comparison process may be performed by a pattern recognition technique by means of pattern recognition circuitry. In the presently preferred embodiment, however, the charging parameter is currently measured at short time intervals during charging, the measured parameter values being compared with corresponding reference values of the reference parameter sequences, and the relevant reference parameter sequence being selected on the basis of comparison of such measured values and reference values. The comparison process may be performed currently during the charging process so that the control circuit or control unit may shift from one reference parameter sequence to another when the continued comparison process reveals that the reference parameter sequence chosen first is not the one which is closest to the actual charging process.

In comparing the charging parameter values with the reference values, it may be advantageous to compare the rate of change of the parameter values as a function of the charging time lapsed with similar reference values. As an example, the rate of change of the charging voltage as a function of the charging time lapsed may be compared with corresponding reference values. In order to permit the detection of the internal resistance or the potential of the battery, the charging current may be cut off for a short period of time immediately prior to each measurement of the potential difference of the battery terminals.

The parameter values may be measured and the rate of change of the parameter values may be determined at uniform first time intervals, each determination of the rate of change being based on parameter values measured at second time intervals, the second time interval being a multiple of the first time interval. The parameter values may be measured rather frequently, which means that the first time interval may be relatively short, for example about 10 seconds. The rate of change is, however, preferably based on measurements with a time spacing being several times greater, for example 90 seconds.

Determining the rate of change may be initiated at the beginning of the charging process. However, the determination of the rate of change may advantageously be postponed until a measured value of the characteristic parameters exceeds a predetermined value, after which distinguishable rates of change are found.

In a particular embodiment, there is a limited number of reference values, and a new stop point for the charging process is determined only when the parameter or parameters concerned assume one of the reference values. This results in a simpler procedure which can nevertheless normally determine the optimum stop point sufficiently accurately.

In particular, in case of fast charge mode using a high charging current, it may be advantageous to reduce the charging current gradually as the stop point approaches. Gradually reducing the charging current as the stop point approaches makes identifying the optimum stop point of time easier. Thus, charging may, for example, be performed with a constant high charging current (for example about 4 C milliamperes, when the capacity of the battery is C milliamperes×hour) until one of the measured parameters has reached a predetermined level, following which the current can be reduced gradually.

An expedient manner of obtaining the desired charging current is to use a constant voltage source which is pulse width modulated in a manner providing the desired charging current.

It may be an advantage to delay the procedure of determining the possible stop point for the charging process until the charging process approaches its termination. Thus, a simpler method may be used, such as simple measurement of current or voltage, for deciding when the more accurate procedure is to be initiated.

In a particular embodiment, the accuracy of the measurements is improved in that each of the measured values of the characteristic parameters for each of the mentioned points of time is an average value of a plurality of intermediate measurements. The measurements will then be less sensitive to transients, for example. Of course, the same effect can be obtained by integrating the parameter in question over the period which has elapsed since the last measurement.

As an additional safeguard, some of the stop criteria used in prior art methods may be adopted. Thus, for example, a maximum charge period may be fixed. Charging will then be interrupted at this point of time at the latest even though the other stop criteria have not yet occurred. Alternatively, limits may be fixed for one or more of the measured parameters so that charging is terminated if one of the parameters exceeds or drops below specific values. Furthermore, the charging process may be interrupted if and when the value or sequence surveyed deviates too much from any of the corresponding sequences or values of the stored reference parameters.

After the termination of charging, it may be expedient to maintain the charge state of the battery by means of a pulsating current. This ensures that the battery is constantly fully charged even if it is not removed from the charger till long after the termination of the charging.

The reference parameter sequences stored may comprise not only sequences representing charging processes, which are ideal or desirable for one and the same type of battery, but even a plurality of reference parameter sequences for each of two or more different types of battery. In such case, the first process step may be to determine the type of the battery to be charged and to select the reference parameter sequences related to that type of battery. Thereafter, the process may proceed as described above.

The present invention also provides an apparatus comprising a connecting means for connecting the battery to an electrical power source, apparatus for surveying the value and/or sequence of at least one characteristic parameter of the charging process during at least part of the process of charging the battery, monitoring apparatus for storing a plurality of the values and/or sequences of reference parameters representing idealistic or desirable charging processes for different types of battery and/or different battery conditions, apparatus for comparing the value and/or sequence of the at least one charging parameter with the values and/or sequences of the stored reference parameters and for selecting based on the comparison one of the stored sets of reference parameters, and apparatus for controlling at least part of the process of charging the battery on the basis of one of more reference parameters of the selected set.

The operation of such an apparatus may, for example, be controlled by a microprocessor or another electronic control device, which may also comprise a memory for storing the reference parameter sequences or values.

According to a further aspect, the present invention provides a battery system comprising a rechargeable battery including a pair of battery terminals and information means for containing information about the battery, and a charging apparatus including a pair of charger terminals, means for releasably interconnecting the battery and the charging apparatus so that the battery terminals are in electrical conductive contact with the charger terminals, and information receiving means for receiving information from the information means of the battery, whereby the charging of the battery may be controlled based on the information. The battery system may comprise control means for controlling the charging process based on information received by the information receiving means.

The information means of the battery may be more or less sophisticated. In the most simple form, the information means may, for example, comprise an indicator which is removed, inactivated, and/or destroyed when the battery is charged for the first time. The presence of such an indicator would inform the control means that the battery should be charged in accordance with a "nursing program" suitable for a virgin battery of the battery type in question. Alternatively or additionally, the information means may comprise an information code which may be read or sensed by the information receiving means of the charger. Such information code may be read or sensed by mechanical, optical, electromagnetic, and/or electronic reading or sensing means, and the code may, for example, contain information about the type, capacity, maximum charging voltage, maximum charging current, maximum temperature, maximum inner pressure and/or other characteristics of the battery. Furthermore, the information means may, alternatively or additionally, comprise a temperature sensor for sensing the temperature of the battery.

In a preferred embodiment of the battery system, the charging current and/or charging voltage may initially be increased when the temperature sensed by the temperature sensor is low.

The invention also relates to a rechargeable battery for use in a battery system as described above, the battery comprising a pair of battery terminals and information means for containing battery information in a form which may be sensed or read by suitable information receiving means of a corresponding battery charging apparatus.

As described above, the information means may be rather simple. Alternatively, the information means may comprise an electronic memory for storing battery information. This battery information may then comprise information about one or more previous charging and discharging processes and/or about the present state and condition of the battery and its individual cells. Thus, the information means of the battery may inform the control means in detail about the condition of the battery, and the control means may then control the charging process on the basis of such information. Such charging may be controlled in accordance with any of the methods described above or by means of conventional charging methods. The battery information may for example comprise information about the type of the battery, the capacity of the battery, other specifications of the battery, charging status of the battery, the condition of the various battery cells, the last charging process, the last discharging process, the time period lapsed since the last charging and/or discharging process, charging parameter algorithms, and/or the internal battery pressure.

In order to monitor the internal pressure and/or temperature of the battery, the information means may comprise a pressure and/or temperature sensor located within the battery. These sensors are connected or connectable to the control means so that information about pressure and/or temperature may be transmitted to the control means.

The control means are preferably adapted to control charging of individual cells of the battery in response to information received from the information means, whereby it may be ensured that the cells of the battery are substantially uniformly charged.

It should be understood that the battery could also comprise an electronic display for displaying information from the memory in a directly readable form. It is also envisaged that the battery could also contain the control means. This means that the charging apparatus is eliminated or included in the battery unit. In such case, the battery should just be connected to a suitable electrical power supply.

Usually, the battery comprises several battery cells and in order for the information means to obtain information about the individual cells, such as voltage and/or temperature of each cell, the battery may further comprise means for measuring the voltage of each battery cell and means for storing the measured cell values in the information means.

In connection with the method of charging described above, it is presupposed that sequences or sets of reference parameters for the type of battery in question are known and available. The present invention provides a method for providing such sequences or sets of reference parameters. Thus, the present invention provides a method of determining a process of charging a rechargeable battery having a capacity C, the method comprising determining a maximum value for at least one charging parameter and controlling the charging process so as to not exceed the maximum value or values determined.

A set of maximum values obtained in the manner described above may form a reference for use in charging. Further reference values or parameters may be obtained by controlling other charging parameters to ensure the predetermined maximum charging parameters are not exceeded.

A set of maximum values and/or parameters which may be obtained as described above may be used in a controlled method of charging. The battery is then charged with a substantially constant charging current during part of the charging process, the substantially constant charging current preferably being several times the C-rate based on the capacity value determined or measured. As an example, the value or parameter may be the voltage. In that case, the voltage(s) of the battery or cell terminal(s) is (are) surveyed, and when a predetermined maximum terminal voltage of the battery or cell has been reached at a time Tmax, the charging process is controlled so as to maintain the battery or cell voltage substantially constant for the remaining period of the charging process. If the battery has at least two cells, the parameter or voltage of each cell of the battery may be monitored and the remaining period of the charging process may be controlled based on the voltage of the cell having a voltage first reaching the maximum cell terminal voltage. It should be understood that the charging process could be controlled based on any other charging parameter, such as the temperature of the battery or of the individual cells thereof.

It is also preferred that the stop point of the remaining charging period of the charging process is determined by surveying the charging current, and when no further decrease in the charging current has been detected for a predetermined period of time the charging process may be terminated. Alternatively, the charging process is stopped at a time, Tstop, the remaining charging period, Tstop minus Tmax, being determined generally at the time Tmax when the predetermined maximum battery or cell terminal voltage is reached. The remaining charging period Tstop minus Tmax, may be determined on the basis of a comparison of the battery or cell terminal voltage sequence with stored reference voltage sequences, or the remaining charging period may be determined in dependency of the value of Tmax.

In a preferred embodiment of the invention, the stop point, Tstop, and thus the remaining charging period is determined based on a comparison of the time, Tmax, at which the maximum voltage is reached, with stored reference values of time and corresponding remaining charging periods.

In connection with discharging, when the battery is used in operation, the present discharge invention provides a method for controlling a discharging process of a rechargeable battery having at least two cells, the method comprising monitoring the voltage of each cell of the battery, and interrupting the discharging process when the voltage of at least one cell drops to a predetermined threshold voltage.

BRIEF DESCRIPTION OF THE DRAWINGS

The invention will now be further described with reference to the drawing, in which:

FIG. 7 is a graphical representation corresponding to that shown in FIG. 3 for a battery with some anomaly;

FIG. 31 is a schematic representation of memory map utilized by a control circuit according to various aspects of the invention.

DETAILED DESCRIPTION OF A PREFERRED EXEMPLARY EMBODIMENT

Figure 1:
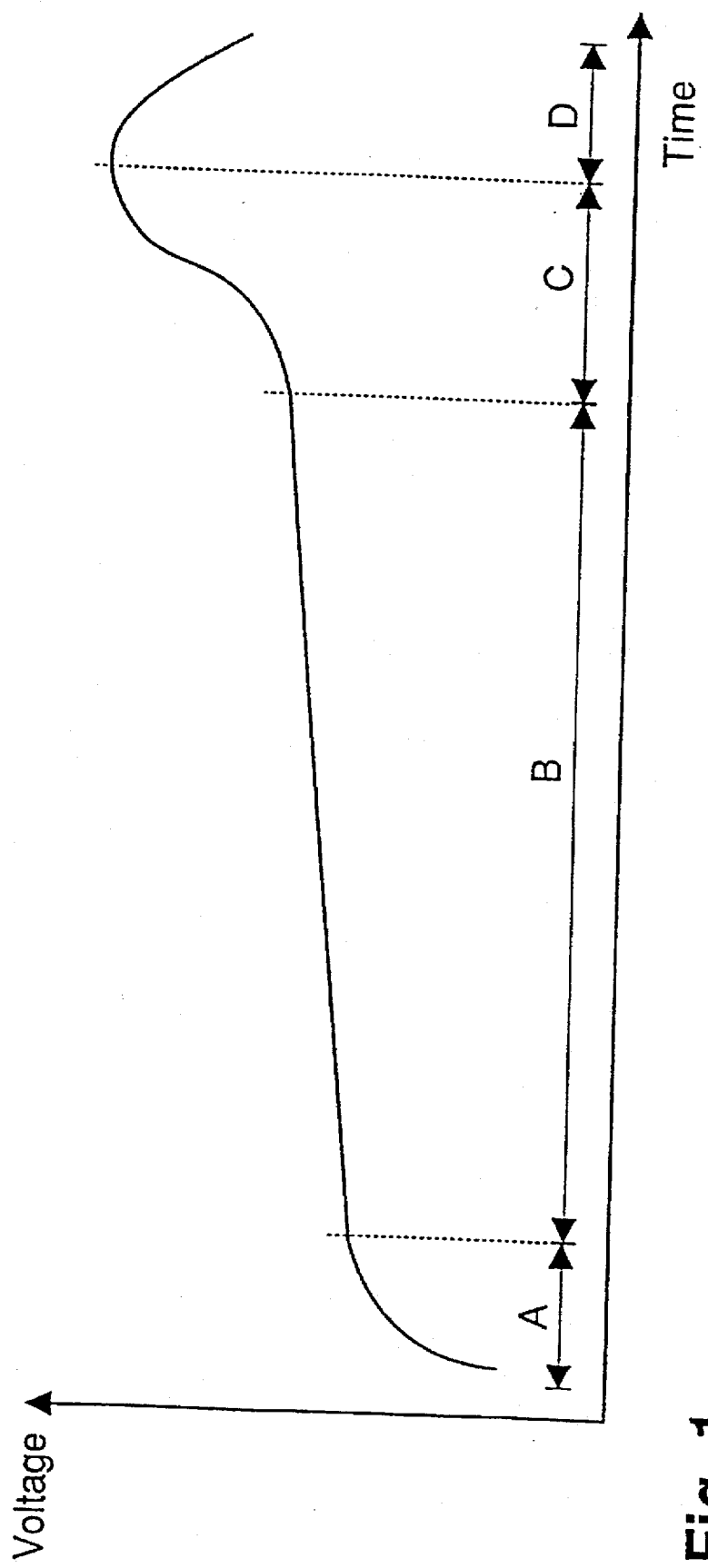
FIG. 1 is a graphical representation or curve showing the voltage as a function of time for an NiCd battery which is charged with a constant charging current.

It is normally desirable to fully charge a battery within the shortest possible charging period of time. However, the chemical reactions taking place within the cells of the battery limit the rate of charging. When the charging current is relatively low the charging current may be increased by increasing the charging voltage without any increase of the battery temperature, and the temperatur slightly when the charging drop slightly when the charging current is increased. However, after the charging current has reached the maximum value that can be accommodated by the chemical reactions, further increases in the charging voltage may cause a drastic increase of the battery temperature and also of the internal pressure of the battery. Accordingly, maximum values for battery (and/or cells thereof) temperature, the difference in temperature, inner pressure, charging voltage, and/or the terminal voltage are suitably determined, and the charging process controlled so that the maximum value(s) is (are) not exceeded.

For example, maximum values may be determined from values obtained when a relatively low charging current is supplied to the battery for a certain period of time, for example in the order of one hour or even up to 10 or 15 hours. The charging voltage may then be controlled so that the charging current is kept substantially constant at least during the later part of the charging process. The charging current supplied to the battery may, for example, be 0.05–0.3 C/h, 0.1–0.3 C/h, and preferably 0.2–0.25 C/h (C/h being the "C-rate"). This means that when the capacity of the battery being charged is, for example, C mA·h, the charging current may be 0.05–0.3 C mA, 0.1 C–0.3 mA, and preferably 0.2–0.25 C mA. Such charging current is relatively low and requires a charging time of e.g., 3.3–10 hours to fully charge the battery. Maximum values can be determined in such a manner for, e.g., battery/cell temperature and/or inner battery/cell pressure.

In order to obtain a shorter charging time, it is necessary to use a higher charging current in the major part of the charging period. The maximum value of the charging and/or terminal voltage is suitably determined by measuring the maximum voltage obtained when a relatively high charging current is supplied to the battery for a certain period of time, preferably sufficient to fully charge the battery. Such relatively high charging current may, for example, be 0.75–1.5 C/h, preferably about 1 C/h. When such a charging current is used, the necessary charging time for fully charging the battery is, e.g., 0.67–1.34 hours.

When determining the maximum value of the charging or terminal voltage, it is preferred to charge the battery with a charging current which is substantially equal to the C-rate based on the determined real value of the capacity of the battery. Furthermore, it is preferred to determine the maximum value of the voltage as the voltage measured across the battery or cell terminals at the point of time when the battery or cell temperature has increased by the maximum temperature difference determined during charging with the relatively low charging current. It is also preferred that the battery is substantially discharged before initiating any charging process for determining charging parameters.

Preferably, when determining one or more of the above mentioned maximum parameters, the battery is at least partly charged at a slow rate and subsequently discharged at least once prior to any further charging. It is further preferred that the relatively low charging current is supplied to the battery for such a long period of time that a rise in at least one of the charging parameters, such as battery or cell temperature, has been obtained and no further essential parameter change has been detected.

The real value of the capacity of the battery will often vary from the capacity stated by the battery manufacturer. Thus, the real value of the battery capacity is suitably determined; the battery is charged at the relatively slow rate and the capacity value of the battery determined by calculating or measuring a total first charging power supplied to the battery during charging until the battery is substantially fully charged. The point of time when the battery is substantially fully charged may be determined as the point of time when no further rise in parameter value(s) has (have) been detected for a predetermined period of time. The parameter values may, for example, be the temperature and/or the terminal voltage of the battery and/or cells thereof.

If the battery is being charged for the first time (is a virgin battery) or a rather long period of time has passed since last charging, it is important to ensure that the battery "gets started," i.e. that the chemical reaction within the cells is normal. This may be accomplished by employing a nursing program; the battery is suitably at least partly charged rather slowly and subsequently discharged at least once prior to determining the maximum value of parameters.

During a charging sequence, certain parameters of a battery, e.g., the voltage and current, manifest characteristic curves. For example, in a typical charging sequence, a battery is subject to a constant charging current over a period of time causing the battery voltage to increase. The shape of the curve representing the battery voltage as a function of time with a constant charging current will be generally the same for all batteries of a given type, e.g., NiCd, but the specific voltage and time values may vary, for example, with the actual charging current and from battery to battery. A representative curve for a NiCd battery is shown in FIG. 1. An analogous characteristic curve will result if the charging current is plotted as a function of time with a constant charging voltage, and reproducible curves showing the above-mentioned stages in the charging process will be obtained even if neither charging current nor charging voltage is kept constant.

The curve may be divided into four nominal regions representing various stages in the charging process marked A, B, C, and D, respectively, in FIG. 1.

Region A corresponds to the start of the charging process. When the charging process is initiated, the voltage may vary somewhat depending upon the state of charge of the battery prior to the initiation of charging. Thus, the voltage in this region is rather indefinite (and therefore measurements of parameters are usually not performed in this region).

Region B corresponds to the actual charging period where substantially all of the charging current is converted into stored energy in the battery by a chemical process. In this period, the voltage of the battery increases only slowly.

In Region C, the full state of charge approaches and is ultimately obtained. During this phase, the voltage initially increases more rapidly. However, as the full charge is approached (i.e., the chemical process approaches exhaustion), gas begins to develop in the cells of the battery. This results in an increase in pressure and in temperature in the battery. Battery voltage has a negative temperature coefficient. Accordingly, the voltage begins to increase more slowly. Ultimately, at the end of Region C, the battery voltage ceases to increase; the voltage has reached its highest value or peak value at the transition between Regions C and D.

Region D corresponds to continued application of current after full charge has been reached (i.e., after the chemical process is exhausted). If the charging process is continued in Region D, the electrical energy is now generally converted into heat and the battery voltage drops. The resulting increase in temperature and pressure will cause destruction of the battery and concomitant reduction in capacity. Therefore, the charging process should advantageously be terminated at the commencement of or in the beginning of the period D.

The curve of FIG. 1 may vary somewhat in response to the charging current used and the "charging history" of the battery in question; however, tests have shown that there is close correlation between various charging parameter values within the regions A, B, and C, such as the instantaneous slope of the voltage curve at a certain time or moment in the region C and the time difference from the moment in question to the optimum time to terminate (stop point for) the charging process.

The present invention employs the correlation between parameter values to optimize the charging process. Suitably, if information about the correlation between parameter values (e.g., curve slope) and charging period is stored, the parameter e.g., the slope of the curve at a given moment, is sampled; and the charging period required to reach the optimum time to terminate (stop point for) the charging process is calculated or otherwise determined.

Figure 2:
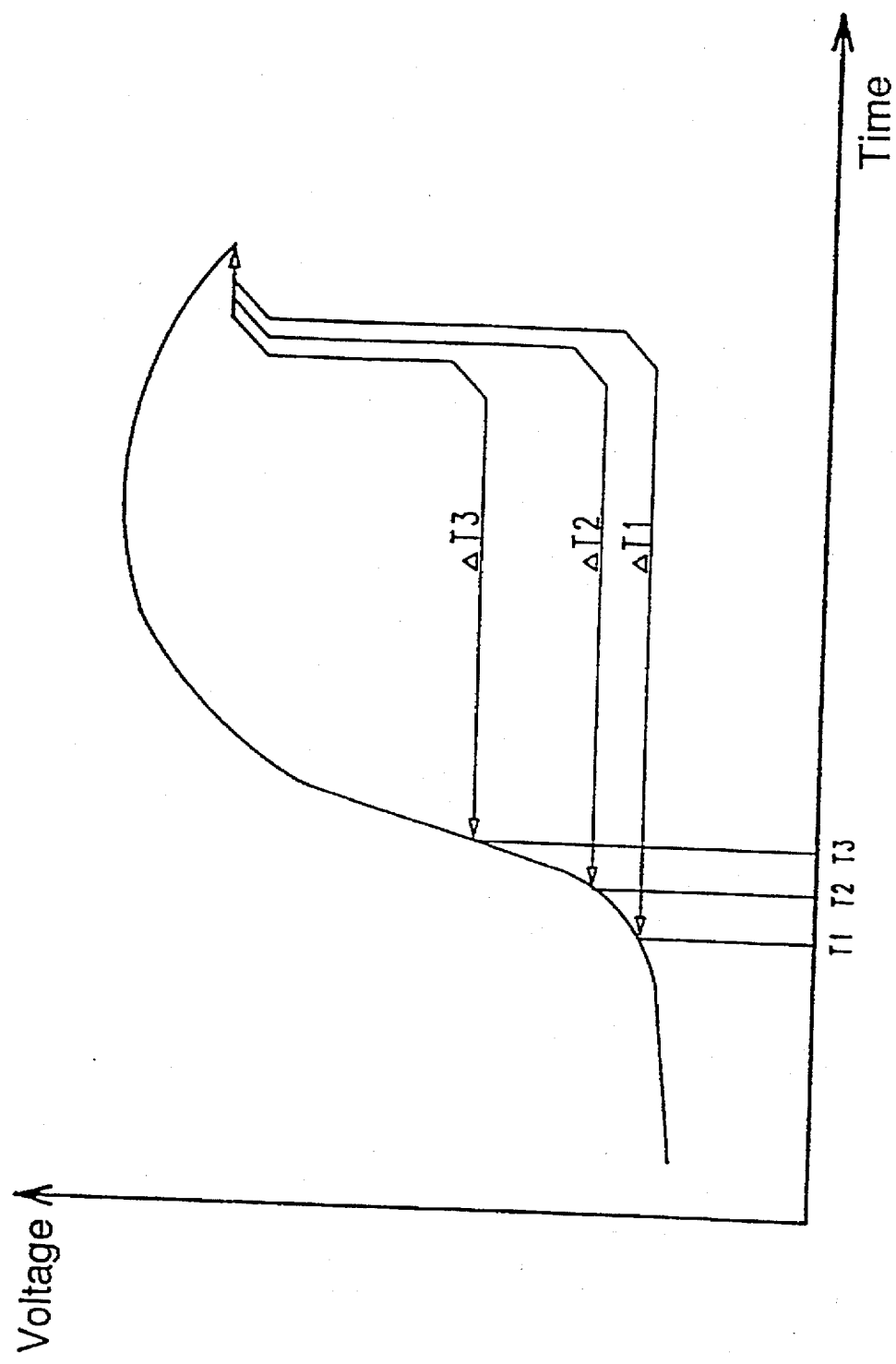
FIG. 2 shows in an enlarged scale part of the curve of FIG. 1.

Referring to FIG. 2, such a calculation may be performed at several consecutive moments to generate indicia of a corresponding number of potential optimum termination times (stop points). In the example of FIG. 2, three measurements are performed. A remaining charging period of delta T1 is calculated (or otherwise determined) at the point of time T1, a remaining charging period delta T2 is calculated (determined) at the point of time T2 and a remaining charging period delta T3 is calculated (determined) at the point of time T3. In the example of FIG. 2, the three calculated stop points are indicated as occurring at precisely the same moment. However, in practice the calculated stop points will usually differ slightly. If desired, the charging process may be terminated when the first one (earliest) of the calculated termination times occurs. However, more sophisticated stop criteria may also be utilized. For example, more importance may be attached to the last calculated termination times. It is possible, for example, to disregard some of the values first calculated if all the subsequent calculations gather around a specific value.

Corresponding curves of a different appearance will be obtained for other battery types. For certain battery types or parameters the correlation between the sampling time and the optimum time to terminate charging will not necessarily be associated with the slope of the curve at the moment in question, but with other parameters for the curve, for example, the absolute voltage at the moment concerned.

The relevant parameter may be sampled periodically, e.g., the instantaneous slope of the voltage curve may be measured at predetermined intervals, for example, every tenth second. For each measurement, a projected termination time is determined. The processor can then either store this value together with the others or it can incorporate it into a more sophisticated calculation of the charging process termination time.

Alternatively, a predetermined number of reference values for the parameter, e.g., slope of the curve, are stored. The parameter is then periodically sampled. Each measured sample, e.g., the actual slope of the curve is then compared with the reference values. When the parameter (e.g., slope) passes (e.g., passes or exceeds) one of the reference values, the processor calculates a new termination time. In this manner, calculating time for the processor is saved, and the result will be fully satisfactory in many situations.

As mentioned, the curves in FIGS. 1 and 2 are provided with a constant charging current. However, when the parameter being measured is the voltage across the connection terminals of the battery, a more exact measurement is obtained if the charging current to the battery is cut off for a short period before the voltage is measured. Batteries have an internal series resistance, across which the charging current creates a voltage drop. This voltage drop is preferably not included in the voltage measurement. Thus, cutting off the charging current to the battery provides a more exact voltage measurement by effectively eliminating the voltage drop across the batteries' internal series resistance that is created by the charging current. Cutting off the charging current briefly each time a voltage measurement is performed results in a curve corresponding to that of FIGS. 1 and 2, but with slightly lower absolute voltage values; the curve does not include the voltage drop generated by the charging current across the internal resistance of the battery. Because this internal resistance typically increases at the end of the charging sequence, a voltage measurement without this contribution is a more accurate measure of the state of the battery.

As previously mentioned, reproducible voltage curves are obtained even if the charging current is not kept constant during the entire charging procedure. Accordingly, charging may be initially performed with a constant, high current which is then reduced toward the end of the charging procedure. By using the lower charging current during the last portion of the charging process, it is possible to determine the optimum stop point more precisely, without substantially affecting the overall charging time. If desired, a simple voltage measurement may be utilized during the first portion of the charging process. When the voltage has reached a predetermined value, the charging current may be reduced, and the measurement of the slope of the curve may be initiated as described above. Of course, it is also possible to reduce the charging current at one voltage value and initiating the measurement of the slope of the curve at another voltage value.

Figure 3:
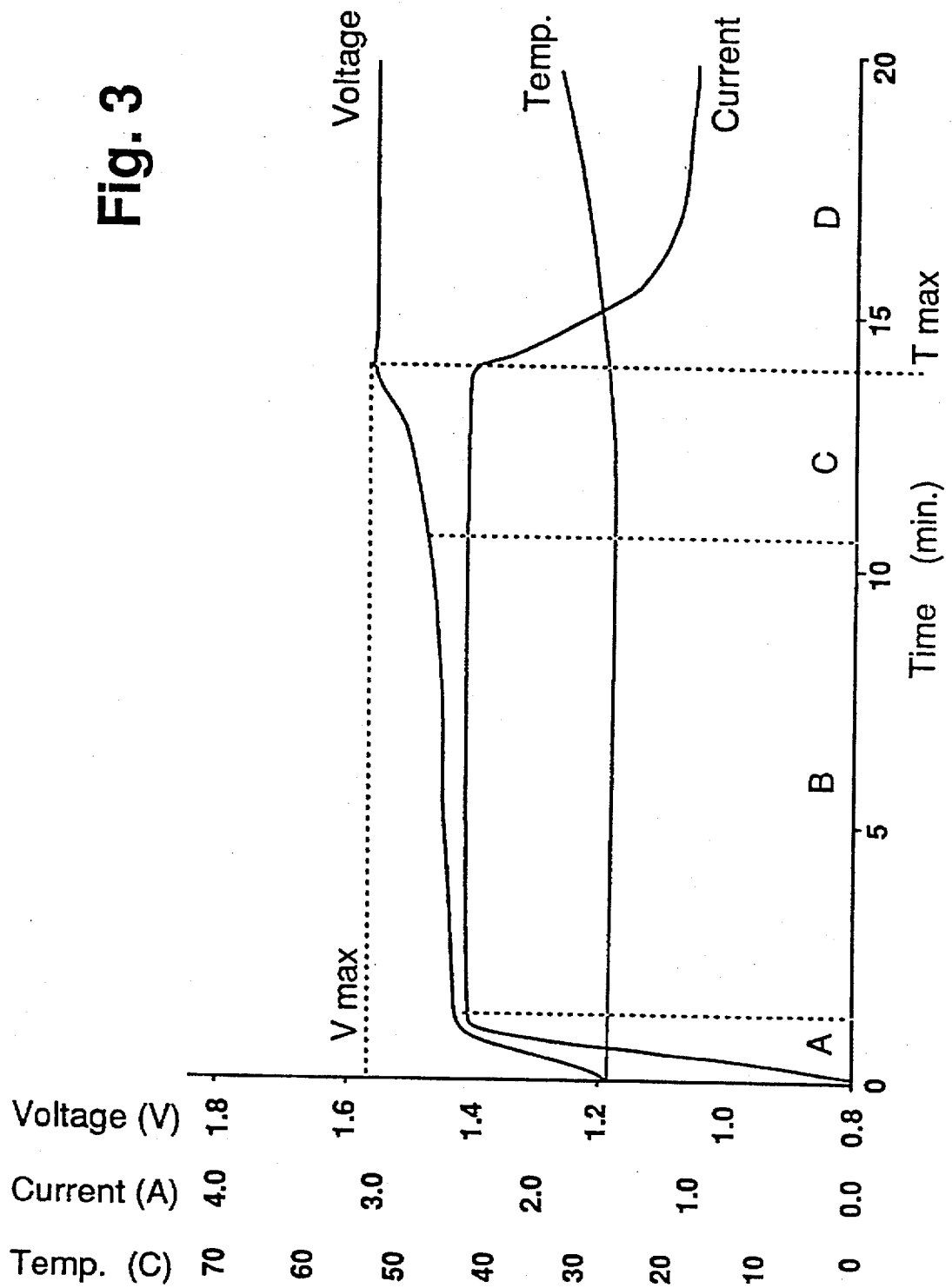
FIG. 3 is a graphical representation of the sequence (e.g., plot) of various charging parameters in a controlled process of charging a NiCd battery.

In general, optimization charging can be obtained in accordance with one aspect of the present invention, by constant charging current during a first portion of the process, then maintaining a constant voltage at the battery terminals. Referring to FIG. 3, a typical charging curve obtained in accordance with an embodiment of the present invention for a NiCd battery, is controlled in accordance with the invention in order to obtain an optimum charging current curve and an optimum battery temperature curve. The exemplary voltage curve of FIG. 3 may be divided into four nominal regions (A, B, C, and D) representing various stages of the charging process, similar to FIG. 1.

Region A again corresponds to the start of the charging process. Here, the voltage supplied is controlled so that the charging current supplied to the battery is relatively low, and gradually increased to the maximum desired magnitude (determined according to, e.g., the type of battery involved).

Region B again corresponds to the actual charging period where substantially all of the charging current is converted to stored energy in the battery. Here, the applied voltage is controlled to maintain the charging current substantially constant at the same maximum value, and the voltage across the battery increases only slowly.

In Region C, the battery approaches its state of full charge and in order to maintain the constant maximum charging current, the voltage across the battery begins to increase more rapidly until the voltage across the battery terminals reaches the predetermined maximum, Vmax. Vmax may be different for different types of batteries.

Once Vmax is attained, the system, in effect, switches from constant current to constant voltage mode; in Region D, the voltage supplied is controlled to maintain the measured voltage across the battery terminals substantially at the maximum limit, Vmax. In the Regions C and D, the internal resistance of the battery cell increases, with battery voltage held constant, as is the case in the D region, the resulting charging current will decrease. Because the battery voltage is kept at a constant value in the region D, the resulting temperature increase is relatively low, keeping any destructive effect caused by the charging current to the battery cells at a minimum.

The remaining charging period (the time period from reaching Vmax until the charging process is terminated) is determined, suitably no later than the time Tmax, when Vmax is reached. When such remaining charging period starting at Tmax has lapsed, the charging process is terminated. The charging current fed to the battery is controlled by pulse width modulating a constant voltage source.

Figure 4:
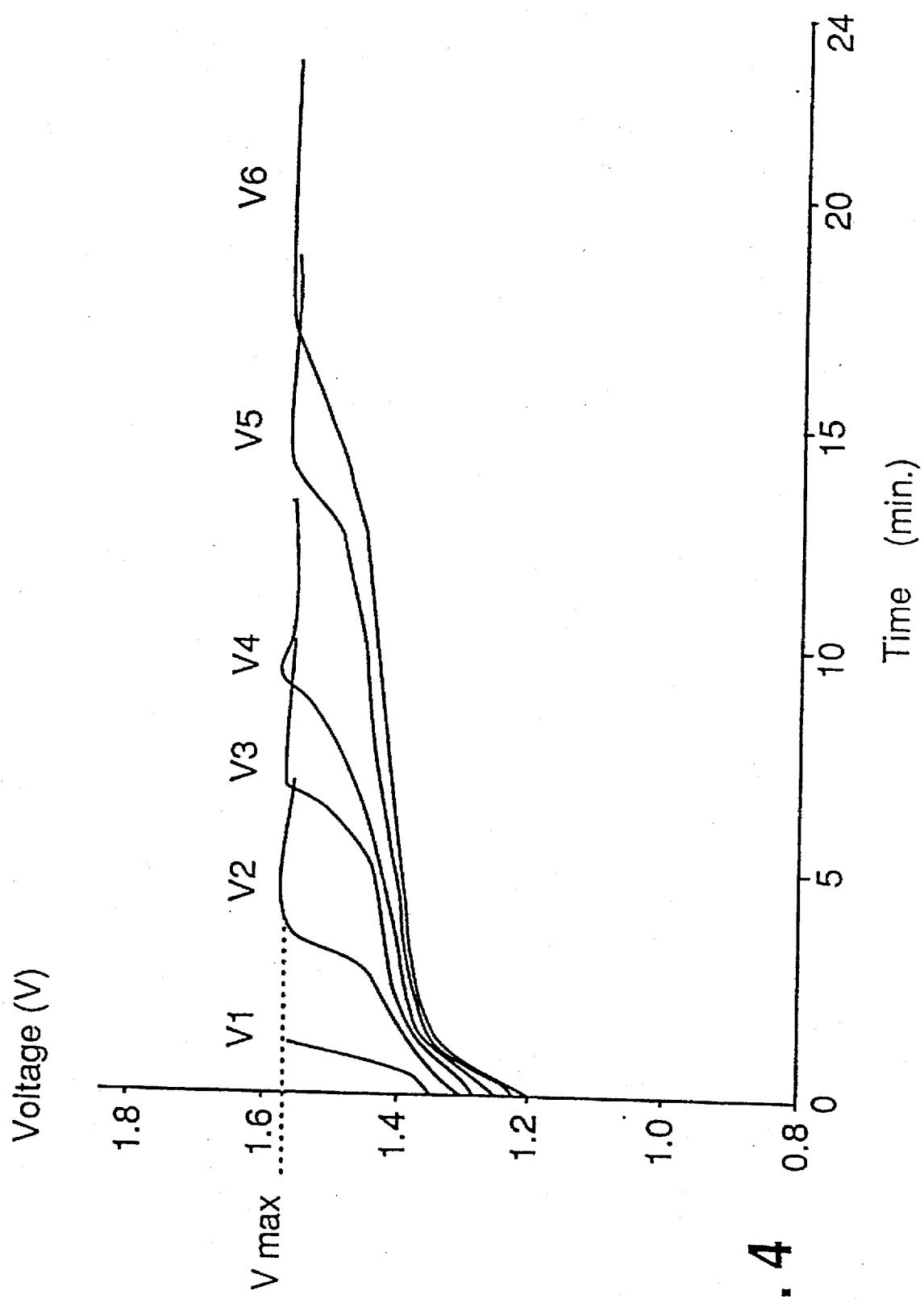
FIG. 4 is a graphical representation showing the battery voltage of a NiCd battery as a function of charging time for six different starting states of charge.

The charging period necessary to obtain the maximum voltage, Vmax, increases when the initial charge of the battery decreases. For example, the voltage curve shown in FIG. 3 represents a process of charging a NiCd battery which is nearly discharged. FIG. 4 shows six similar voltage curves, V1–V6, representing different charging sequences (e.g., curves) for the same battery with different starting charges. The curve V1 represents the charging process of the battery when nearly fully charged and the curve V6 represents a charging process of the battery when almost fully discharged. Further, the "remaining charging time" increases as the starting charge state of the battery decreases.

Information regarding ideal or desired reference voltage curves for the type of battery in question for a plurality of different starting charge conditions of the battery is suitably stored in an electronic memory. By comparing a sequence of measured parameters, such as the slope of the curve, with the stored reference values, the relevant reference voltage curve and the "remaining charging time" associated therewith may be determined.

The instantaneous slope of the voltage curve may be periodically measured, for example every tenth second during the charging process. For each measurement, a comparison is made with the stored reference slopes and a new projection for a "remaining charging time" is determined. When the measured battery voltage reaches the stored maximum voltage, Vmax, determination of the "remaining charging time" is suitably canceled and the last determined "remaining charging time" value used.

Alternatively, a limited number of reference values for the slope of the voltage curve can be stored. For each measurement, the actual slope of the curve is compared with the reference values, and a new "remaining charging time" value determined, only when the slope equals or exceeds one of the reference values.

Other battery types also manifest curves corresponding to those shown in FIGS. 3 and 4. These curves might be of different appearance and in some instances the correlation between the time for reaching the voltage, Vmax, and the optimum remaining charging time will not necessarily be associated with the slope of the voltage curve in question, but with other parameters of the curve, such as the absolute voltage at the moment concerned. The more parameters measured and stored, the more sophisticated determinations can be made in order to determine the optimum remaining charging time.

A further embodiment of the method according to the invention resulting in charging curves of the type shown in FIGS. 3 and 4 comprises measuring the battery voltage at a fixed time together with measuring the slope of the voltage curve when the maximum voltage, Vmax, is reached. In this embodiment, the voltage together with the slope of the voltage curve can be incorporated in a more sophisticated determination of the optimum remaining charging time.

As previously noted, it may be desirable to cut-off the charging current briefly each time a voltage measurement is performed to minimize the effect of the internal resistance of the battery.

The measurement of the slope of the curve may be affected in any suitable manner. For example, at each measurement point, e.g., every tenth second, the voltage of the battery is measured, and indicia stored in memory. The processor then calculates the difference between this value just measured and, the value of an earlier measured sample, for example, the value measured 90 seconds before. This difference is used as a measure of the slope of the curve at the time in question. In this manner, a new value of the slope which has been measured over a period of, for example, 90 seconds, is obtained every ten seconds.

To prevent the voltage measurements from being affected by transients and the like, the voltage is preferably measured much more frequently, for example, 100 times between each of the measurement points. Each of these intermediate measurements is stored, and at the actual measurement points of time, the processor calculates an average of the 100 intermediate measurements which have been performed since the last measurement point of time.

In addition to the above-mentioned criterion of terminating the charging process, a plurality of other stop criteria used in known methods may be adopted. For example, a maximum time may be determined which the process must not exceed, just as the charging process may be terminated if the measured voltage exceeds a predetermined value.

After the charging process has been terminated, maintenance charging of the battery may be effected, if the battery is left in the charger, suitably by passing current pulses through the battery at predetermined intervals. These current pulses and the time between them are adapted such that they compensate for the self discharge of the battery which would otherwise take place. The pulses may, for example, have a duration of 15–30 seconds and the time intervals between sequential pulses may be a few hours.

Figure 5:
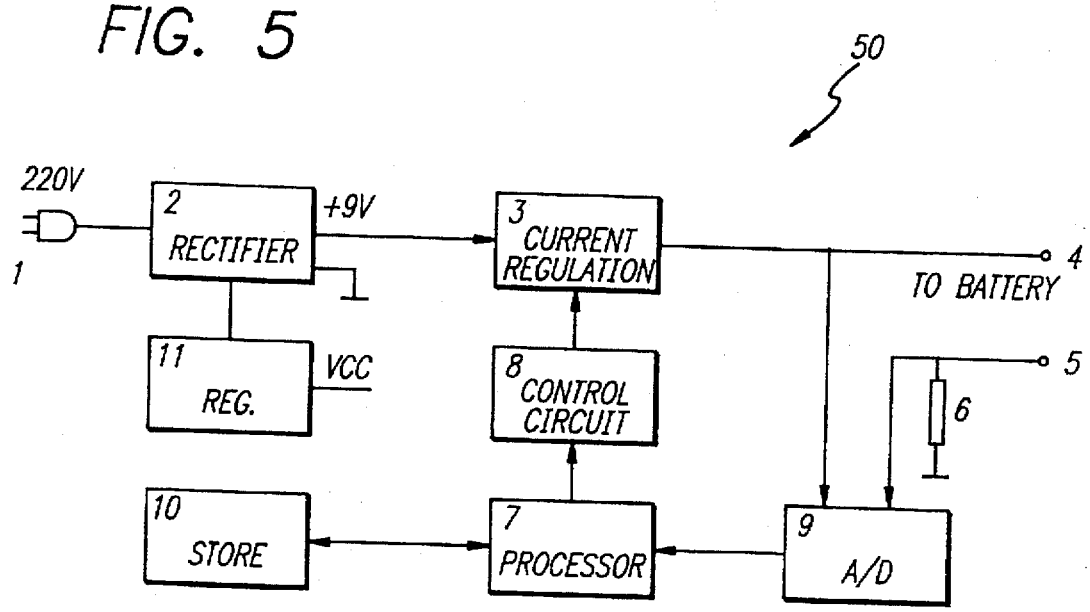
FIG. 5 is a block diagram of an apparatus according to the invention.

Referring to FIG. 5, an embodiment of an apparatus 50 according to the invention comprises: a conventional plug 1; rectifier circuit 2; current regulator 3; terminals 4 and 5; resistor 6; processor 7; control circuit 8; analog/digital converter 9; storage circuit 10; and regulator circuit 11. An A.C. line signal of predetermined voltage, e.g., 220 volts, is applied to the apparatus through plug 1, and the voltage is converted in rectifier 2 to a predetermined voltage level, e.g., 9 volts DC. Current regulator 3 supplies current to the battery to be charged via respective terminals 4 and 5. The current from the battery flows from terminal 5 and resistor 6 via ground back to rectifier circuit 2. Current regulator 3 is controlled via control circuit 8 from processor 7. 5 space Tab Processor 7 is capable of measuring current and voltage by means of analog/digital converter 9. The charging current is measured by measuring the voltage drop across resistor 6 while the voltage of the battery is obtained as the difference between the voltages measured on terminals 4 and 5, respectively. Processor 7 is moreover connected to storage circuit (memory) 10, which is used, inter alia, for storing measured current and voltage values as well as the calculated stop times. Regulator circuit 11 generates a direct voltage of 5 volts from the voltage of 9 volts from rectifier circuit 2. The voltage of 5 volts is used for supplying processor 7, analog/digital converter 9, and storage circuit 10. Current regulator 3 is controlled by pulse width modulation and processor 7 controls the pulse width in a manner such that the desired charging current constantly flows through the battery. Processor 7 measures the charging current, as mentioned, by measuring the voltage drop across resistor 6. If desired, processor 7 may perform the voltage measurement across the battery in the intervals between the current pulses. The voltage measurement will then not be affected by the voltage drop caused by the charging current across the internal resistance of the battery.

Figure 6:
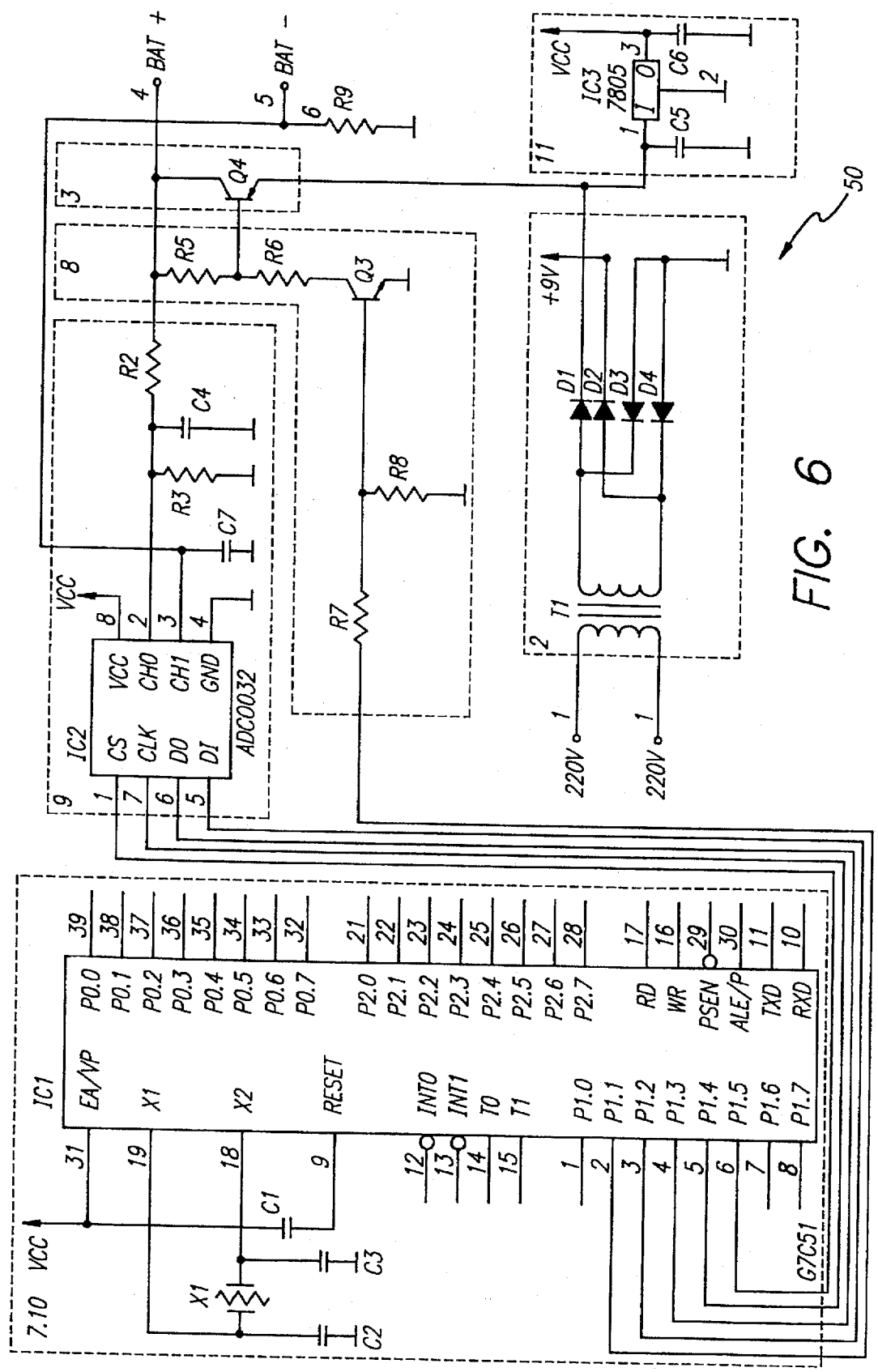
FIG. 6 shows a circuit diagram of an embodiment of the apparatus shown in FIG. 5.

Referring to FIG. 6, rectifier 2 suitably comprises a transformer T1, and a rectifier bridge consisting of the four diodes D1, D2, D3, and D4. The output voltage from rectifier circuit 2 is a predetermined DC voltage, e.g., 9 volts, which is passed partly to current regulator 3 and partly to regulator circuit 11. Current regulator 3 suitably comprises a transistor Q4 and is controlled via control circuit 8. Control circuit 8 suitably comprises resistors R5, R6, R7, and R8, and a transistor Q3. When the output terminal P1.1 of the processor provides a high output signal, transistor Q3 is placed in conductive state via a voltage divider comprising resistors R7 and R8. Current will hereby flow through a voltage divider R5 and R6, causing Q4 to assume a conductive state. Current is thus supplied to the battery. When the output terminal P1.1 of the processor is low, the transistors Q3 and Q4 are placed in a non-conductive state and no charging current is provided to the battery.

Analog/digital converter 9 suitably comprises integrated circuit IC2 cooperating with resistors R2 and R3 and smoothing capacitors C4 and C7. Measured voltages are indicative of the battery voltage and the charging current, respectively, are converted to digital information in integrated circuit IC2, and this digital information is passed further on to terminals P1.2 and P1.3 of processor 7.

Processor circuit IC1 includes processor 7, as well as storage circuit 10 (memory 10 is internal to the chip). Further, capacitors C1, C2, and C3, as well as a crystal X1, are connected to processor C1.

Regulator circuit 11 comprises integrated voltage regulator IC3 and capacitors and C6. Regulator circuit 11 supplies a direct voltage of 5 volts to circuits IC1 and IC2.

Circuit 50 may be used to maintain the charging current at a substantially constant value, to control the current during charging of the battery to maintain a substantially constant voltage, or combinations of both methods.

In general, when charging a rechargeable battery in accordance with the present invention as described herein, the charging process may be controlled so that the voltage measured across the battery terminals during "the remaining charging period" is kept at a constant value once predetermined maximum voltage, Vmax, has been reached. Vmax for a certain type battery may be determined as described above.

However, some individual batteries never reach the value Vmax determined for the applicable type of battery due to, e.g., various defects or anomalies of the batteries. FIG. 7 shows exemplary charging curves for such an anomalous battery. During the first period of the charging process, the charging curves follow the normal sequences as shown in FIG. 3. However, the voltage curve flattens out at a voltage V' which is lower than Vmax. Therefore, the termination time for the charging process cannot be determined based on the time when the charging voltage reaches Vmax. In such case, the maximum charging voltage may be determined in a different manner. For example, the battery voltage may be measured at predetermined time intervals, and the measured values may be compared. If the measured battery voltage has not increased during the last successive measurements, and Vmax has not yet been reached, the last measured voltage may be defined as the maximum voltage, V', for this battery and a remaining charging period may be determined starting from the point of time at which V' was first measured.

Figure 9:
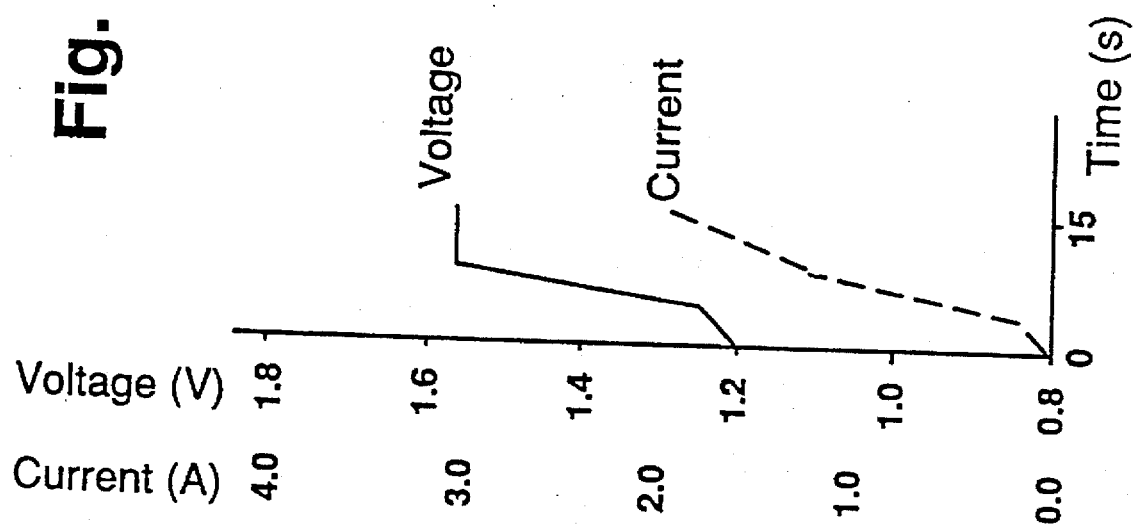
FIGS. 8 and 9 diagrammatically illustrate charging curves at the beginning of a process of charging a virgin battery and a fully charged battery, respectively.
Figure 8:
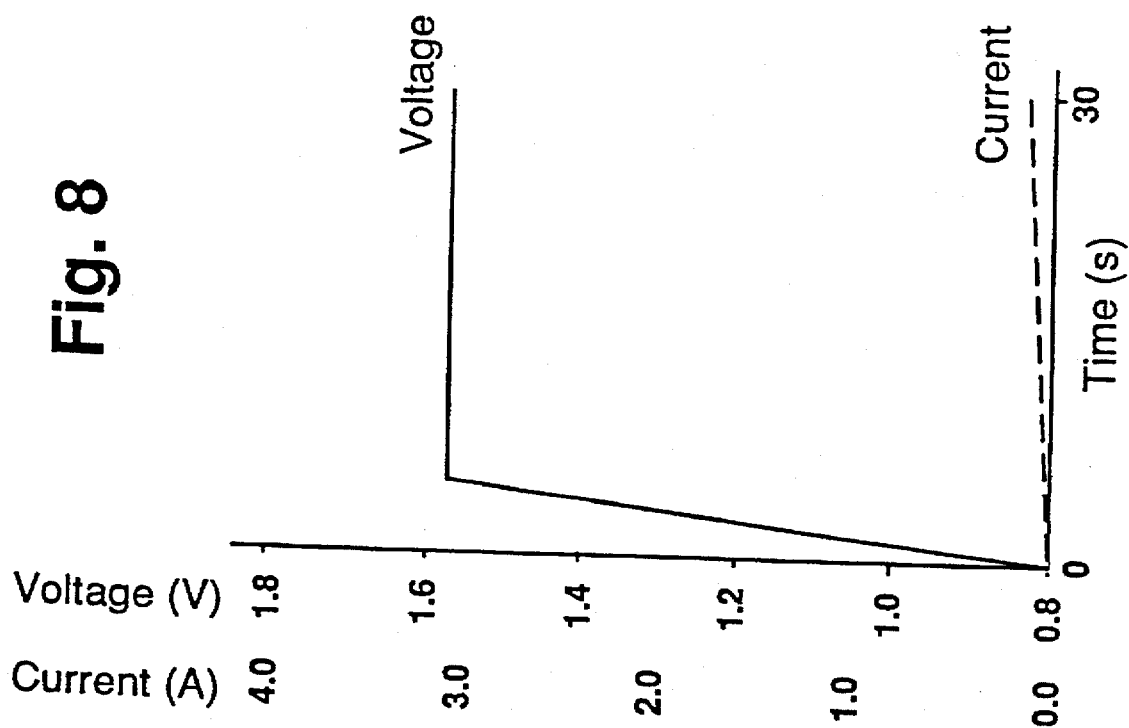

Charging curves when test charging a virgin battery will differ from charging curves when test charging a fully charged battery. For example, FIG. 8 shows typical first charging curves when test charging a virgin battery, and FIG. 9 shows corresponding charging curves when test charging a fully charged battery. When a battery has to be charged for the first time or for the first time after the battery has been stored for a long time without charging, the chemical reactions which must take place within the battery during the charging process are initially rather slow. For such batteries, the controlled high current charging process described above cannot be used. For such "virgin batteries," the charging process has to take place with a relatively low, almost constant current supplied to the battery for a relatively long period of time in order to ensure that the battery is fully charged. Therefore, before the initiation of the actual charging process, the battery may be exposed to a test charging program in which the battery is charged for a short period of time in accordance with a normal charging process as described above.

Figure 11:
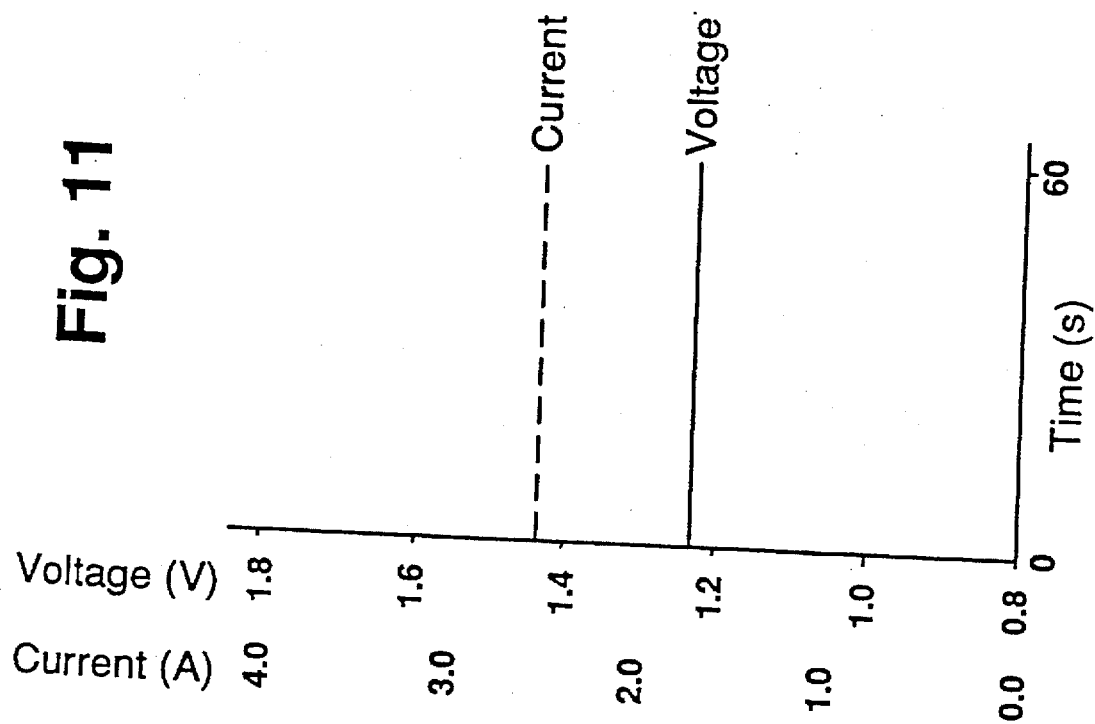
FIGS. 10 and 11 diagrammatically illustrate discharging curves for a virgin battery and a fully charged battery, respectively.
Figure 10:
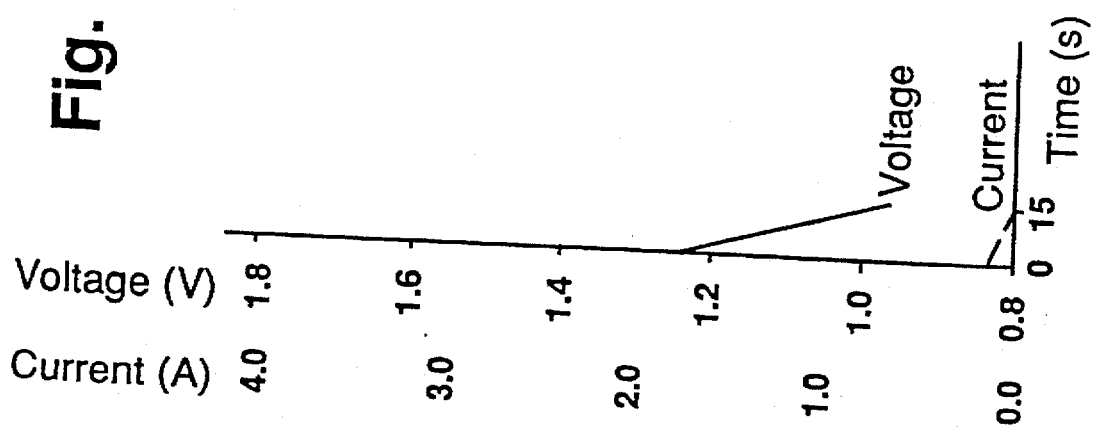

However, the starting charging current must be relatively low, for example, in the range of 1 C/h, and then increased to a higher value which can be in the range of 4 C/h, C/h being the "C-rate." After a short predetermined period of time, for example a few seconds, or when the voltage across the battery terminals reaches Vmax, the charging process is stopped. The battery is discharged with a relatively high discharging current. FIG. 10 diagrammatically shows discharging curves for the virgin battery charged as illustrated in FIG. 8. FIG. 11 diagrammatically shows discharging curves for the fully loaded battery charged as illustrated in FIG. 9.

FIG. 8 illustrates that a virgin battery will reach the battery voltage Vmax within a very short period of time, for example less than 10 seconds. However, the charging current accepted by the battery is very low. Consequently, as shown in FIG. 10, the virgin battery charged in accordance with FIG. 8 may be fully discharged within a very short period of time, which in the example is less than 1 second. When a test charging results in curves similar to those of FIGS. 8 and 10, the control system of the charging apparatus may be instructed to treat the battery as a virgin battery, and during the following charging process, a relatively low, almost constant charging current, for example in the order of 0.2 C/h, will be supplied to the battery until the battery is charged to its full capacity.

When a fully charged battery is tested, the voltage across the battery terminals reaches Vmax within the same period of time as a virgin battery as shown in FIG. 9. However, in contradistinction to the charging current supplied to the virgin battery, the charging current supplied to the fully loaded battery increases very rapidly. When discharging the fully loaded battery during the testing, a high, nearly constant current flows from the battery within the testing period, and at the same time the battery voltage will be rather constant, as shown in FIG. 11. When the test charging of a battery results in curves similar to those of FIGS. 9 and 11, the charging system may be instructed to treat the battery as a fully charged battery; the charging process is stopped.

As an alternative, the rates of change of the voltage curves may be measured during the charging and the discharging tests. By comparing the measured rates of change of the voltage curves with reference values, the start conditions of the battery can be calculated, and a charging process can be selected for the battery being tested. If necessary, the test program may involve several subsequent charging and discharging periods in order to obtain the desired information.

When selecting an ideal charging process for a battery, it is desirable to have a set of reference parameters for the type of battery to be charged. Thus it is desirable to have a method of determining or selecting a set of reference parameters for a new type of battery. These parameters may comprise, e.g., the battery voltage, the charging and discharging currents, the inner and outer temperatures of the battery, and/or the chemical reactions within the battery cells.

One of the most important parameters is the battery temperature when the battery has just been fully charged, Temp.(100%). When charging further from this point, the battery temperature will increase and the battery may be damaged.

Figure 12:
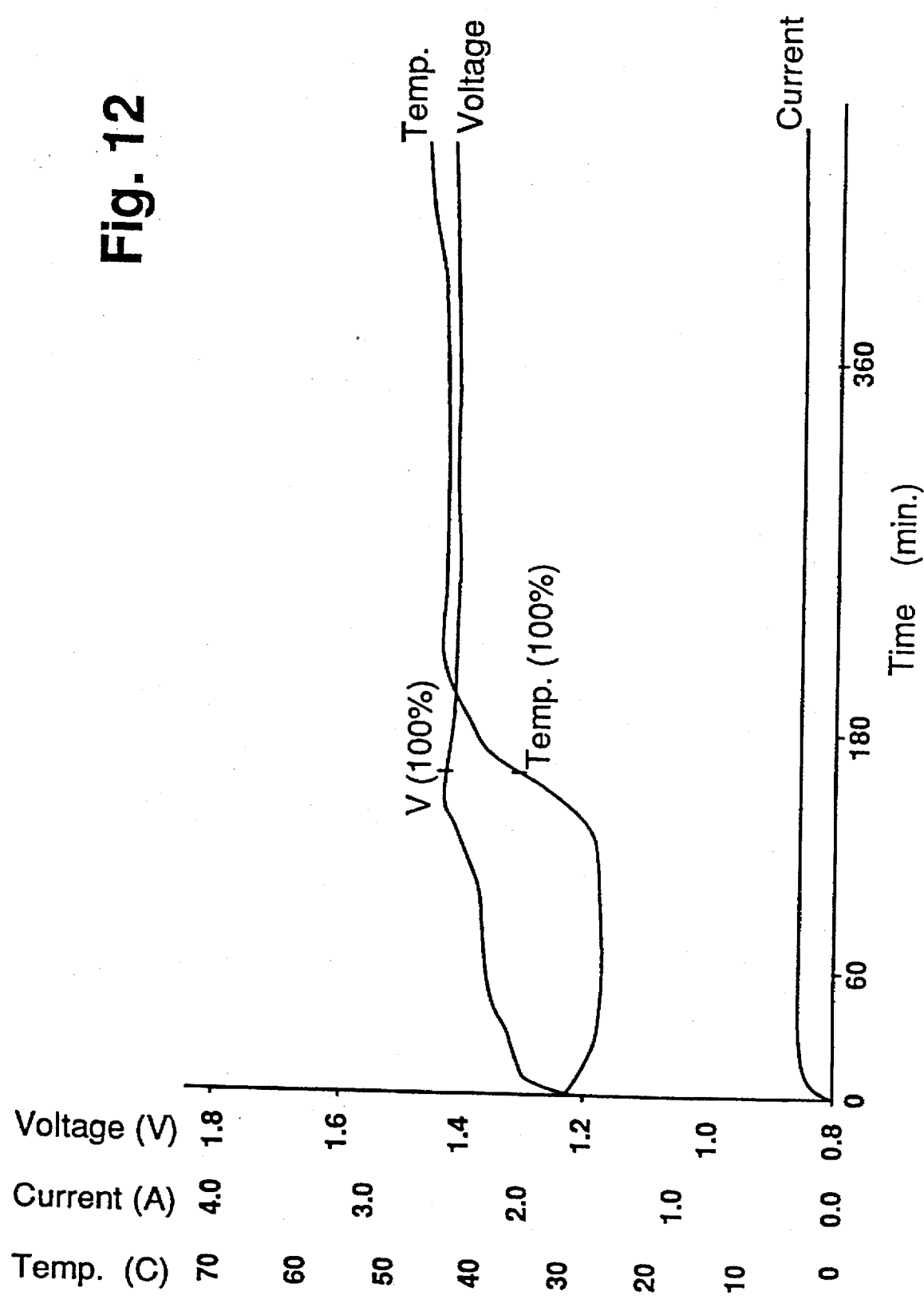
FIG. 12 shows the charging voltage curve and the temperature curves for a battery which is charged with a constant low charging current.

In order to measure Temp.(100%) for a battery of an unknown type without having too much interference from the heat dissipated in the series resistance within the battery, the battery may be charged with a relatively low, almost constant charging current for a relatively long period of time (several hours) in order to ensure that the battery is fully charged. When the battery has been charged, it may be discharged over a relatively long period of time in order to test whether it was actually fully charged. If not, a new charging process is started with a higher charging current. If yes, a new charging process is started with the same charging current, but this time the charging period of time will be shorter. When this charging process is terminated, the battery is again discharged in order to determine whether the battery has been fully charged. If yes, a new charging process with the same charging current but with an even shorter charging period of time is initiated. If not, a new charging process with the same charging current but with a longer period of charging time is initiated. These charging and discharging processes will continue with the same charging current and with new periods of charging time until the minimum charging time, t(100%), where the battery is just fully charged, has been found. When measuring the temperature of the battery at t(100%), Temp.(100%) can be found for this type of battery and for the given charging current. By measuring the voltage across the battery at t(100%), the value of V(100%) can be found. FIG. 12 shows the sequence of the voltage and temperature values for a typical charging process in which a relatively low charging current is used. In FIG. 12 the charging current is 2 C/h, and the points Temp.(100%) and V(100%) are indicated on the charging voltage and temperature curves shown.

It is to be understood that other methods of determining the value of Temp.(100%) may be used including the measurement of the rate of change of the temperature curve during charging.

Another important parameter for use in the present invention is the predetermined maximum voltage, Vmax, which will vary with the type of battery involved. When using a high speed charging process as illustrated in FIG. 3, the charging process is controlled so that the voltage is maintained at a substantially constant value during the rest of the charging process when Vmax has been reached, the charging process being terminated when a predetermined period of time has lapsed, starting when Vmax is reached.

Figure 13:
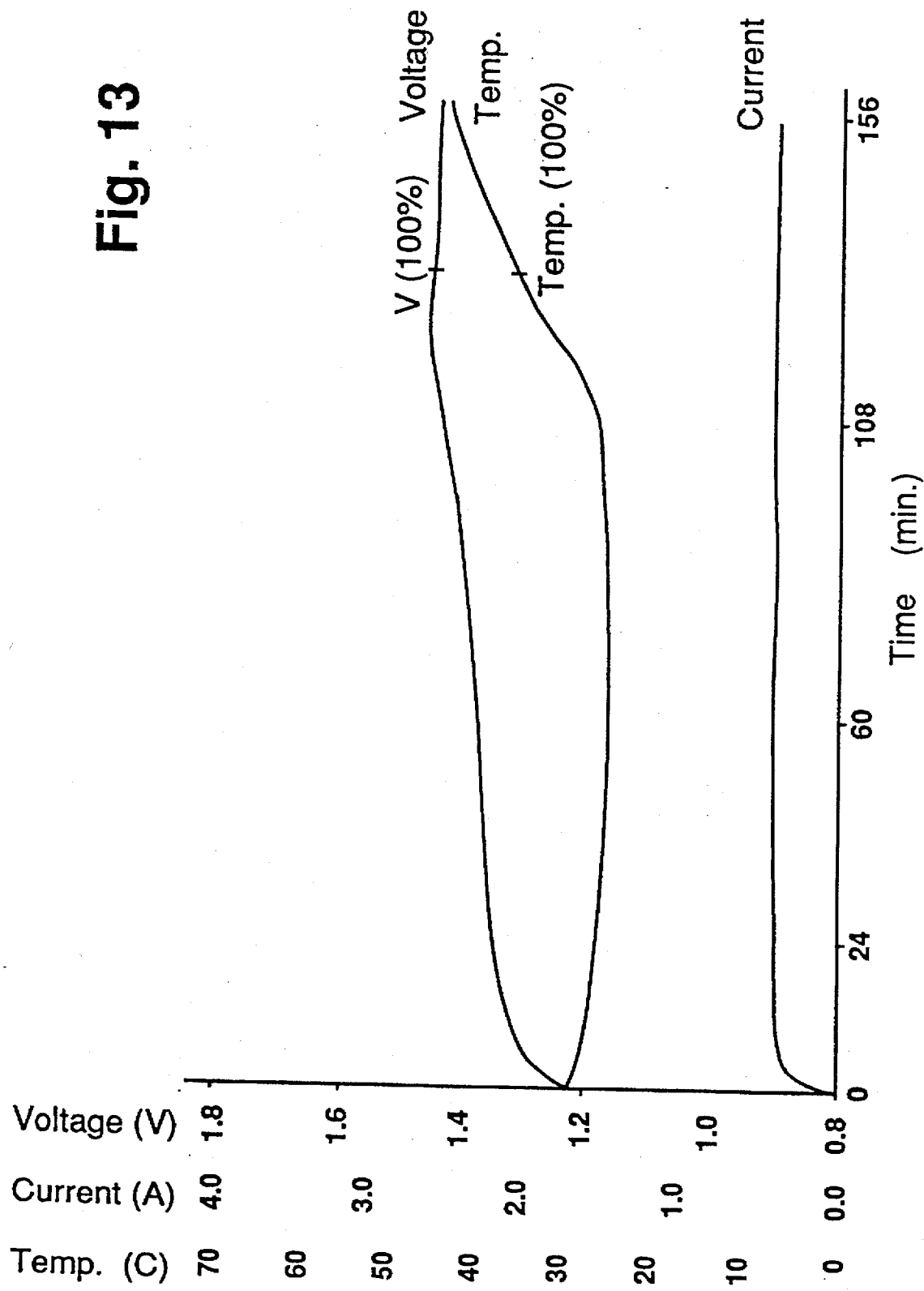
FIGS. 13, 14 and 15 show the charging voltage curves and the temperature curves for the same battery as in FIG. 12 when charged with substantially constant charging currents of different values, respectively.

Vmax for a new type of battery may be determined by charging the battery with an almost constant charging current slightly higher than the charging current used to determine the temperature Temp.(100%). The rate of change of the voltage curve is measured and compared with the temperature of the battery. If the voltage rate of change is positive at Temp.(100%), the charging process is reinitiated with a slightly higher charging current. This process is repeated until the measured voltage rate of change at Temp. (100%) becomes zero or slightly negative. This procedure is illustrated in FIG. 13 for a charging current of 0.5 C/h and in FIG. 14 for a charging current of 1 C/h, when using the same battery as in FIG. 12. The measured value of V(100%) for a charging process where the voltage rate of change has just become zero or slightly negative will be a good measure for the value of Vmax for this type of batteries, and the selected value of Vmax should be selected rather close to this measured value of V(100%). Other methods could be used in determining the value Vmax.

Figure 14:
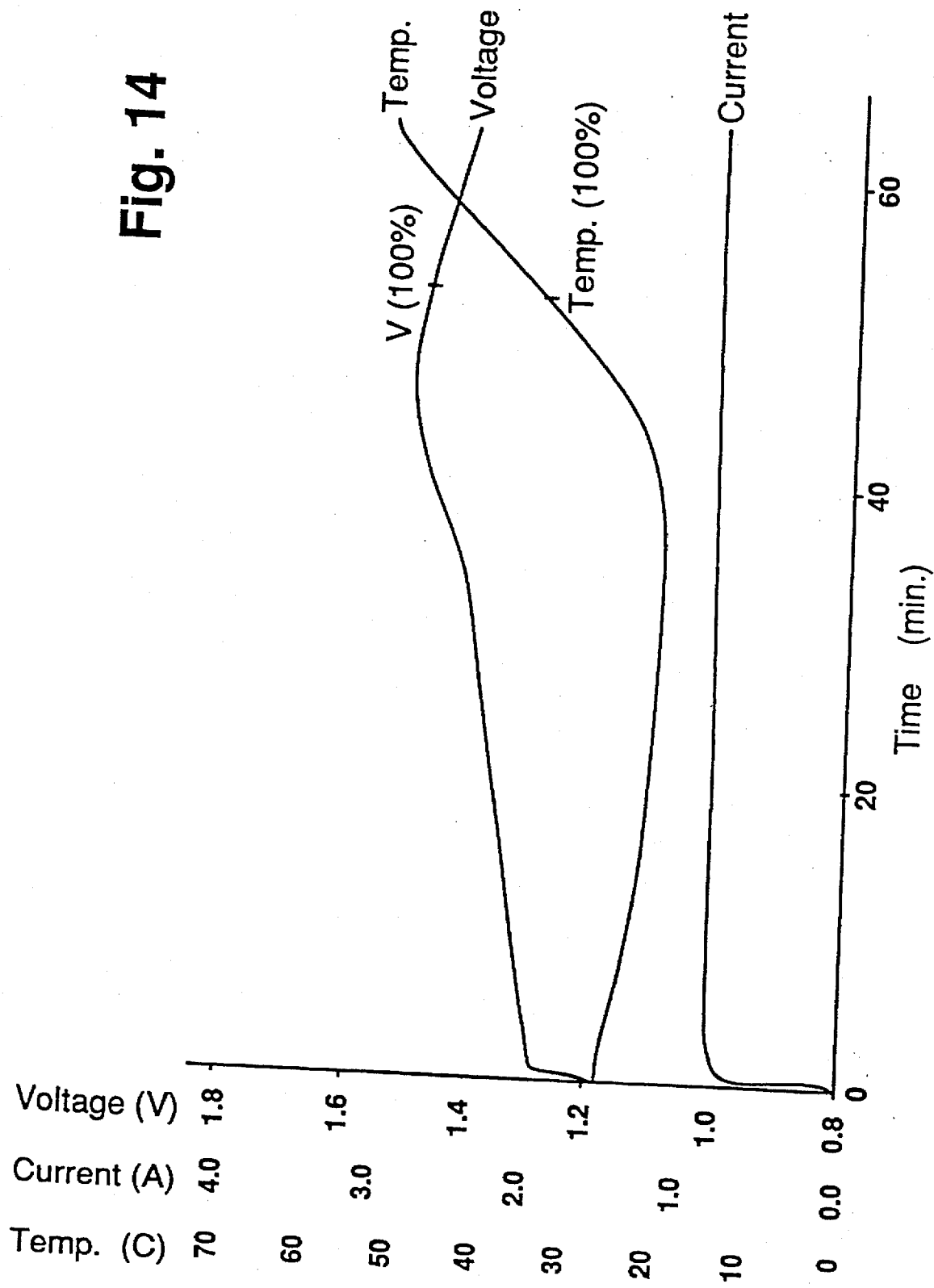
Figure 15:
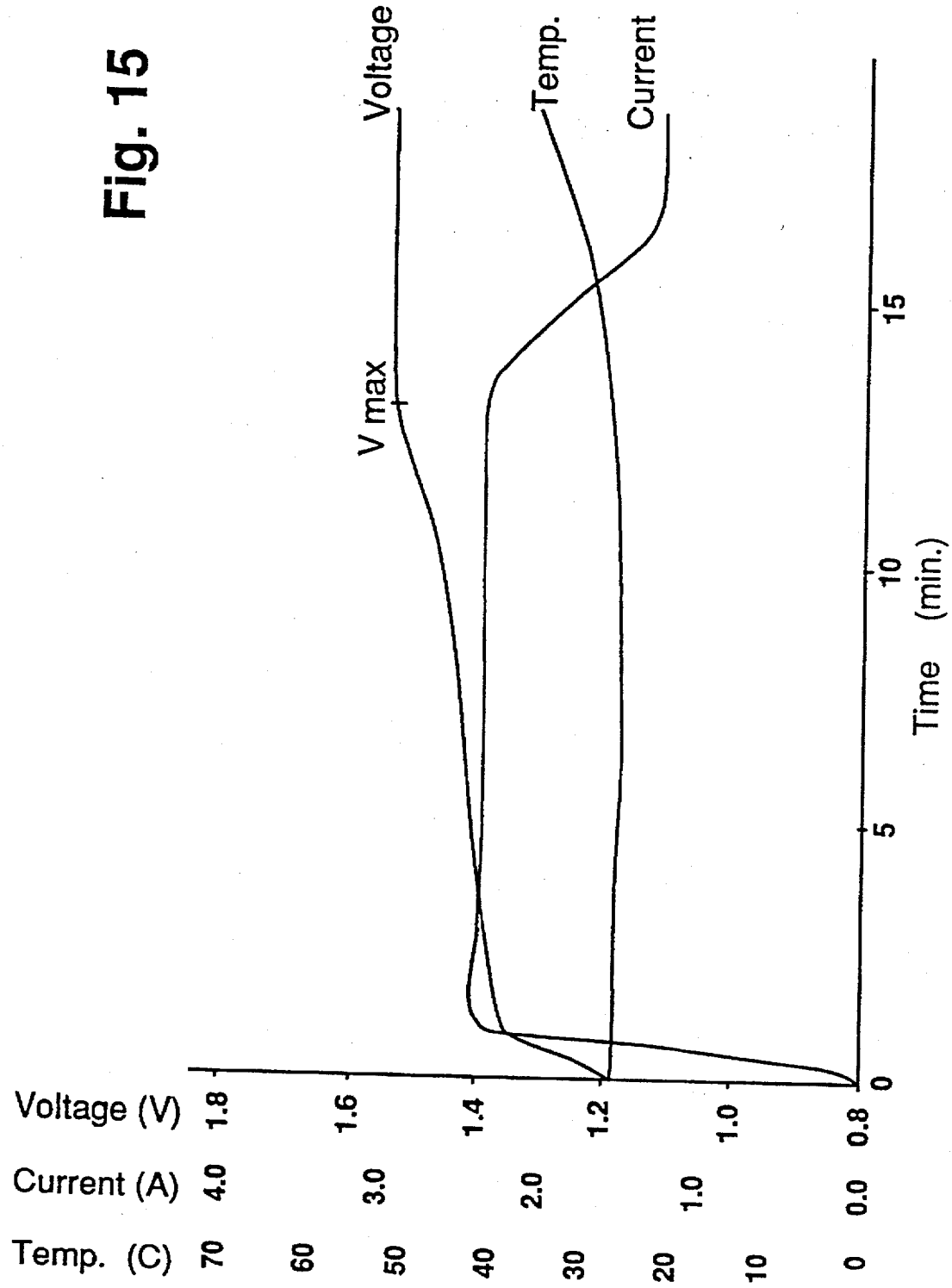

FIG. 15 illustrates a controlled charging process according to the present invention for the same battery as in FIGS. 12–14 when using a maximum charging current of 4 C/h and a maximum charging voltage Vmax, which has been determined from the measured value of V(100%) in FIG. 13.

By performing the above described measurements of t(100%), Temp.(100%), and V(100%), a set of reference parameters representing reference values of voltage, temperature, current, and charging time may be compiled. All of these reference values may be used in determining characteristic charging parameters to be used in a controlled charging process, including alternative ways of calculating Vmax.

According to another embodiment of the invention, the reference parameters for use in a controlled charging process may be determined for each battery or for each type of batteries using first and second sequential charging analysis processes. Since the battery may comprise several battery cells, the charging analysis processes may also be used in order to determine reference parameters for each cell of the battery.

Figure 16:
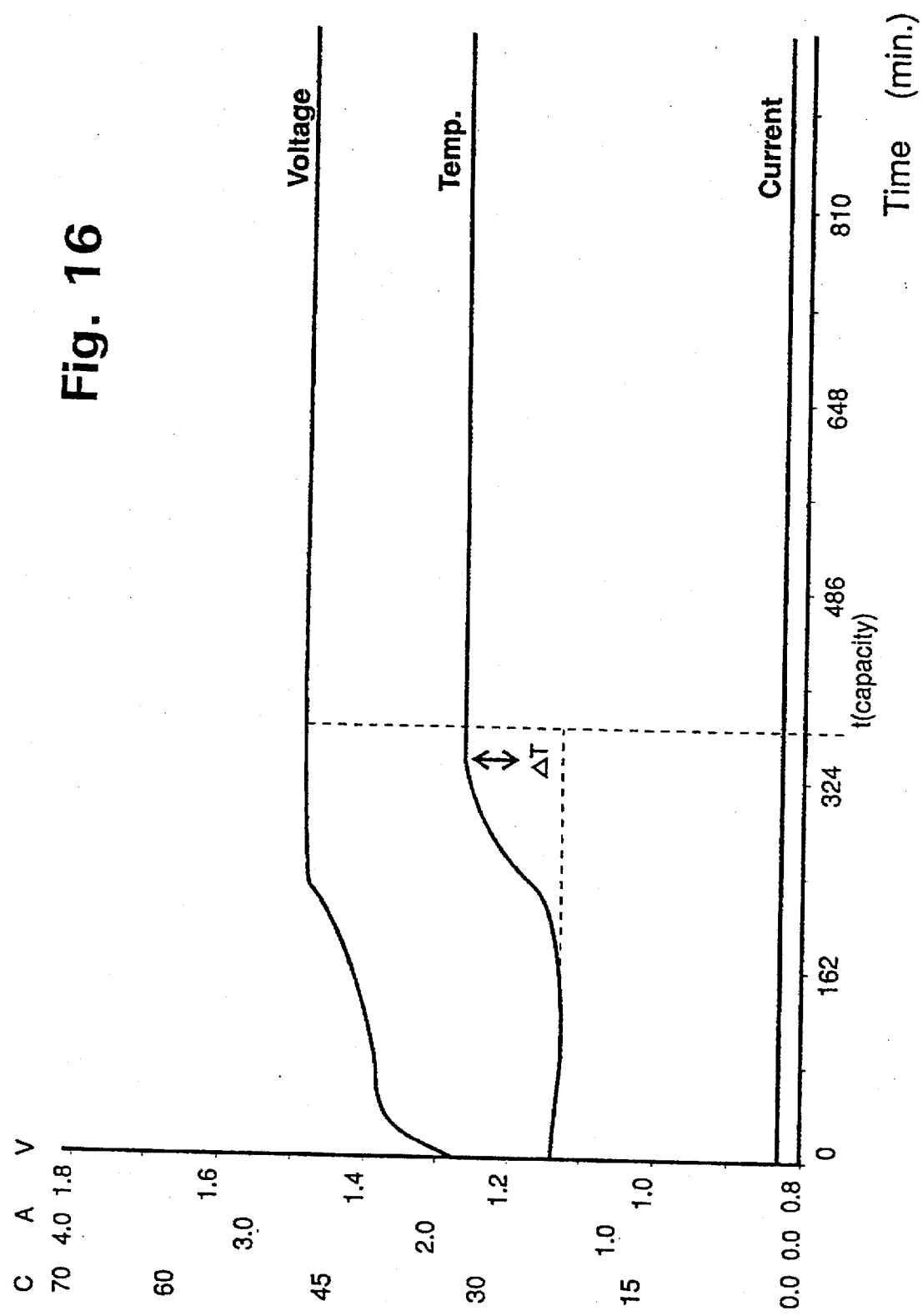
FIG. 16 shows the charging voltage curve and the temperature curve for a battery which is test charged with a constant low charging current in the range of 0.1 C/h.

Referring to FIG. 16, during the first charging analysis, a maximum battery charging temperature difference, ΔT, is determined by supplying a relatively low, almost constant charging current for a relatively long period of time and surveying (sampling) the battery temperature and/or the battery terminal voltage. The first charging analysis current should be sufficiently low that no substantial increase in the battery voltage is detected for the first six hours of the charging process. However, the charging current should be high enough to ensure a rise in battery voltage after about 10 hours of charging. The charging current is preferably around 0.1 C/h, although the exact value of the capacity of the battery may not be known at the time when the first charging analysis process occurs. If the value of the first analysis charge current has been chosen so that the above mentioned requirements of the battery voltage is not fulfilled, a new value of the first analysis charge current is selected, and the charging analyzing process repeated. Preferably, the battery is fully discharged before being subjected to any charging analysis process.

If a correct value of the first analysis charging current has been selected, the battery will be fully charged after several hours of charging and no further increase in the battery temperature will be detected. Hence, the maximum charging temperature difference, ΔT, can be determined for the battery by comparing the lowest and the highest values of the measured battery temperature. It is also to be noted that no further increase is detected for the battery voltage when the battery has obtained the fully charged condition. If a temperature sensor is available for each cell of the battery, the maximum charging temperature difference may be determined accordingly for each cell of the battery.

The actual capacity value of the battery to be charged can also be determined. This is also done during the first analysis charging process by determining a first charging stop point t(capacity) at the time when no further increase in the battery temperature and/or battery voltage is detected for a predetermined period of time involving at least two measurements of the battery temperature and/or voltage. Alternatively, t(capacity) may be determined as the point in time where the change in battery temperature and/or battery voltage has decreased below a predetermined level for a predetermined period of time. By calculating the power supplied to the battery during the first analysis charging process until the time t(capacity), which is equal to the time when the battery has been fully charged, the real value of the capacity of the battery may be determined.

Figure 17:
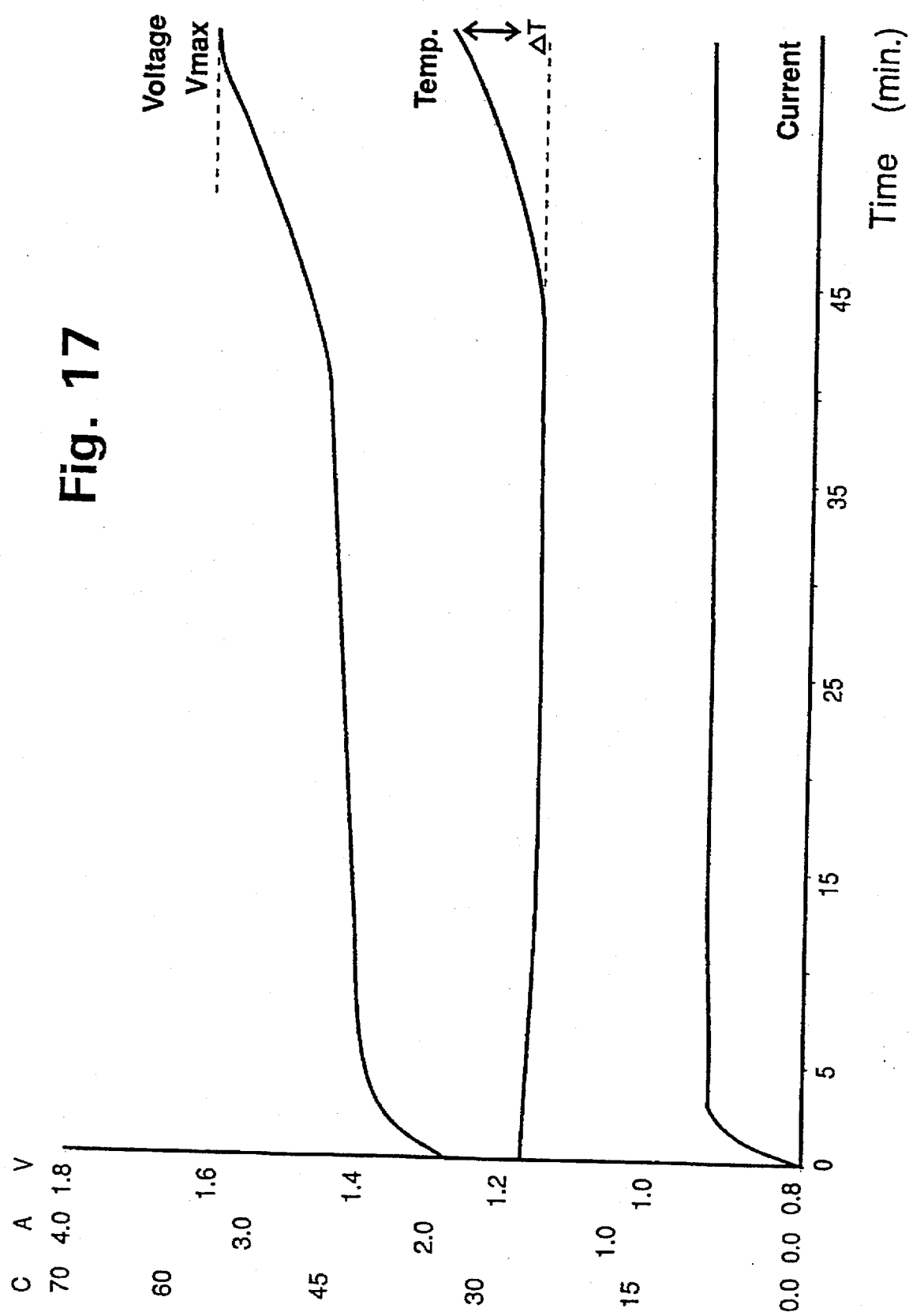
FIG. 17 shows the charging voltage curve and the temperature curve for a battery which is test charged with a constant charging current in the range of 1 C/h.

Referring to FIG. 17, the second charging process is employed to determine a maximum battery terminal voltage by supplying a second, almost constant, analysis charging current to the battery with the second analysis current equal to the C-rate based on the real capacity value of the battery determined during the first analysis charging process. During the second analysis charging process, the terminal voltage and the battery temperature are surveyed (sampled). The maximum terminal voltage is the voltage measured across the battery terminals at the point in time when the battery temperature has increased by the maximum battery charging temperature difference, ΔT (which has been determined during the first analysis charging process). If the terminal voltage is surveyed for each cell of the battery, then the maximum terminal voltage may be determined in the same way for each cell of the battery, either at the maximum battery charging temperature difference or, if the temperature is surveyed individually for each cell, at the maximum charging temperature difference of the cell.

Figure 18:
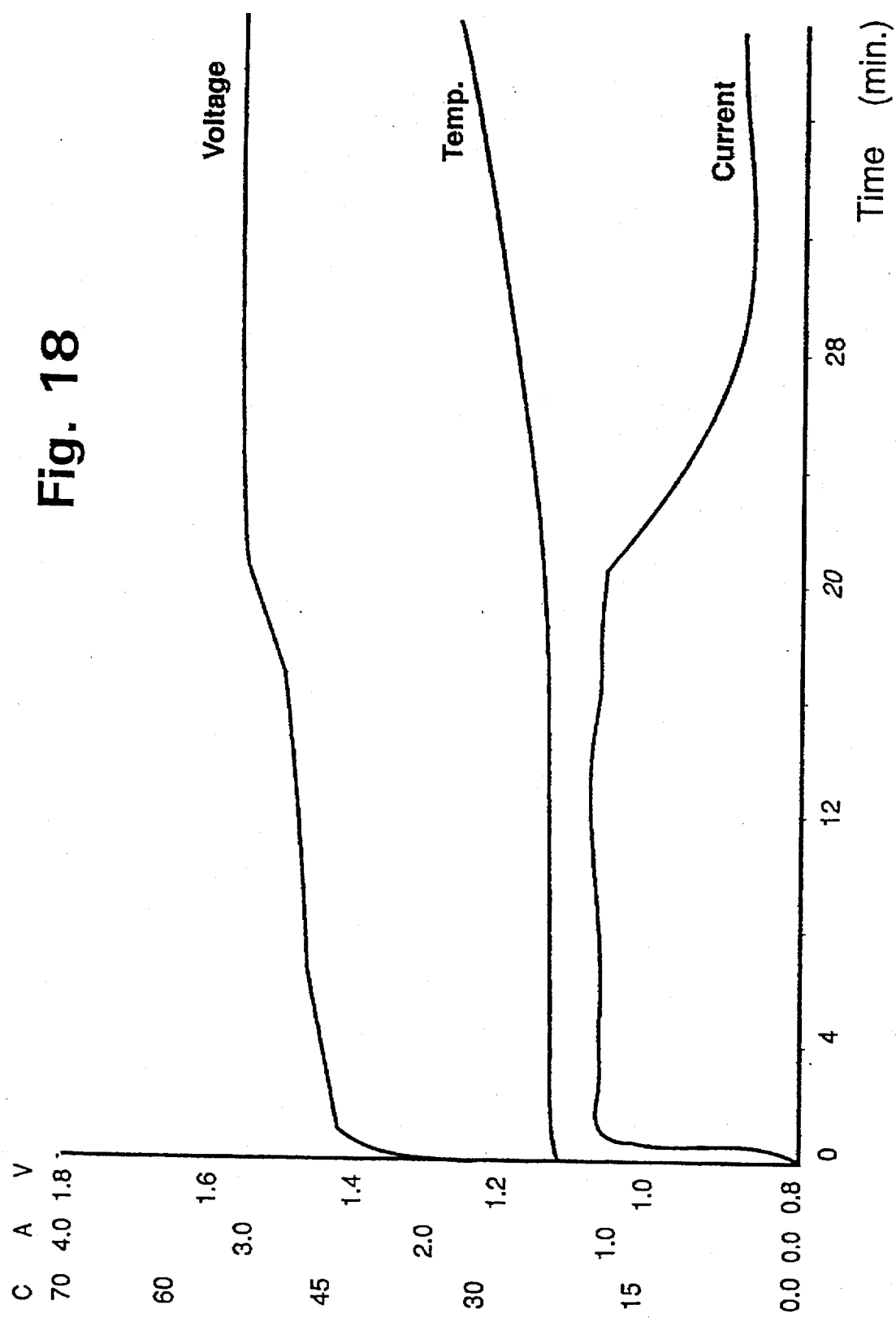
FIGS. 18, 19 and 20 show the charging voltage curves, the temperature curves and the charging voltage curves for a NiCd battery which is charged with charging currents of different values, the charging processes being controlled in accordance with a preferred embodiment of the invention.
Figure 19:
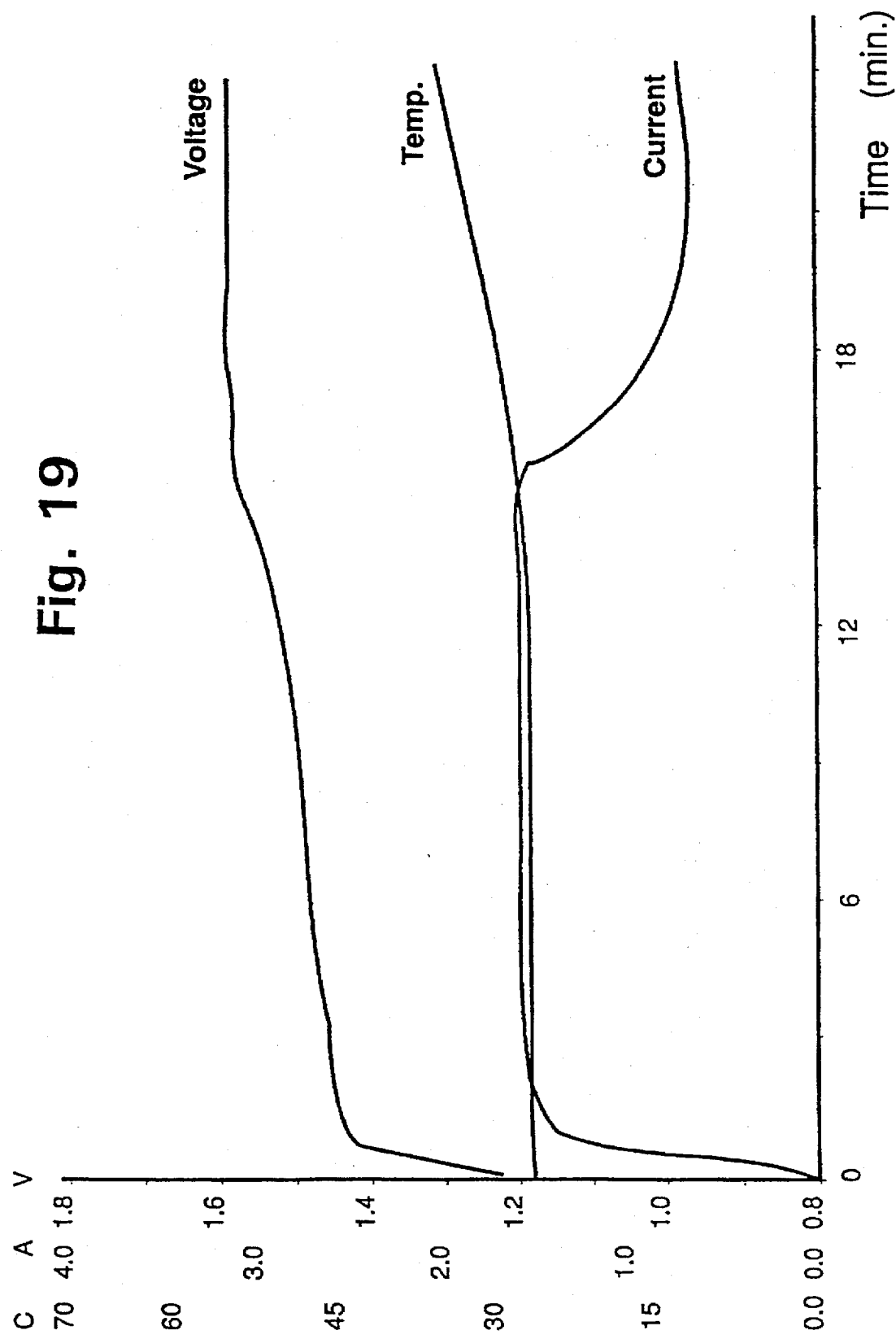
Figure 20:
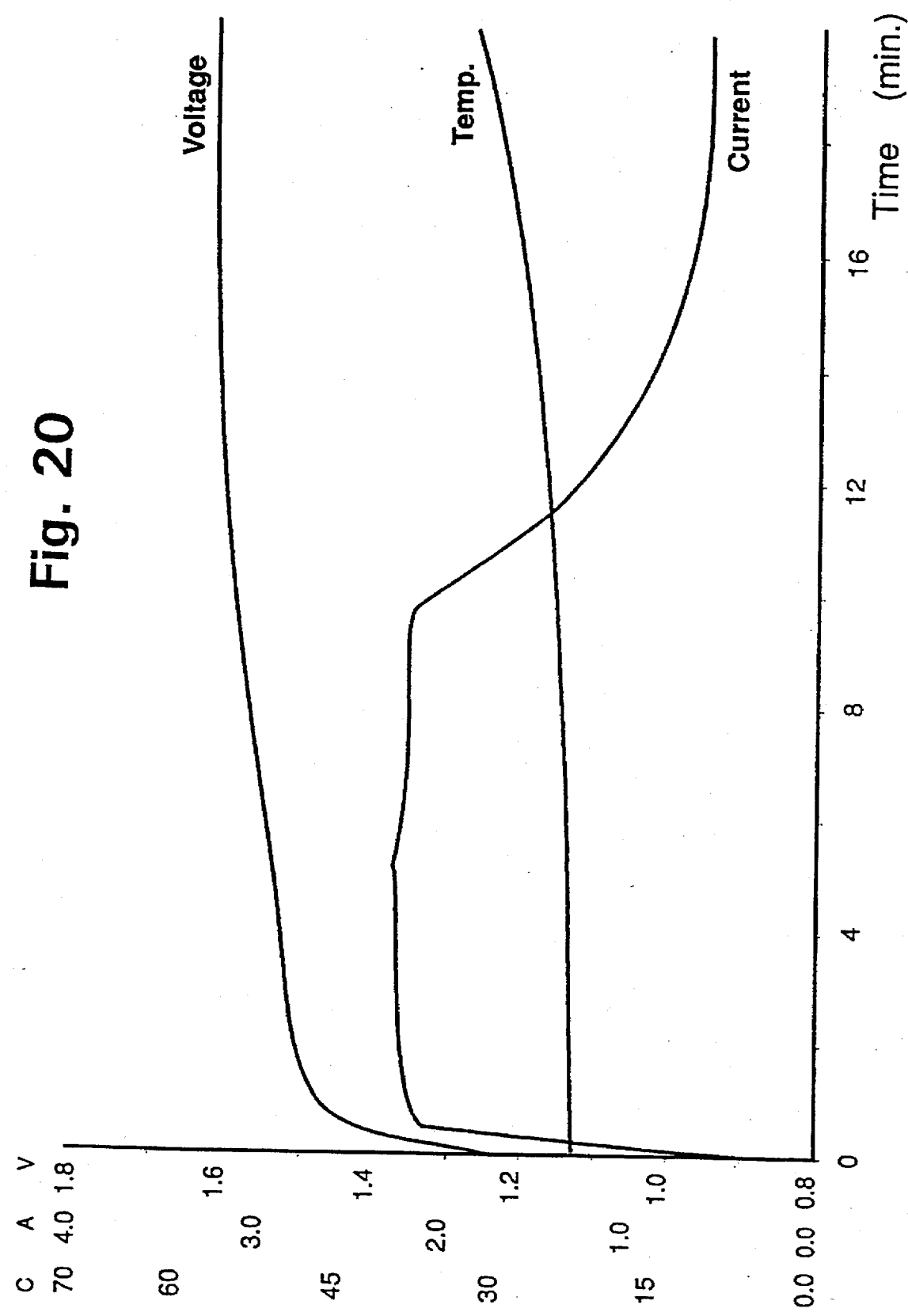

FIGS. 18, 19, and 20 show the charging curves for a NiCd battery when the charging process is controlled in accordance with the results obtained during the first and second analysis charging processes. Thus, the real battery capacity value determined during the first analysis charging process may be used when determining the charging current supplied to the battery during the first part of the charging process. In FIGS. 18, 19, and 20, this charging current is equal to 2, 3, and 4 times the C-rate, respectively. During the charging process, the battery terminal voltage is surveyed and when the maximum battery terminal voltage, Vmax, determined during the second analysis charging process is reached, the charging process is controlled so that the voltage is held constant during the remaining charging process. At the time Tmax, when Vmax is reached, a remaining charging period may be determined in accordance with the previous discussion and the charging process may be terminated when this remaining charging period has lapsed.

However, the remaining charging period may also be determined in dependency of the value of Tmax, and the remaining charging period may be determined by comparing the value of Tmax with stored reference values having corresponding remaining charging periods of time and thus, selecting the remaining charging period corresponding to the value of Tmax.

Figure 21:
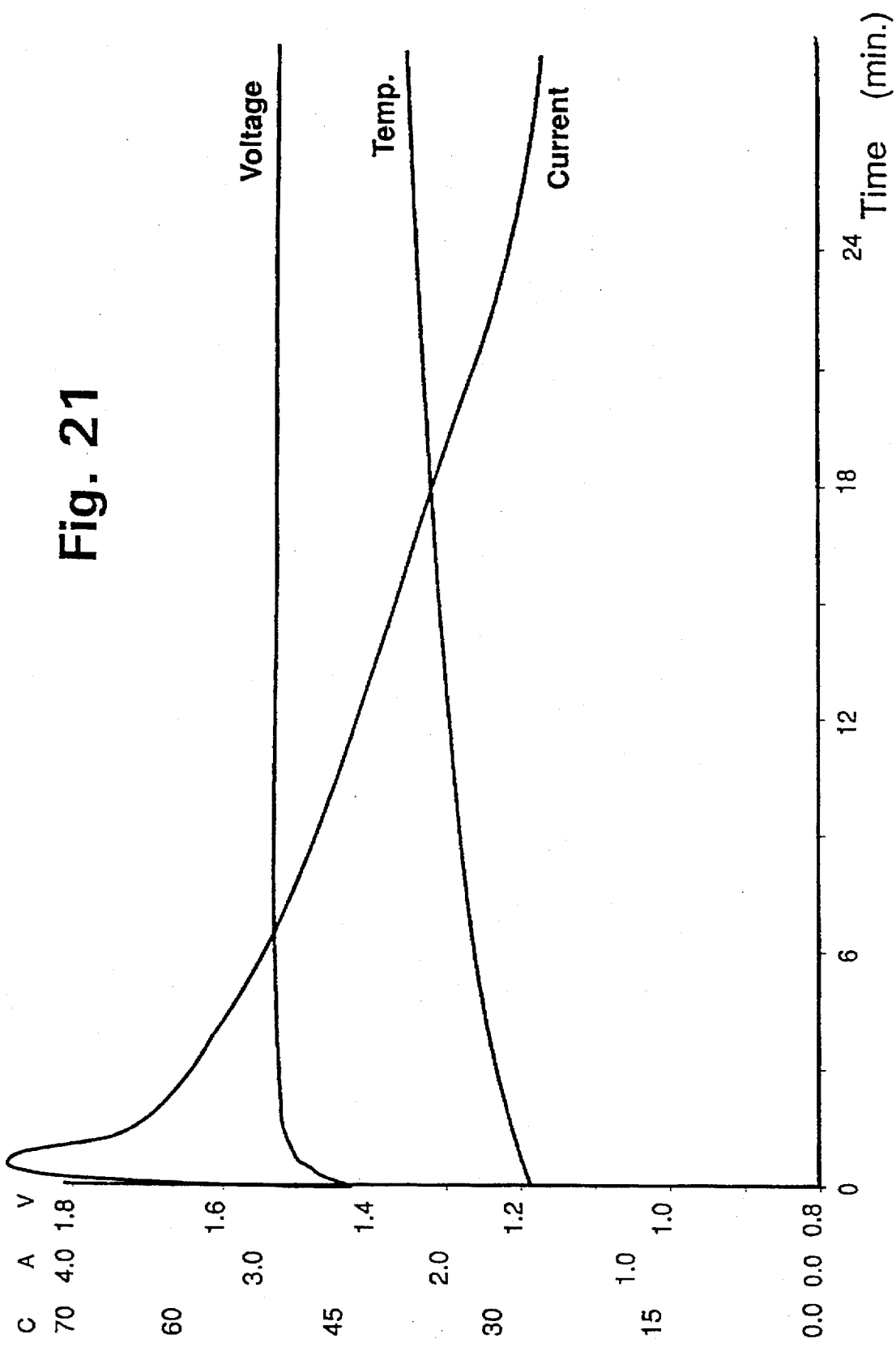
FIG. 21 shows the charging voltage curve, the temperature curve and the charging current curve for a Nickel Metal Hydride battery which is initially charged with a high charging current.

When charging a battery, the battery temperature and/or the charging current may be monitored, and the charging process may be terminated when the measured rise in temperature equals the maximum battery temperature difference determined during the first analysis charging process. Alternatively, the charging process may be terminated when no further decrease in the charging current has been detected for a predetermined period of time during the remaining charging period. This is illustrated in FIG. 21 which shows the charging curves for a Nickel Metal Hydride battery which is initially charged with a very high charging current. In this case, Vmax is reached very early and the charging process is controlled so that the battery terminal voltage is held constant at Vmax, resulting in a decrease in the charging current, and the charging process is terminated when no further decrease has been detected in the charging current.

As mentioned above the battery may comprise several battery cells. These cells are connected in series and the resulting battery voltage depends on the number of cells within the battery. However, the characteristics of the battery cells may vary from cell to cell within the battery. In order to obtain substantial control of the discharging and charging processes of the battery, it is desirable to be able to measure the voltage and/or temperature of each individual cell during discharge and/or charge of the battery. A battery having at least two battery cells, therefor preferably including a mechanism for measuring the voltage of each cell. The battery suitably also comprises a memory device for storing the measured cell voltages. In a preferred embodiment of the battery, each cell is also provided with a temperature sensor with the measured temperature being stored in the memory device.

Figure 22:
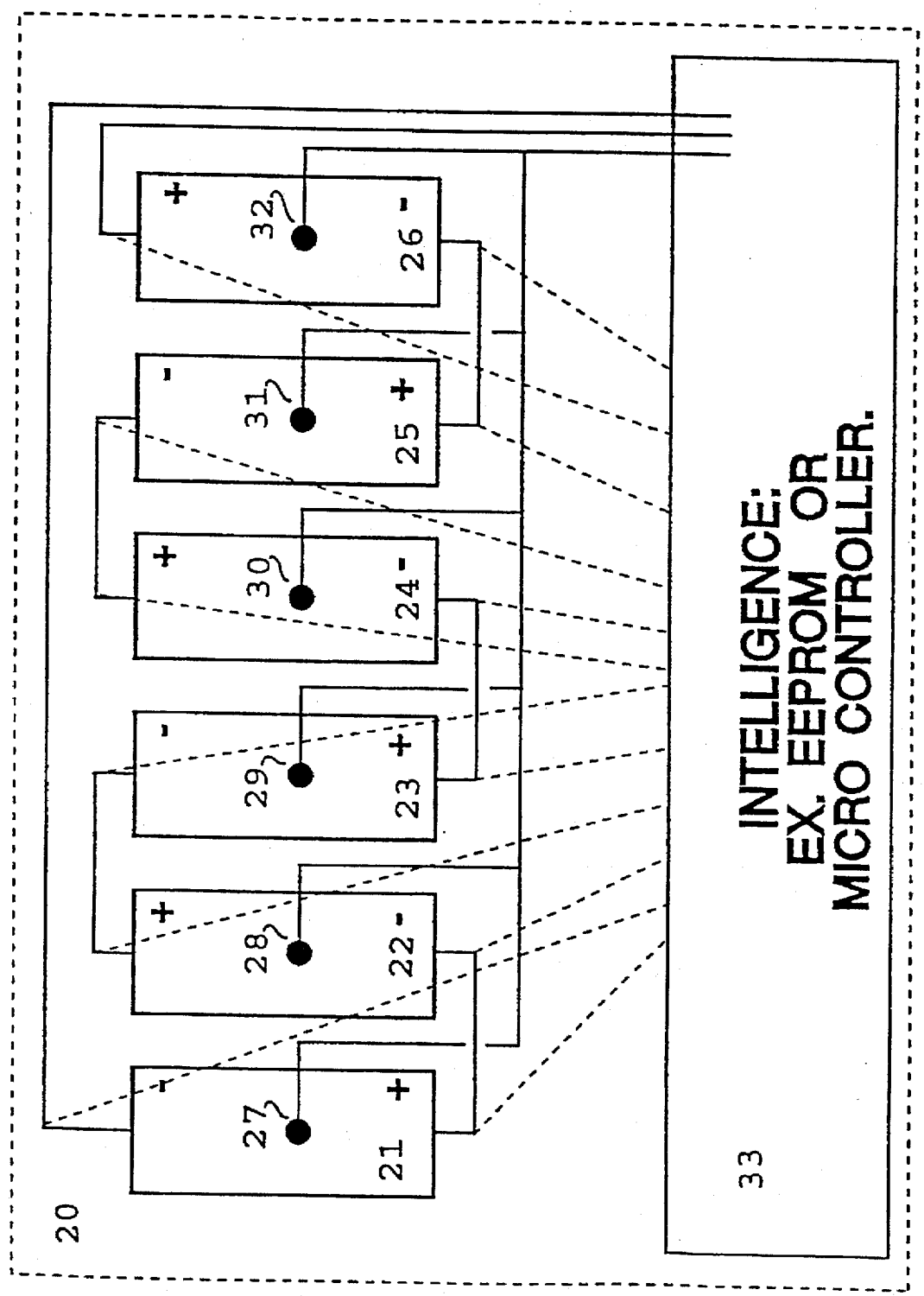
FIG. 22 is a block diagram of a battery according to the invention.

Referring to FIG. 22, a battery 20 according to various aspects of the invention comprises a predetermined number, e.g., 6 battery cells 21–26, each with an associated temperature sensor 27–32 provided for each cell and a memory device 33 such as an EEPROM and/or a microprocessor for reading the voltage across each cell and/or the temperature of each cell 21–26.

Figure 23:
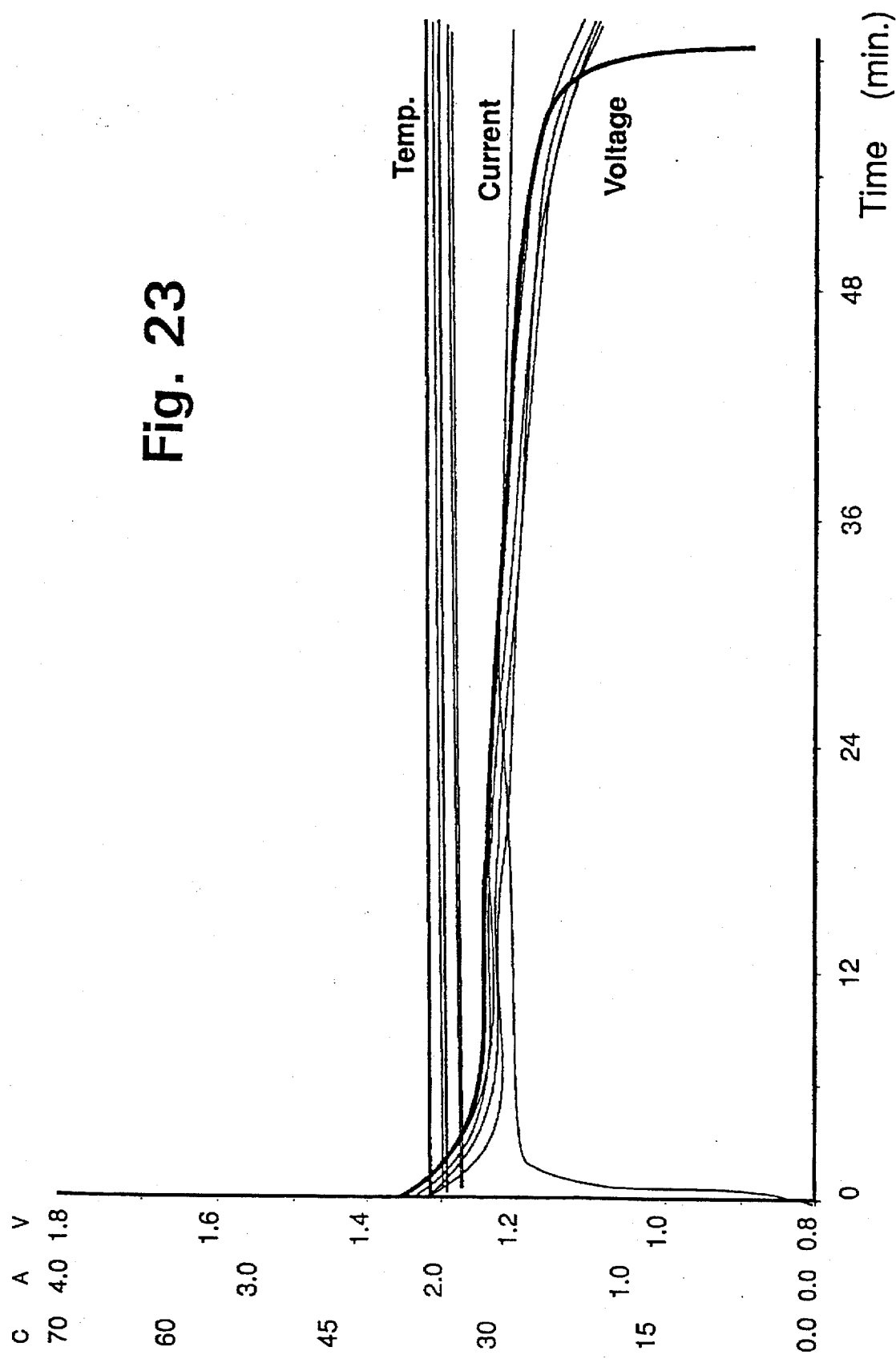
FIG. 23 shows the discharging voltage curves for each cell in a NiCd battery having 6 cells and being discharged with a constant current.
Figure 24:
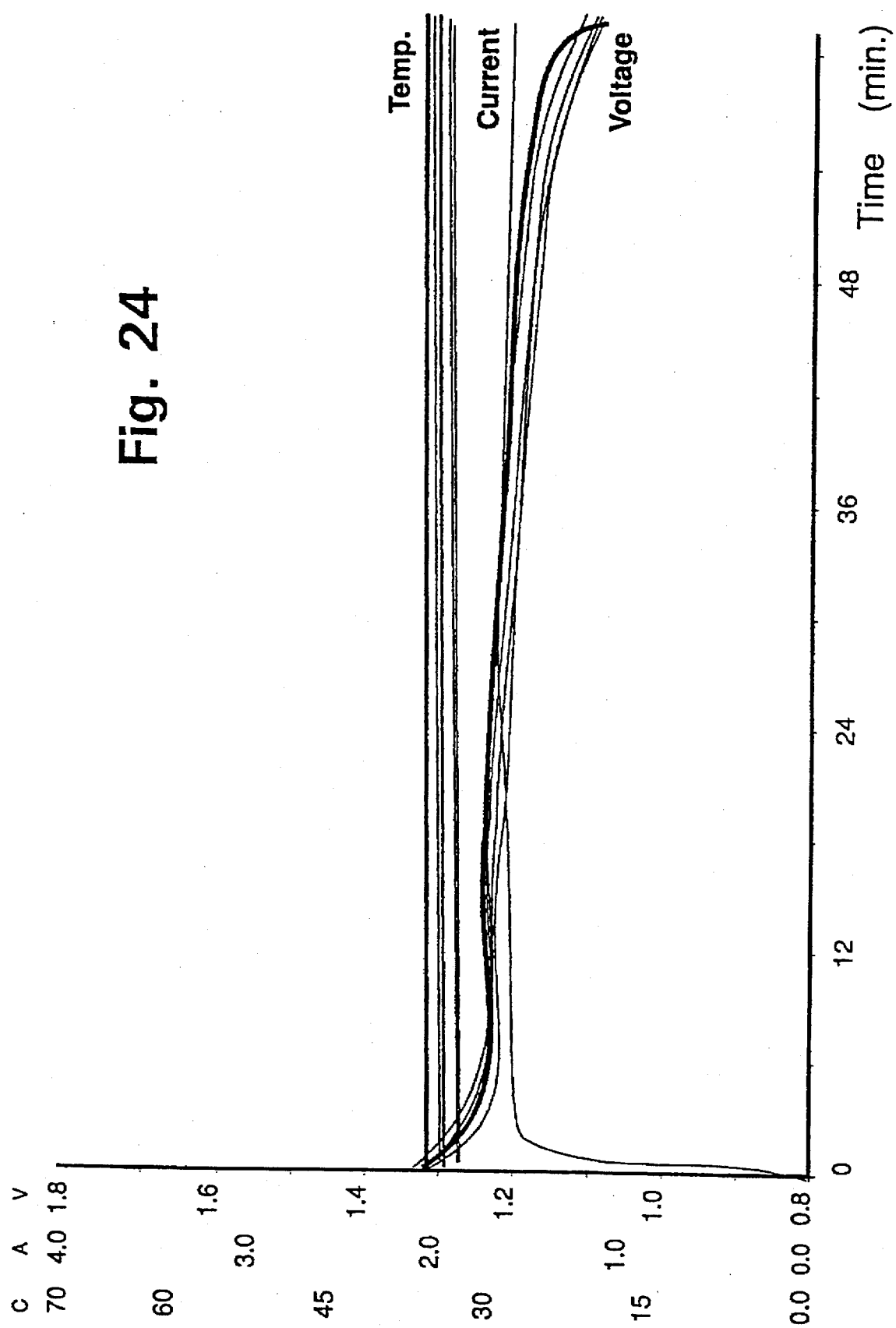
FIG. 24 illustrates a controlled discharging process according to the invention for a NiCd battery having 6 cells.

As the characteristic may vary for each cell of the battery, it is very important to control the discharging process with respect to the cell showing the largest drop in cell voltage when the battery is being discharged. Referring to FIGS. 23 and 24, if a NiCd battery having 6 cells is discharged with a constant current, and the overall voltage of the battery is used in order to stop discharging of the battery, at least one of the cells obtains a relatively large voltage drop and, thus, is discharged to a very high degree. As a result, this cell may not be fully charged when the battery is subsequently being re-charged and the capacity of the battery may decrease. This may be avoided by the discharging process shown in FIG. 24, where the discharging process is controlled so that the discharge of the battery is terminated when the first of the cell voltage curves drops to a predetermined level. This level might be, for example, in the range of 0.8–1 Volt.

Figure 25:
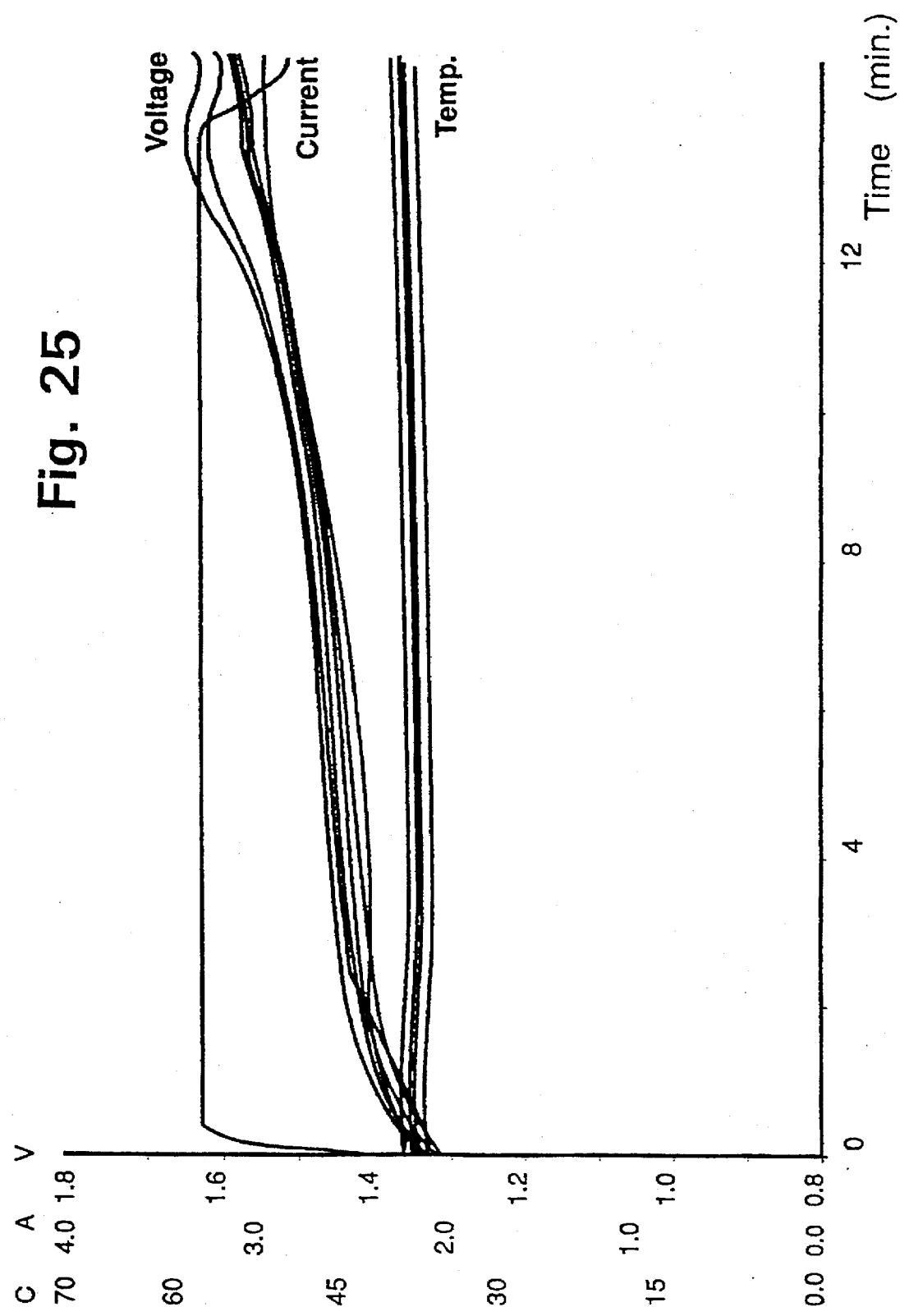
FIG. 25 shows the charging voltage curves and the temperature curves of each cell of a NiCd battery having 6 cells and being charged with a constant charging current.

Similarly, the maximum cell voltage will not be reached at the same time during a charging process. Referring to FIG. 25, during charging, one of the cells of a NiCd battery may reach the maximum cell voltage before the other cells. In an aspect of the present invention, the remaining charging period of the charging process is preferably determined at the point in time when one of the cell voltages first reaches the maximum cell voltage.

Figures 26, 27, 28:
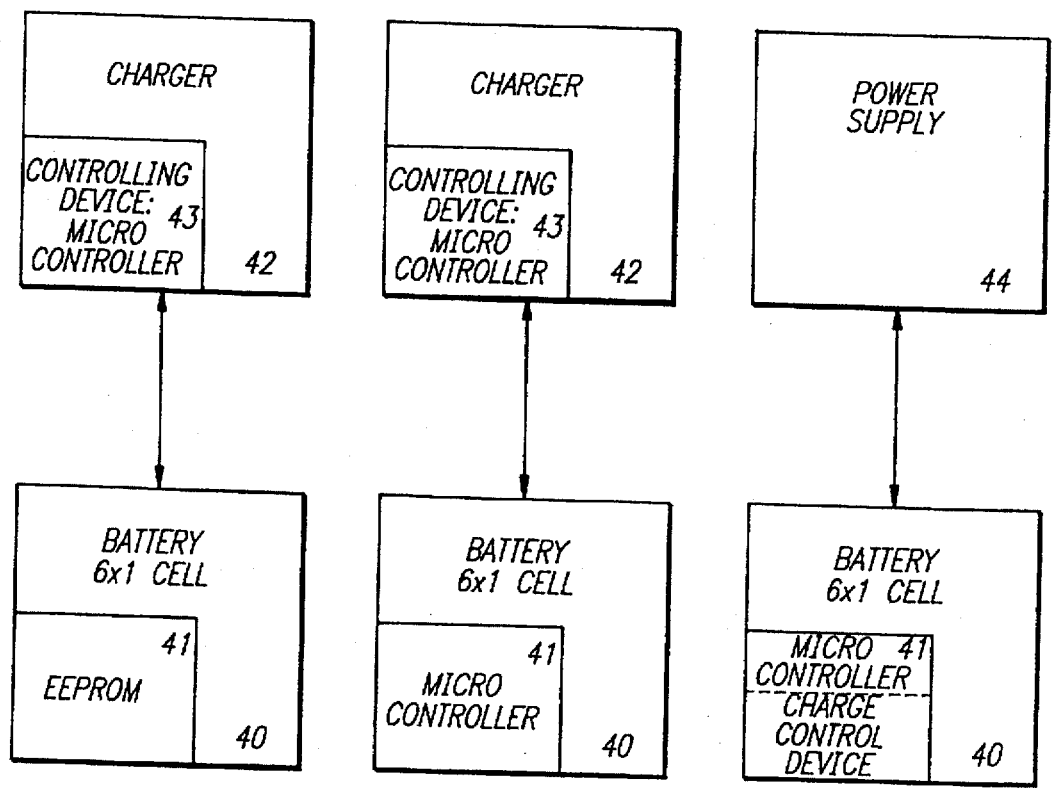
FIGS. 26, 27 and 28 are block diagrams showing different embodiments of a battery systems according to the invention.

Referring to FIGS. 26, 27, and 28, the block diagrams of different embodiments of a battery system according to the present invention are shown. FIG. 26 shows a system wherein a battery 40 comprises a memory device 41, such as an EEPROM, and a charging apparatus 42 having a controlling device 43, such as a microprocessor. However, memory device 41 of battery 40 may also comprise a controlling device 43 such as a microprocessor, as shown in FIG. 27. Referring to FIG. 28, the charging control device may also be integral to memory device 41 of the battery 40 and in this case, the battery 40 only needs to be connected to a power supply 44 which is controlled by the memory device 41 of the battery.

The above described first and/or second analysis charging processes may be used in connection with a battery including a memory device, and the measured data and parameters may be determined and/or stored within the memory device/controller of the battery. Alternatively, data may be collected by a computer system which will supply the characteristic parameters to the charging apparatus having a memory for storing these parameters.

Figure 29:
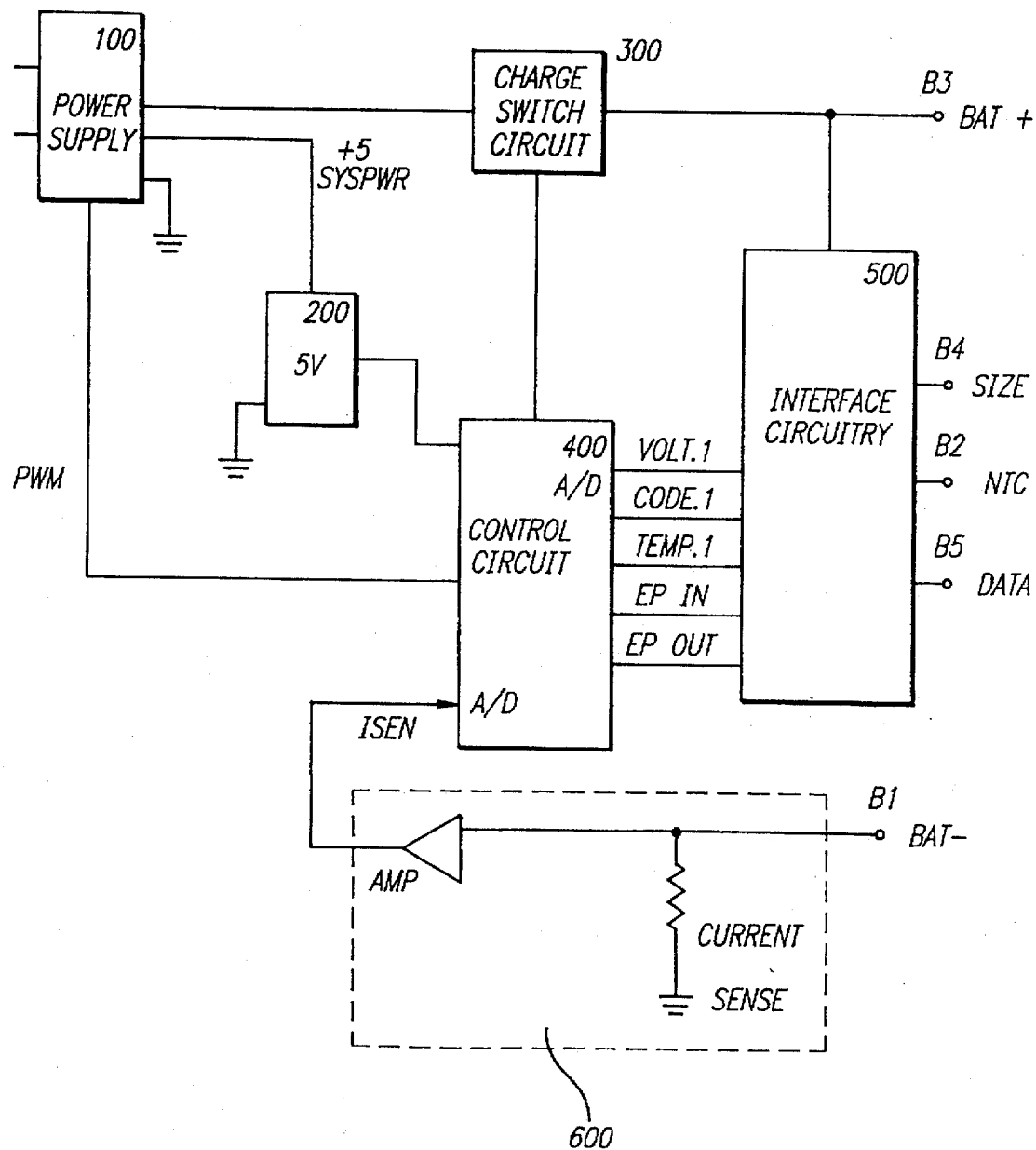
FIG. 29 is a block diagram of a battery charger system according to various aspects of the invention.

Referring to FIG. 29, a battery charging system 99 according to various aspects of the present invention suitably varies the voltage and current provided to the battery according to various sensed parameters. The voltage or current provided to the recharging battery may be modulated, for example using pulse width modulation, to control the charge provided to the battery. Battery charging system 99 suitably selectively operates either as a substantially constant current source or as a substantially constant voltage according to the requirements of control circuit 400. A suitable system is comprised of conventional components, such as battery recharging system 99 of FIG. 29. Battery charging system 99 comprises: a power supply 100; system power circuitry 200; a charge switch circuit 300; a control circuit 400; interface circuitry 500; and a current sensing circuit 600.

Power supply 100 provides electrical power to the remainder of the charger from, for example, a conventional wall outlet. Power supply 100 suitably filters transients from and rectifies the incoming signal to generate a relatively stable d-c signal. For example, referring to FIG. 30, power supply 100 suitably comprises a switched mode power supply having high efficiency and compatible with a wide range of inputs, for example, 85 to 265 volts. Power supply 100 suitably comprises: filter 102 for filtering line noise; a rectifier 103; a switch transistor 106, such as a power MOS switch transistor; a snubber network 108; and a transformer 120. Filter 102, suitably comprising a conventional analog filter and filters anomalies in the incoming signal. Rectifier 103, such as a bridge rectifier, converts the incoming a-c signal into a d-c signal, which is provided to snubber network 108. Snubber network 108 clamps high voltages from switch transistor 106.

Current from power supply 100 is suitably transferred to the battery through transformer 120. The primary winding of transformer 120 receives the rectified signal from snubber network 108, and is controlled by switch transistor 106. Switch transistor 106 is controlled by control circuit 400, as further described below, suitable for controlling the power supplied to the battery, for example, using pulse width modulation. When switch transistor 106 is activated, current flows through the primary winding of transformer 120 to transfer power to the secondary winding. By selectively activating and deactivating switch transistor 106, the power provided to the battery may be controlled. Power transferred through the secondary winding of transformer 120 is then provided to charge switch circuit 300 through a suitable power rectifier 122.

Charge switch 300 effectively controls the charging of the battery connected to battery charger system 99 by selectively interrupting the charging current. Charge switch 300 suitably comprises a first transistor 302 controlled by a second transistor 304 that is selectively activated by control circuit 400. First transistor 302 suitably comprises a power MOSFET having its source connected to the power supply through power rectifier 122 and its drain connected to the positive terminal of the battery. The gate of first transistor 302 is connected to and controlled by second transistor 304. Second transistor 304 suitably comprises a BJT having its emitter connected to ground, its collector connected to first transistor 302, and its base connected to control circuit 400. When second transistor 304 is activated by control circuit 400, the potential at the gate of first transistor 302 decreases, deactivating first transistor 302 and terminating the current provided to the battery. Conversely, when control circuit 400 deactivates second transistor 304, first transistor 302 is activated and current is again supplied to the battery. Thus, control circuit 400 directly controls the power supply to the battery.

System power circuitry 200 is also connected to the secondary winding of transformer 120. System power circuitry 200 provides a predetermined voltage, for example +5 volts d-c, for system operation. System power circuitry 200 suitably comprises: a low power rectifier 202; and a regulator 204, such as a linear load drop regulator. Low power rectifier 202 rectifies the current from transformer 120 to provide d-c current to regulator 204. A capacitor 124 is suitably charged while rectifier 202 conducts, and discharges when rectifier 202 is reverse biased to support the voltage provided to regulator 204. Regulator 204 provides an accurate predetermined voltage for the various system components of battery charger system 99.

Control circuit 400 receives data from the battery through interface circuitry 500. Interface circuitry 500 couples control circuit 400 to the battery to determine various parameters, such as the voltage, capacity, temperature, and to otherwise communicate with the battery being charged and provide relevant data to control circuit 400. Interface circuitry 500 suitably comprises a series of voltage dividers connected to various checkpoints for the battery. For example, a first voltage divider 510 connects control circuit 400 to the battery's positive terminal to reduce the battery voltage within a range compatible with control circuit 400. A second voltage divider 520 suitably connects a coding resistor internal to the battery for determining the battery type, capacity, or other parameter of the battery. This type of coding resistor is typically built into the battery or battery pack. A third voltage divider 530 suitably couples control circuit 400 to a temperature sensor, suitably a negative temperature coefficient thermistor, integral to the battery or battery pack. The thermistor provides data corresponding to the internal temperature of the battery. Communication interface 540 may also be included for transmitting data between information circuitry, such as an EEPROM or microprocessor, located in the battery or battery pack, and control circuit 400. Control circuit 400 suitably reads information from the battery's internal EPROM regarding, for example, charging characteristics of the battery or other significant data.

A current sensing circuit 600 is suitably coupled between control circuit 400 and, for example, the negative terminal of the battery. Current sensing circuit 600 senses the charging current traveling from the negative terminal of the battery being charged, BAT-, to the common ground of the power supply 100. Current sensing circuit 600 suitably comprises a current sensing resistor 602 and an operational amplifier 604 which amplifies the signal allowing direct measurement of charging current by the analog/digital converter (not shown) of control circuit 400. Charging current flowing through the battery flows from the negative terminal to ground through a current sensing resistor 602. The proportional voltage drop across resistor 602 is amplified by amplifier 604, from which the charging current may be determined by control circuit 400.

Control circuit 400 monitors various parameters, e.g., temperature, current, and the voltage of the battery being charged and controls the current and voltage applied to the battery. In particular, control circuit 400 monitors data through interface circuitry 500, and controls the power level of power supply 100 and charge switch circuit 300 to charge the battery. Control circuit 400 suitably comprises: a microprocessor 401, such as an 8-bit microcontroller; an analog to digital converter (suitably integral to microprocessor 401) for converting data, such as voltage, current, capacity, and temperature information from the battery being charged, into digital format for further processing within control circuit 400; a pulse width modulation (PWM) circuit 104; and a storage circuit (suitably integral to microprocessor 401) for storing data, such as, for example, the voltage, current, and temperature data, for use in further processing and controlling of the battery being charged. Microprocessor 401 suitably analyzes data received through interface circuit 500 and current sensing circuit 600 according to an analysis program, as described in further detail below. Based on this analysis, microprocessor adjusts PWM circuitry to affect the current and voltage supplied to the battery and controls charge switch circuit 300.

PWM circuitry 104 suitably comprises: PWM controller IC1; optocoupler IC2; transistor Q1; and resistors R4, R5, and R6. Microprocessor 401 provides a control signal to optocoupler IC2 through a buffer 128. Optocoupler IC2 couples, but electrically isolates, microprocessor 401 and PWM circuitry 104. The pulse width control signal is coupled to the primary side of optocoupler IC2, which selectively activates the secondary. Optocoupler IC2 selectively activates and deactivates transistor Q1 by providing signals to the base of transistor Q1 corresponding to the signals received from microprocessor 401. Transistor Q1 suitably comprises a BJT which activates in response to signals from optocoupler IC2. The collector of transistor Q1 is connected to a voltage divider formed by resistors R6 and R4. When transistor Q1 is activated, however, a third resistor R5 is connected in parallel with resistor R4, reducing the voltage at the node between R4 and R6. It is this node voltage which affects the duty cycle of the PWM signal.

The voltage divider formed by resistors R4 and R6 is connected to an input of PWM controller IC1. PWM circuitry 104 further suitably includes an auxiliary winding in transformer 120. Auxiliary winding is suitably wound to generate a voltage identical to that of the secondary winding, and is connected to the supply end of the voltage divider formed by resistors R4 and R6. PWM controller IC1 varies the duty cycle of the PWM signal provided to transistor 106 according to the voltage asserted at the voltage divider. If the voltage at the node between resistors R4 and R6 falls below the desired voltage, for example 2.5 volts, PWM controller IC1 extends the duty cycle of the PWM signal, thus providing greater charging power across transformer 120. Thus, if the voltage of the secondary winding (and therefore the auxiliary winding) falls below the selected threshold, PWM controller IC1 extends the duty cycle to enhance the voltage to the appropriate level.

Similarly, microprocessor 401 directly controls the current supplied to the battery. By activating optocoupler IC2, transistor Q1 is activated, which reduces the voltage at the node between resistors R4 and R6, and PWM controller IC1 extends the duty cycle to increase the power supply. Thus, microprocessor 401 directly controls power delivery to the battery by modifying the PWM signal according to various parameters. In addition, microprocessor 401 may selectively provide constant current or constant voltage to the battery as necessary according to its requirements.

In general, battery charging system 99 effects a charging operation on a battery or battery pack by initially increasing voltage until the maximum predetermined current (Imax) level is attained. At that point, the voltage is measured, and that voltage equal to the midpoint between the measured voltage and predetermined maximum voltage, the target voltage, is calculated and stored. Termination of charging is also calculated, and loaded into a downcounter. The system then applies a constant charge current (Imax) while monitoring the voltage level. If the calculated midpoint voltage is sensed, a new midpoint or target voltage (midway between the present voltage level and predetermined maximum voltage) is calculated, and the termination time recalculated. If the downcounter times out prior to reaching the target voltage, charging is suitably deemed complete. This process is continued until the maximum voltage is sensed. At this point, the circuit effects a constant voltage mode of operation wherein the charging current is reduced, and the time to termination of charge again recalculated. Once the charging time expires, the battery pack is maintained at its maximum voltage by supplying a trickle charge current to the battery pack.

Figure 30A:
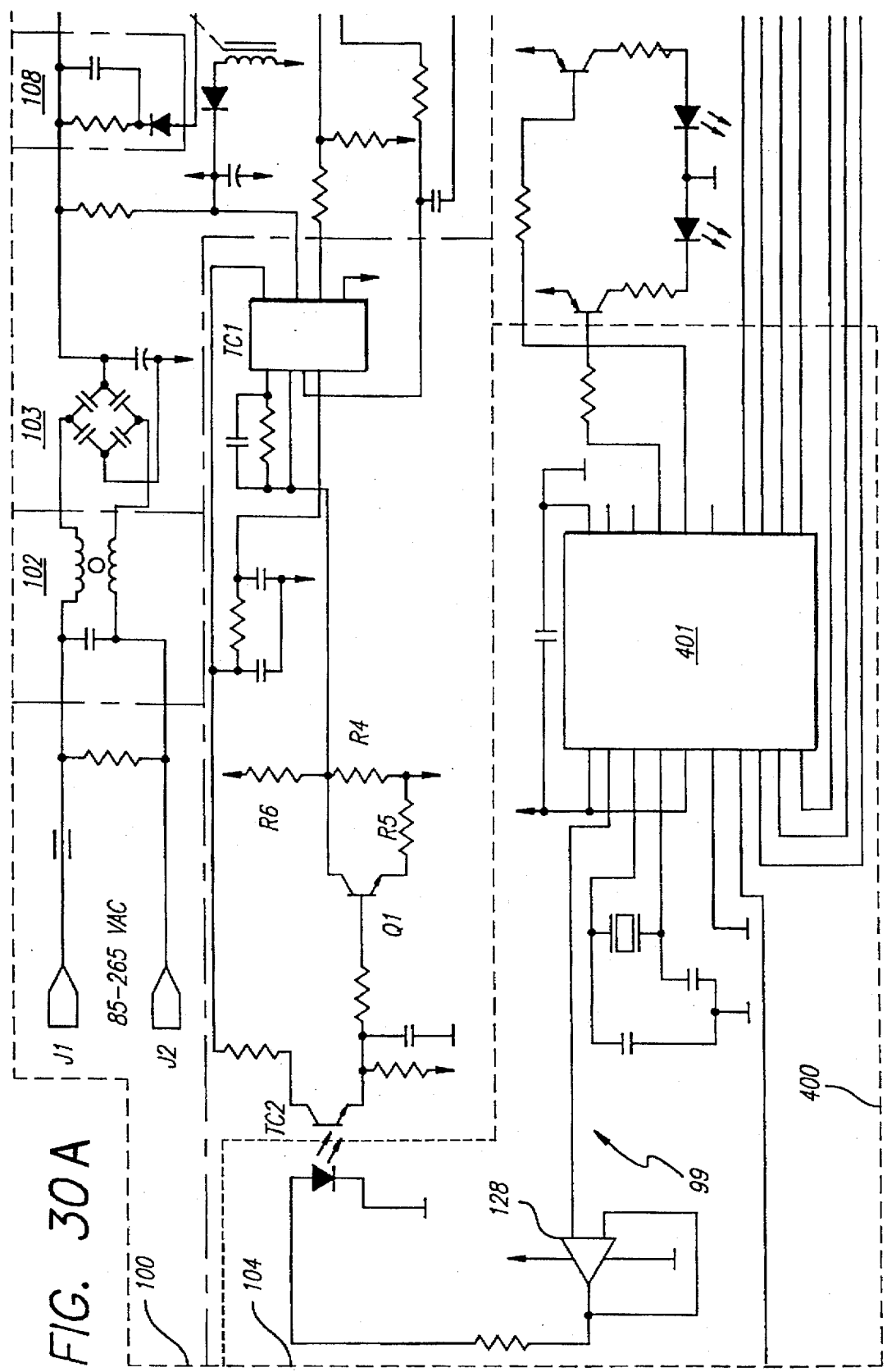
FIG. 30 is a schematic representation of the embodiment of FIG. 29.
Figure 32:
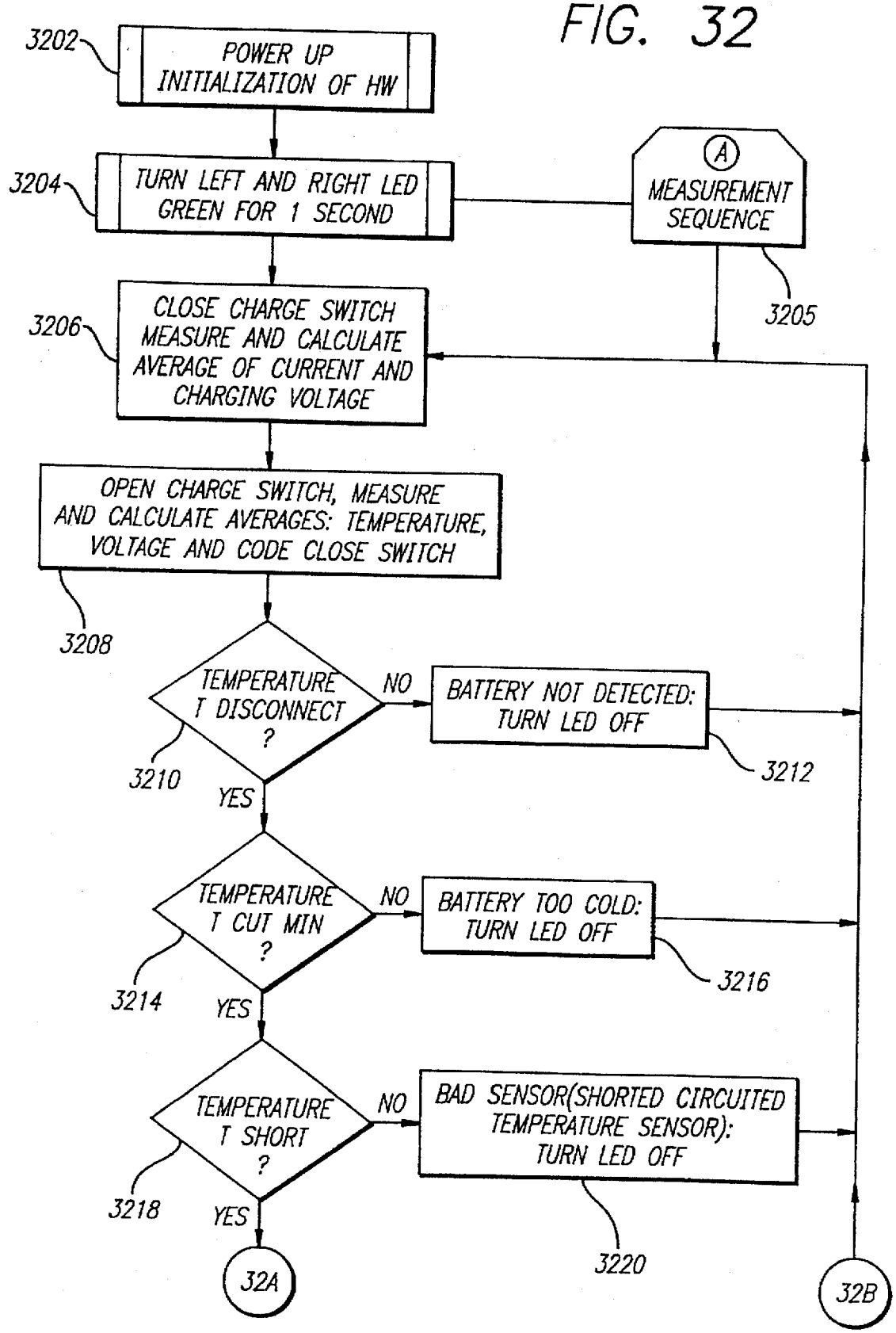
FIGS. 32–36 is a flow chart of an exemplary battery charging process effected by the system of FIG. 29.
Figure 33:
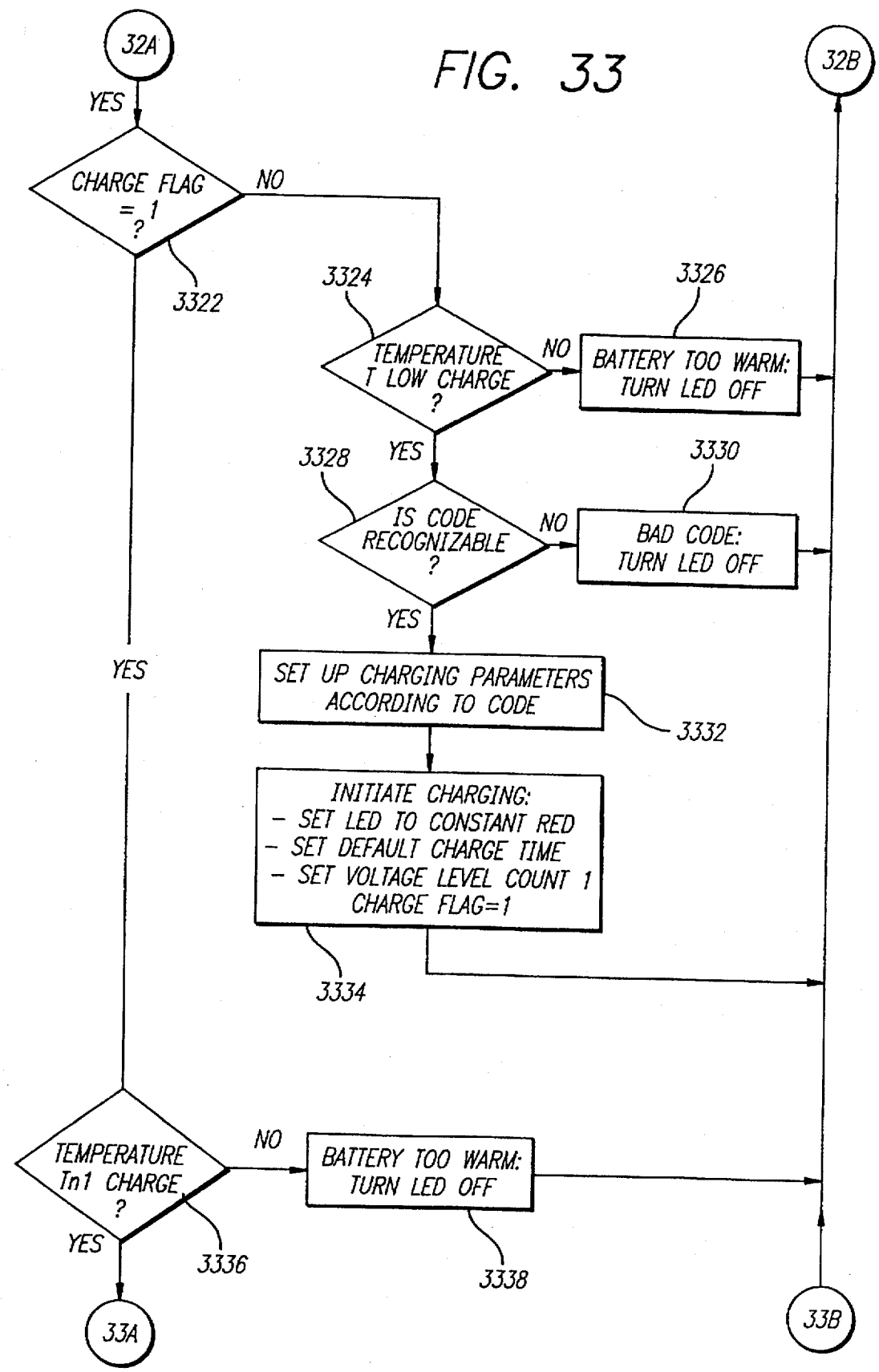
Figure 34:
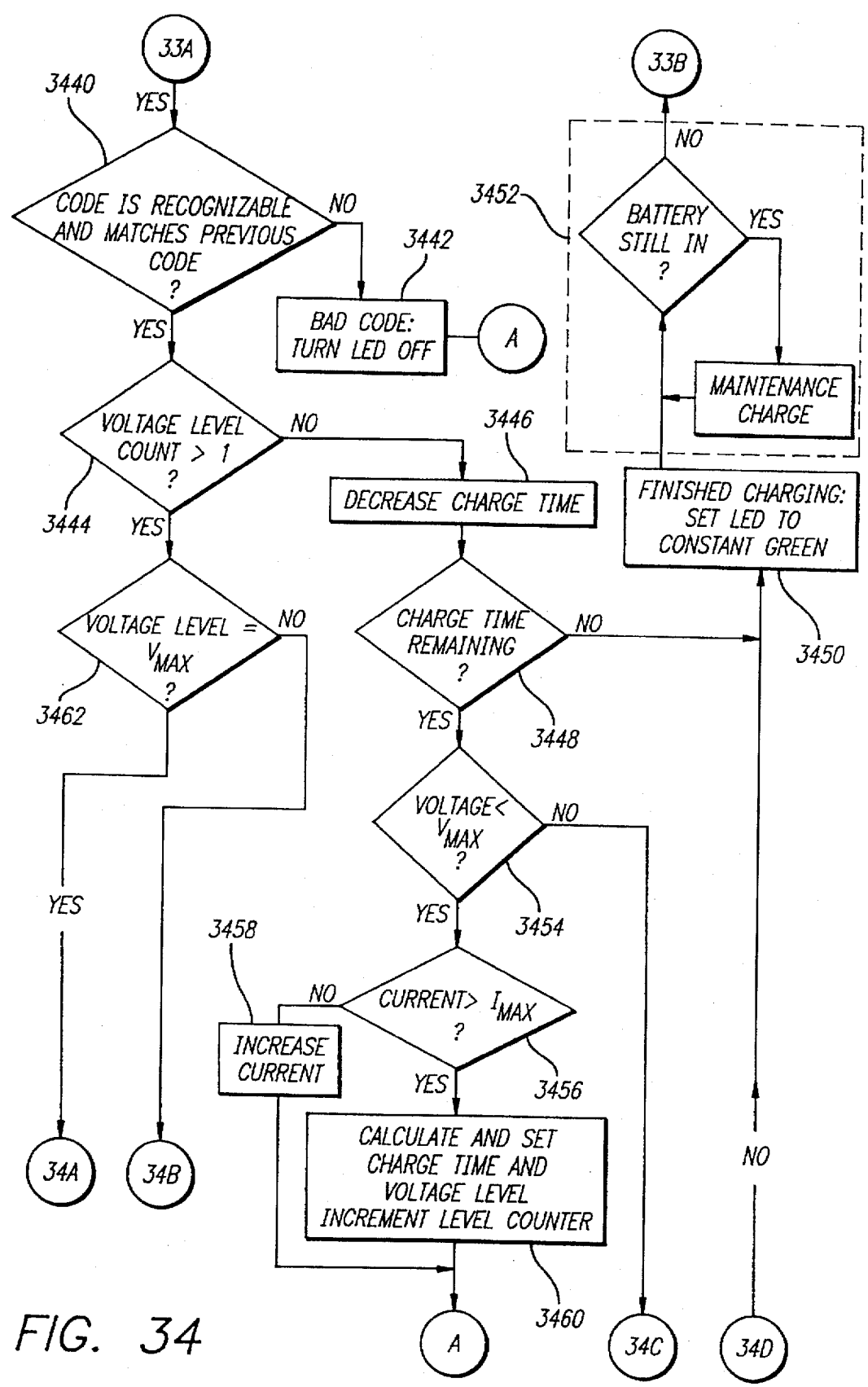
Figure 35:
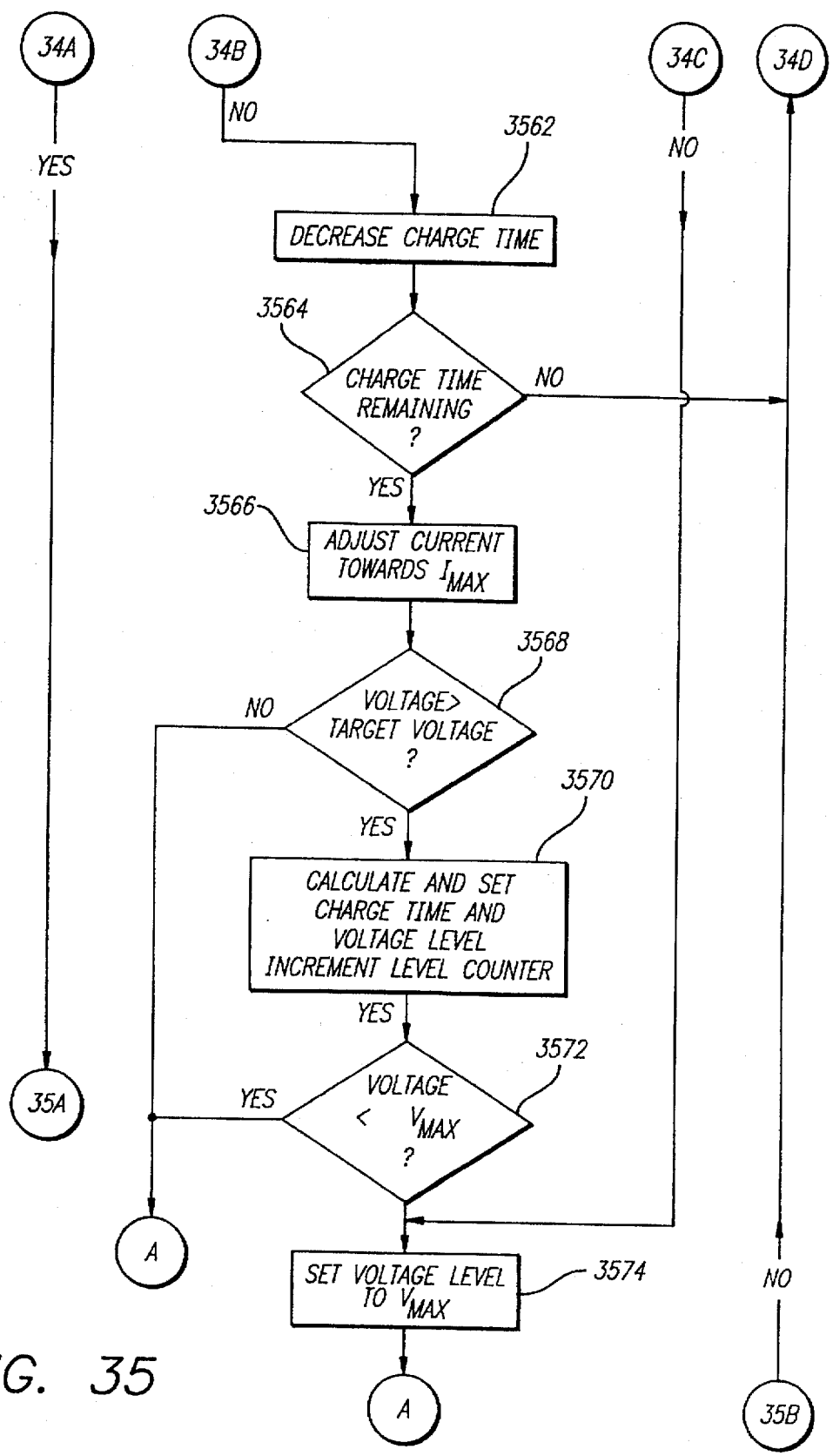
Figure 36:
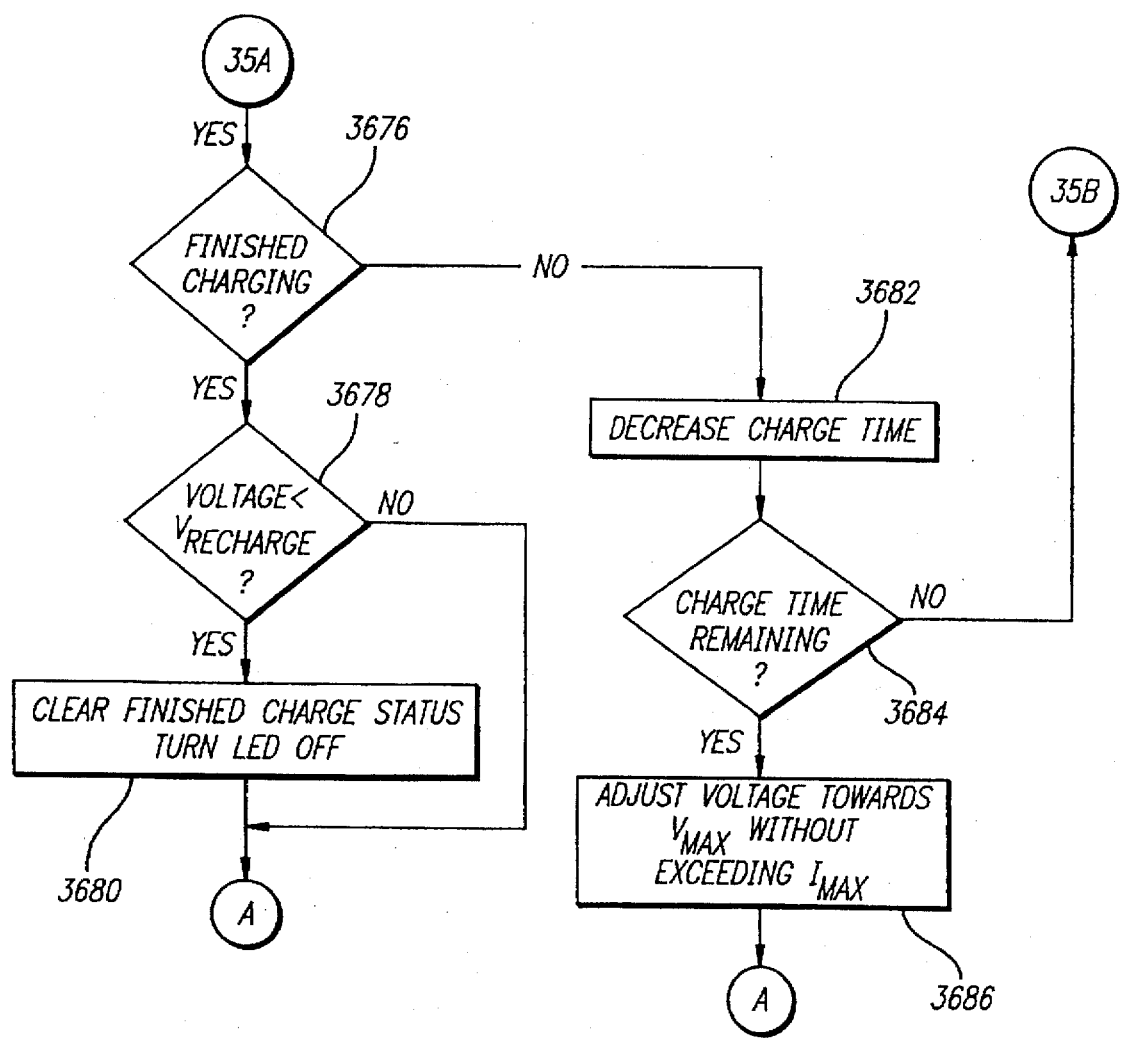

Microprocessor 400 of FIG. 30, suitably includes an internal memory, e.g., an EEPROM and/or random access memory (RAM) (or respective randomly accessible registers), and/or read only memory (ROM). A set of instructions (typically maintained in ROM) are effected to control the operation battery charger system 99. In general, the EEPROM (or random access memory) suitably includes locations and/or arrays corresponding to parameters used in the charging process: a charge time counter 3102, for maintaining indicia of the time remaining until charging termination; indicia of measured charge current 3104, measured charge voltage 3106, measured temperature 3108, and measured battery voltage 3110 (each suitably averaged over a predetermined number of values maintained in respective stacks 3116, 3118, 3120 and 3122); indicia of a battery type code 3112; a charge flag 3124, indicative of the charging operation status; a battery information table 3126, containing various predetermined parameters for each type of battery accommodated by battery charger system 99; a voltage level count 3146 indicative of the advancement through the charging cycle (i.e., level of Target Voltage); a Target Voltage 3148, indicative of the calculated voltage corresponding to the voltage level count; indicia Vmax 3150 of the maximum voltage for the particular battery at the measured temperature (suitably obtained from battery information table 3126) and the Vrecharge 3152, indicative of the voltage drop after full charging at which the battery would be recharged.

Battery information table 3126 may be preprogrammed with a respective set of parameters for each respective type of batteries which battery charging system 99 is to accommodate, or may receive information from a memory device maintained in the battery pack. The parameters suitably include: $T_{short}$ (3128), indicative of the limiting maximum threshold temperature recognized by the temperature sensor in battery pack (e.g., 86° C.); $T_{disconnect}$ (3136), indicative of a minimum threshold operating temperature for the battery pack (e.g., minus 28° C.); $T_{hicharge}$ (3130), indicia of the highest permissible temperature during a charging operation (e.g., 50° C.); $T_{lowcharge}$ (3132), indicative of the maximum permissible battery temperature at which charging will be initiated (e.g., 40° C.); and $T_{cutmin}$ (3134), indicia of a minimum battery pack temperature below which charging will not be initiated (e.g., −10° C.).

An array 3138 of Vmax values for respective predetermined temperatures $Temp_1$–$Temp_n$, indicative of the maximum battery voltage for the particular battery pack at a particular temperature; a Vrecharge array 3140, indicative of the Vrecharge values at temperatures $Temp_1$–$Temp_n$; Imax (3142), indicative of the maximum charging current for the particular battery pack; and Itrickle (3144), indicative of the trickle current level to be provided to the battery pack.

Referring now to FIGS. 32–36 and 31, upon power up, the charger hardware is suitably initialized (Step 3202) and, if desired, an indicator actuated (Step 3204).

After initialization, a measurement of various external parameters is effected (Step 3205). Charge switch 302 is closed, and the current and charging voltage measured, i.e., the signals from current sensor 600 and voltage divider 510 are applied, in sequence, to the A to D converter in microprocessor 400. If averaging is to be effected, the digitized values are pushed onto corresponding stacks 3116 and 3118, and the contents of the stack averaged, and the average loaded into the associated registers 3104 and 3106 (Step 3206). Charge switch 302 is then opened, to minimize the effects of internal battery resistance, and the temperature, voltage, and battery code data is acquired, and averages similarly calculated (if desired) (Step 3208).

A determination is then made with respect to whether the battery pack is within permissible temperature range. The measured (average) temperature in 3108 is tested against $T_{disconnect}$ (e.g., −28° C.), corresponding to the limiting minimum temperature of battery pack temperature sensor (Step 3210). If the temperature is not greater than $T_{disconnect}$, and is outside the range of signals generated by the temperature sensor, it is assumed that no battery is present in the charger, and a indicator is suitably deactivated (Step 3212), and the measurement sequence (Steps 3206, 3208) repeated.

Assuming that the temperature measurement indicates a battery present, the temperature is tested against value of $T_{cutmin}$, indicative of the minimum temperature at which charging will be initiated (Step 3214). If the temperature is not greater than $T_{cutmin}$, the battery is deemed too cold to be charged, and the indicative suitably turned off (Step 3216), and the measurement sequence repeated.

Assuming the temperature is above the minimum, it is then tested against the limiting maximum threshold level ($T_{short}$), e.g., 86° C., of the temperature sensor (Step 3218). If the temperature purports to be above the maximum, it is assumed that the sensor short-circuited, the indicator suitably turned off (Step 3220), and the measurement sequence reinitiated.

If the temperature is within the appropriate range, charge flag 3124 is tested to determine if the battery is presently being charged, or if a charge process is just being initiated (Step 3222). Charge flag 3124 is typically set to zero during initialization, and accordingly, it is at zero during the initial cycle. In the initial cycle, the temperature is tested against $T_{lowcharge}$ (e.g., 40° C.), indicative of the highest battery temperature at which a charging operation will be initiated. If temperature is not less than the value of $T_{lowcharge}$ (Step 3324), the battery is deemed too warm, the indicator suitably turned off, and a return to the measurement steps effected.

Assuming the temperature is within range, the battery code is then tested against the codes recognized by the system (Step 3328). If the code is not recognized, the indicator is suitably turned off (Step 3330), and a return to the measurement sequence effected.

Assuming that the code is recognizable, appropriate parameters are extracted from battery information table 3126 (or a memory device contained in battery pack) (Step 3332). The charging operation is then initiated. Charge time counter 3102 is set to a default value, suitably equal to the amount of time necessary to fully charge a battery of the type indicated by the battery code, voltage level count 3146 is set to 1, and charge flag 3124 is set to 1 (Step 3334). A return to the measurement sequence is then effected. New values of current, charging voltage, temperature, battery voltage, and code are then generated (Steps 3206, 3208). Assuming that the temperature is still in range (Steps 3210, 3214, 3218), charge flag 3124 is again tested (Step 3322).

The charge flag having been set during the previous set (Step 3334), the temperature is tested against $T_{hicharge}$ (e.g., 50° C.), indicative of the highest temperature the battery is permitted to attain during the charging process (Step 3336). If the threshold temperature is exceeded, the battery is deemed too warm, the indicator suitably deactivated (Step 3338), and a return to the measurement sequence effected.

Assuming the temperature is within range, the battery code reading is retested (Step 3440) to ensure that the battery has not been replaced with another. If the code does not match the previous code, the indicator is suitably deactivated (Step 3442), and a return to the measurement sequence effected.

Assuming that the cede is appropriate, the voltage level count is checked to determine the progress through the cycle (Step 3444). In the initial pass, the voltage level count is equal to 1. Accordingly, charge time counter is decremented (Step 3446) to reflect the period of time charge current was applied to the battery.

Assuming that charge time is remaining (Step 3448), the measured battery voltage 3110 is tested against Vmax, indicative of the maximum battery voltage at the given temperature (Step 3454). If the measured voltage is below the predetermined maximum, a constant current mode is entered. Measured charge current 3104 is compared against predetermined maximum Imax 3142 for the type of battery pack detected (Step 3456). If the charge current has not exceeded its maximum value, e.g., the current is ramping up, the current is increased (Step 3458), and a return to measurement sequence is effected. Once the charge current has slightly exceeded its predetermined maximum value, the voltage level and corresponding charge time are calculated and set (Step 3460), and a return to measurement sequence effected.

If, however, the measured battery voltage 3110 exceeds the predetermined maximum Vmax (Step 3454), the measured battery voltage is set to Vmax (Step 3524) and a return to measurement sequence effected.

After the initial pass, the voltage level count will be greater than one and the measurement battery voltage 3110 will be compared to the predetermined maximum voltage (Step 3462). If the battery pack has not yet reached its maximum value, Vmax, charging continues. Accordingly, charge time counter 3102 is decremented (Step 3562) to reflect the period of time charge current was applied to the battery pack. The contents of charge time (Counter 3102) are then tested against zero to determine whether there is charge time remaining for the process (Step 3564). If charge time counter 3102 has timed out, the battery pack is deemed to have finished charging, an indicator set accordingly (Step 3450), and a trickle charge operation initiated (Step 3452).

Assuming that there is charge time remaining, the charging current is adjusted towards its predetermined maximum level (Step 3566); microprocessor 400 adjusts the pulse width modulated control signal, which, as described above, effects increased power supply output current. The measured battery voltage 3110 is tested against the Target Voltage 3148 calculated in Step 3460. If the measured voltage is below the Target Voltage 3148, a return to the measurement sequence is effected. If, however, measured voltage is greater than or equal to the target voltage, the next charge time and voltage are calculated and set, and the level counter incremented (Step 3570).

Measured voltage 3110 is again compared against the predetermined maximum voltage for the battery type detected (Step 3572). If the measured voltage is below the maximum 3150, a return to measurement sequence is effected. If the measured voltage is not below the maximum, the level 3110 is set to the maximum (Step 3574) and a return to measurement sequence effected.

The sequence will continue as described until microprocessor 400 detects that the measured battery voltage 3110 is equal to the maximum voltage 3150 (Step 3462). A determination is made with respect to whether the battery pack has finished charging (Step 3676). Assuming that the battery has not finished charging, the charge time counter 3102 is decremented. A determination is again made with respect to whether there is charge time remaining (Step 3684). If time has expired, an indicator is set to indicate the completion of charging (Step 3450) and trickle charge initiated (Step 3452). Assuming, however, that the time has not expired, the charging process continues. The battery voltage 3110 is adjusted towards its maximum 3150 without allowing the charging current 3104 to exceed its predetermined maximum level 3142 (Step 3686). A return to measurement sequence is then effected.

If, instead, it is determined that charging is finished (Step 3676), the battery voltage 3110 is checked to determine if the battery voltage has dropped below a predetermined level, $V_{recharge}$ 3152 (Step 3678). If the battery voltage is above the recharge level 3152, a return to measurement sequence is effected. If, however, the battery voltage has dropped below the recharge level 3152, the finished charging status is cleared (Step 3680) to allow recharging and a return to measurement sequence effected.

It should be understood that the above described methods of the present invention are not valid only for a single type of batteries such as Nickel Cadmium batteries but should also be applicable for other types of re-chargeable batteries such as, for example, Lithium batteries and Nickel Metal Hydride batteries.

The foregoing description of preferred exemplary embodiments and best mode of the invention known to the applicant at the time of filing the application has been presented for the purposes of illustration and description. It is not intended to be exhaustive or to limit the invention to the precise form disclosed, and obviously many modifications and variations are possible in light of the present description. The various embodiments were chosen and described in order to best explain the principles of the invention and its practical application to enable others of ordinary skill in the art to best utilize the invention in various embodiments and with various modifications as are suited to the particular use contemplated. It is intended that the scope of the invention be defined by the claims.

We claim:

1. A method of charging a rechargeable battery having a pair of terminals, said method comprising:

selectively applying electrical power to the terminals of the battery;

monitoring at least one characteristic parameter of the charging process during at least part of the charging process;

comparing the characteristic charging parameter with corresponding stored reference parameters representing battery conditions;

selecting, based on said comparison, one of said stored sets of reference parameters;

determining the time (Tmax) at which the battery terminal voltage reaches a predetermined maximum value (Vmax):

determining a remaining period of charging time in accordance with the value of Tmax; and terminating the charging process when said remaining period of time has expired.

2. An apparatus for charging a chargeable battery, said apparatus comprising:

a connector adapted to selectively effect an electrical connection between the battery and an electrical power source;

means for monitoring at least one characteristic parameter of a charging process during at least part of the battery charging process;

a memory containing indicia of a plurality of reference parameters representing different desirable charging processes;

means for comparing the monitored charging parameter with the reference parameters and for selecting, based on said comparison, one of said stored sets of reference parameters; and means for determining the time (Tmax) at which the battery terminal voltage reaches a predetermined maximum value (Vmax); and means for determining a remaining period of charging time in accordance with the value of Tmax.

3. A method of determining a process of charging a rechargeable battery having a capacity C, said method comprising:

test charging the battery to a substantially fully charged state by supplying thereto a relatively low test charging current, the relatively low test charging current being of such a level and being supplied during such a period of time that a rise in at least one charging parameter, comprising battery temperature, inner pressure of the battery and the charging voltage of the batteries and/or the cells thereof, is obtained during the test charging; and determining a maximum value for the charging parameter during the test charging; and carrying out subsequent charging of the battery at a higher rate controlled to avoid exceeding the determined maximum value for the charging parameter.

4. The method of claim 1, wherein a first characteristic parameter is controlled during at least part of the charging process to obtain a predetermined desired sequence of a second characteristic parameter.

5. The method of claim 4, wherein the first characteristic parameter is the charging current and the second characteristic parameter is the charging voltage.

6. The method of claim 1, wherein the battery has at least two cells, the method further comprising:

monitoring the voltage of each cell; and controlling the remaining period of the charging process in accordance with the voltage of the cell which first reaches a predetermined maximum cell voltage.

7. The method of claim 1, wherein the remaining charging period is determined by comparing the time at which the maximum voltage is reached with stored reference values and corresponding remaining charging periods.

8. The method of claim 1, wherein the characteristic charging parameter is selected from the group consisting of the potential across the battery terminals, the electric charging current supplied to the battery, the inner temperature of the battery, and the rate of change of any of such parameters.

9. The method of claim 1, further including the step of controlling, in accordance with at least one of the reference parameters of the selected set, the voltage supplied to the terminals of the battery over at least part of the process of charging the battery.

10. The method of claim 9, wherein the voltage supplied to the battery is controlled to maintain the electric charging current supplied to the battery at substantially the same maximum value during a major part of the charging process.

11. The method of claim 9, wherein voltage is supplied to the battery for a first relatively short period prior to the initiation of the charging process so that characteristic charging parameters can be measured, the results of these measurements determining whether the charging process is to be initiated.

12. The method of claim 9, wherein the voltage supplied to the battery is controlled so that the charging current is kept below a lower level during a first period and is raised to a higher level during a later period of the charging process.

13. The method of claim 1, wherein:

the characteristic charging parameter is measured at predetermined time intervals during charging; the measured parameter values are compared with corresponding reference values; and the relevant set of reference parameters is selected in accordance with the of comparison of such measure of such measured values and reference values.

14. The method of claim 13, wherein the characteristic charging parameter is the rate of change of the parameter values as a function of the lapsed charging time.

15. The method of claim 13, wherein parameter values are measured and the rates of change of the parameter values are determined at periodic first time intervals, each determination of the rates of change being based on parameter values measured at second time intervals, the second time interval being a multiple of the first time interval.

16. The method of claim 1, wherein the step of selectively applying electrical power to the terminals of the battery comprises pulse width modulating a constant voltage source.

17. The method of claim 14, wherein the determination of the rate of change is initiated when a measured value of the characteristic parameters exceeds a predetermined value.

18. The method of claim 1, wherein each parameter value is an average of a plurality of measurements within a certain period of time.

19. The method of claim 1, further comprising the step of terminating the application of electrical power to the battery if the charging period reaches a predetermined maximum period.

20. The method of claim 1, wherein the charging process is terminated if one of the parameter values measured exceeds a predetermined value for the respective parameter.

21. The method of claim 1, wherein the application of electrical power to the battery is interrupted if and when the characteristic parameter monitored deviates a predetermined amount from any of the corresponding values of the stored reference parameters.

22. The method of claim 1, wherein the charge state of the battery is maintained after termination of the charging process by feeding a pulsating current to the terminals of the battery.

23. The method of claim 1, wherein the battery is subjected to an initial testing prior to the actual charging process, said testing comprising test charging the battery by supplying a first test charging current to the terminals of the battery for a first period of time, monitoring at least one test charging parameter, subsequently test discharging the battery for a second period of time; and monitoring at least one test discharging parameter, wherein the first part of the actual charging process is controlled in accordance with the monitoring done during at least one of the test charging and test discharging processes.

24. The method of claim 23, wherein the battery is test charged by applying a predetermined test charging voltage to the terminals of the battery and monitoring at least one characteristic parameter.

25. The method of claim 24, wherein the test charging voltage is increased gradually or stepwise.

26. The method of claim 24, wherein the test charging and discharging procedures are performed at least one time.

27. A method of charging a rechargeable battery having a pair of terminals, said method comprising:

connecting the terminals of the battery to an electrical power source;

initially test charging the battery by supplying a first test charging current to the terminals of the battery for a first period of time;

monitoring at least one test parameter;

subsequently test discharging the battery for a second period of time;

monitoring at least one test discharging parameter;

selecting values of at least one characteristic charging parameter based on the monitoring of the test charging and discharging processes;

subsequently at least partly charging the battery, wherein the battery charging process is controlled so that it is substantially in accordance with the values selected for the characteristic charging parameter, and terminating the charging process at the expiration of a remaining period of charging time determined when the battery terminal voltage has reached a predetermined maximum voltage.

28. The method of claim 27, wherein the battery is test charged by applying a predetermined test charging voltage to the terminals of the battery and monitoring at least one test parameter.

29. The method of claim 28, wherein the test charging voltage is increased gradually.

30. The method of claim 28, wherein the test charging and discharging processes are repeated at least one time.

31. The method of claim 27, wherein the test charging current supplied to the battery is relatively low.

32. The method of claim 27, wherein the battery is further charged subsequent to the partial charging, said further charging comprising:

monitoring the value of at least one characteristic parameter of the charging process during part of the battery charging process;

comparing the value of the characteristic charging parameter with corresponding values of stored reference parameters representing desirable charging processes;

selecting based on said comparison one of the stored sets of reference parameters; and controlling at least part of the process of charging the battery in accordance with at least one reference parameter of the selected set.

33. The method of claim 32, wherein the charging parameter is selected from the group consisting of the potential across the battery terminals, the electric charging current supplied to the battery, the inner temperature of the battery, and the rate of change of any of such parameters.

34. The method of claim 32, wherein the charging process is controlled by controlling the voltage supplied to the terminals of the battery.

35. The method of claim 34, wherein the voltage supplied to the battery is controlled to maintain the electric charging current supplied to the battery at substantially the same maximum value during a major part of the charging process.

36. The method of claim 33, wherein voltage is briefly supplied to the battery prior to the initiation of the charging process so that charging parameters can be measured, the results of these measurements determining whether the characteristic charging process is to be initiated.

37. The method of claim 34, wherein the voltage supplied to the battery is controlled so that the charging current is kept below a lower level during a first period and is raised to a higher level during a later period of the charging process.

38. The method of claim 32, wherein:

the characteristic charging parameter is measured at predetermined time intervals during charging; the measured parameter values are compared with corresponding reference values; and the relevant set of reference parameters is selected in accordance with the of comparison of such measured values and reference values.

39. The method of claim 38, wherein the rate of change of the parameter values as a function of the charging time lapsed is compared with corresponding reference values.

40. The method of claim 38, wherein the parameter values are measured and the rates of change of the parameter values are determined at uniform first time intervals, each determination of the rates of change being based on parameter values measured at second time intervals, the second time interval being a multiple of the first time interval.

41. The method of claim 32, wherein the charging current fed to the battery is controlled by pulse width modulating a constant voltage source.

42. The method of claim 39, wherein the determination of the rate of change is initiated when a measured value of the characteristic parameters exceeds a predetermined value.

43. The method of claim 32, wherein each parameter value is an average of a plurality of measurements within a certain period of time.

44. The method of claim 32, wherein the charging period is restricted to a predetermined maximum period.

45. The method of claim 32, wherein the charging process is terminated if one of the parameter values measured exceeds a predetermined value for the respective parameter.

46. The method of claim 32, wherein the charging process is interrupted if and when the characteristic parameter monitored deviates a predetermined amount from any of the corresponding courses or values of the stored reference parameters.

47. The method of claim 32, wherein the charge state of the battery is maintained after termination of the charging process by feeding a pulsating current to the terminals of the battery.

48. The method of claim 32, wherein the battery is test charged by applying a predetermined test charging voltage to the terminals of the battery and monitoring at least one characteristic parameter.

49. The method of claim 48, wherein the test charging voltage is increased gradually.

50. The method of claim 48, wherein the test charging and discharging procedures are repeated at least one time.

51. An apparatus for charging a rechargeable battery, said apparatus comprising:

a connector disposed to selectively effect an electrical connection between the battery and an electrical power source;

means for initially test charging the battery by supplying a first test charging current to terminals of the battery for a first period of time;

means for monitoring at least one test charging parameter;

means for test discharging the battery for a, second period of time;

means for monitoring at least one test discharging parameter;

means for selecting a sequence of at least one charging parameter based on the monitoring of the test charging and discharging processes; and means for controlling the process of partly charging the battery substantially in accordance with the sequence selected for the charging parameter, determining a remaining period of charging time when the value of the battery terminal voltage has reached a predetermined maximum voltage, and terminating the charging process when the remaining period of time has expired.

52. An apparatus according to claim 51, wherein the means for test charging the battery is adapted to apply a predetermined test charging voltage to the terminals of the battery, the monitoring means being adapted to monitor the test charging parameter.

53. The apparatus of claim 52, wherein the test charging means is adapted to increase the test charging voltage gradually.

54. The method of claim 3, wherein the charging parameter is the difference between maximum and minimum temperatures during the test charging in said certain period of time.

55. The method of claim 3, wherein the test charging current supplied to the battery is 0.1–0.3 C/h.

56. The method of claim 3, wherein the test charging current supplied to the battery is 0.2–0.25 C/h.

57. The method of claim 3, wherein the test charging current supplied to the battery is 0.75–1.5 C/h.

58. The method of claim 57, wherein the maximum value of the charging or terminal voltage is determined as the maximum voltage obtained when the test charging current has been supplied to the battery for a predetermined period of time.

59. The method of claim 3, wherein the battery is partly charged at a slow rate and subsequently discharged at least once prior to said test charging and determining the maximum charging parameter.

60. The method of claim 3, wherein the relatively low test charging current is supplied to the battery for a predefined period of time such that a rise in at least one of the charging parameters has been obtained and no further essential parameter change has been detected.

61. The method of claim 60, wherein a first charging stop point is determined when no further rise in parameter value has been detected for a predetermined period of time.

62. The method of claim 61, wherein a capacity value of the battery is determined by determining a total first charging power supplied to the battery during the test charging until the first charging stop point is reached.

63. The method of claim 62, wherein the charging parameters for which a maximum value is determined comprises the terminal voltage of the battery, said test charging comprising a second test charging process wherein the battery is charged by a second test charging current which is substantially equal to the C-rate based on the capacity value determined.

64. The method of claim 63, wherein the maximum voltage is determined as the voltage measured across battery terminals at the point of time where the battery temperature has increased by the difference between maximum and minimum temperatures determined during test charging.

65. The method of claim 3, wherein the battery is substantially discharged before initiating test charging.

66. The method of claim 64, wherein:

the battery is charged with a substantially constant charging current during part of the subsequent charging process, the substantially constant charging current being several times the C-rate based on the capacity value determined;

the voltage of the battery terminal is monitored; and when the maximum terminal voltage of the battery has been reached, the charging process is controlled to maintain the battery voltage substantially constant for the remaining period of the charging process.

67. The method of claim 66, wherein the battery has at least two cells, the voltage of each cell of the battery being monitored and the remaining period of the charging process being controlled based on the voltage of the cell first reaching the maximum cell terminal voltage.

68. The method of claim 66, wherein the stop point of the remaining charging period is determined by monitoring the charging current and when no further decrease in the charging current has been detected for a predetermined period of time, terminating the charging process.

69. The method of claim 66, wherein the subsequent charging process is stopped at a predetermined time, the remaining charging period being determined generally at the time when the maximum battery terminal voltage is reached.

70. The method of claim 66, wherein the remaining charging period is determined on the basis of a comparison of the battery terminal voltage sequence with stored reference voltage sequences.

71. The method of claim 69, wherein the remaining charging period is determined in accordance with the time when the maximum battery terminal voltage is reached.

72. The method of claim 69, wherein the stop point of the subsequent charging process and thus the remaining charging period is determined based on a comparison of the time at which the maximum voltage is reached with stored reference values and corresponding remaining charging periods.

73. The method of claim 66, wherein the subsequent charging process is stopped if the difference between maximum and minimum battery temperature exceeds the maximum value determined during test charging.

74. A battery system comprising:

a rechargeable battery including a pair of battery terminals;

an information means for containing information about the battery comprises at least one maximum value of a charging parameter determined by a method according to claim 3; and a charging apparatus including a pair of charger terminals, means for releasably interconnecting the battery and the charging apparatus so that the battery terminals are in electrical conductive contact with the charger terminals, and information receiving means for receiving information from the information means of the battery, whereby the charging of the battery may be controlled based on said information.

75. The battery system of claim 74 further comprising control means for controlling the charging process based on the information received by the information receiving means.

76. A rechargeable battery for use in the battery system of claim 74, said battery comprising a pair of battery terminals and an information means for containing battery information in a form which may be sensed by suitable information receiving means of a corresponding battery charging apparatus.

77. The battery of claim 76, wherein the information means comprises an electronic memory for storing the battery information.

78. The battery of claim 76, wherein the battery information comprises information about the type of the battery, the capacity of the battery, other specifications of the battery, charging status of the battery, the condition of the various battery cells, the last charging process, the last discharging process, the time period lapsed since the last charging and discharging process, charging parameter algorithms, and the internal battery pressure.

79. The battery of claim 77, further comprising control means for controlling the charging process.

80. The battery of claim 79, wherein the control means are adapted to control charging of individual cells of the battery in response to the information received from the information means.

81. The battery of claim 77, further comprising an electronic display for displaying information from the memory.

82. The battery system of claim 74, wherein the information means comprise a temperature sensor for sensing the temperature of the battery.

83. The battery system of claim 74, wherein charging current is initially increased when the temperature sensed by the temperature sensor is low.

84. The battery system of claim 74, wherein charging voltage is initially increased when the temperature sensed by the temperature sensor is low.

85. The rechargeable battery of claim 76, further comprising:
at least two battery cells;
means for measuring the voltage of each battery cell; and
means for storing the measured cell voltages in the information means.

86. The battery of claim 85, wherein the information means further comprises a microprocessor.

87. The battery of claim 76, wherein the information means comprises a temperature sensor for sensing the temperature of the battery.

88. A method of charging a rechargeable battery having terminals and a C-rate based on a predetermined capacity value of the rechargeable battery, said method comprising:
connecting an electrical power source to the terminals;
charging the battery with a substantially constant charging current during part of the charging process, said substantially constant charging current being several times the C-rate of the battery;
monitoring the voltage of the terminals;
controlling the charging process such that when a maximum terminal voltage has been reached, the battery voltage is maintained substantially constant for the remaining period of the charging process;
determining, at the time when the maximum terminal voltage has been reached, the remaining charging period of the charging process in accordance with the time when the maximum terminal voltage has been reached; and
stopping the charging process at the end of the remaining charging period.

89. The method of claim 88, wherein the battery has at least two cells, the voltage of each cell being monitored and the remaining period of the charging process being controlled based on the cell voltage first reaching the maximum cell terminal voltage.

90. The method of claim 88, wherein the remaining charging period is determined on the basis of a comparison of the terminal voltage with stored reference voltages.

91. The method of claim 88, wherein the stop point and thus the remaining charging period of time is determined based on a comparison of the time at which the maximum voltage is reached with stored reference values and corresponding remaining charging periods.

92. A method of charging a rechargeable battery, comprising:
storing indicia of charging periods corresponding to values of a predetermined charging parameter of the battery;
applying electrical energy to the battery;
sampling the parameter; and
terminating application of electrical energy to the battery in accordance with the charging periods corresponding to the sampled values of the predetermined charging parameter.

93. A method of charging a rechargeable battery, comprising:
storing indicia of a respective charging time period corresponding to each of a plurality of values of at least one characteristic parameter of the charging process during at least a predetermined part of the charging process;
applying electrical energy to the battery;
determining the value of the characteristic parameter for at least one point in the predetermined part of the charging process; and
terminating application of electrical energy to the battery in accordance with the charging time period corresponding to the value of the characteristic parameter.

94. The method of claim 93, wherein the storing indicia step comprises storing a plurality of sequences of values for the characteristic parameter under different charging conditions, and the method further includes the steps of:
applying a test charging current to the battery for an initial period;
determining the value of at least one test parameter associated with the charging during the initial period;
after the initial period, discharging the battery for a second period of time;
determining the value of at least one test parameter associated with discharging;
selecting one of the sequence or values of the charging parameter based on the test parameters; and
subsequently at least partly charging the battery substantially in accordance with the selected sequence of values.

95. The method of claim 93, wherein the step of applying electrical energy to the battery comprises controllably applying a current of a first predetermined value to the battery applying a current of a first predetermined value to the battery, and the method further comprises the steps of:

prior to applying a current of a first predetermined value to the battery, determining if the chemical reaction in the battery is normal.

96. The method of claim 95, further comprising the steps of:
if determined that the chemical reaction in the battery is not normal, applying a current to the battery of a predetermined value, less than the first predetermined value, for an initial time period.

97. The method of claim 93, comprising the steps of:
determining the value of at least the one characteristic parameter of the charging process at a plurality of sequential points in the process of charging the battery; and
terminating the charging in accordance with a time period determined in accordance with at least one of the determined values of the characteristic parameter.

98. The method of claim 93, comprising the steps of:
determining the value of the characteristic parameter of the charging process at a plurality of sequential points in the process of charging the battery; and
terminating the charging in accordance with the time period corresponding to the most recently determined value of the characteristic parameter.

99. The method of claim 93, comprising the steps of:
determining the value of the characteristic parameter of the charging process at a plurality of sequential points in the process of charging the battery; and
terminating the charging in accordance with a time period determined in accordance with at least one of the determined values of the characteristic parameter.

100. The method of claim 93, wherein the characteristic parameter is the rate of change of the voltage of the battery.

101. The method of claim 100, wherein the step of determining the value of the characteristic parameter comprises:
measuring the voltage of the battery at periodic intervals;
storing indicia of the measured voltage; and
for succeeding voltage measurements, determining the difference between the measured voltage and a prior voltage measured a predetermined number of intervals before.

102. The method of claim 100, wherein the electrical energy to the battery is cut off during periods when the voltage of the battery is measured.

103. The method of claim 93, wherein the step of applying electrical energy to the battery comprises the steps of:
controllably applying a current of a first predetermined value to the battery;
monitoring a predetermined parameter of the charging process;
controllably applying a current of a second predetermined value, less than the first predetermined value, to the battery in accordance with the value of the parameter reaching a first predetermined value;
and the part of the charging process for which indica is stored comprises at least part of the process during which the value of the current is the second predetermined value.

104. The method of claim 103, wherein the predetermined parameter of the charging process is related to the voltage of the battery and the monitoring step includes measuring the battery voltage, and the method further includes the step of interrupting the application of current to the battery while voltage measurements are taken.

105. The method of claim 93, wherein the step of applying electrical energy to the battery comprises the steps of:
controllably applying a constant current of a first predetermined value to the battery until the battery voltage reaches a predetermined maximum value; and
controllably applying a current to the battery to maintain a constant battery voltage subsequent to the battery voltage reaching the predetermined maximum value.

106. The method of claim 105 wherein the predetermined parameter of the charging process is related to the voltage of the battery and the monitoring step includes measuring the battery voltage, and the method further includes the step of interrupting the application of current to the battery while voltage measurements are taken.

107. The method of claim 93, wherein the step of applying electrical energy to the battery comprises the steps of:
applying pulse width modulated current pulses to the battery.

108. The method of claim 107, wherein the predetermined parameter of the charging process is related to the voltage of the battery and the monitoring step includes measuring the battery voltage between current pulses.

109. A method of charging a rechargeable battery, comprising:
storing reference values for at least one characteristic parameter of the charging process during at least part of the process of charging at least one type of battery;
connecting a source of electrical energy to the battery;
monitoring the value of at least the one characteristic parameter of the charging process during at least part of the process of charging the battery,
comparing the values of the charging parameter monitored with the stored corresponding reference values, and
determining the remaining period necessary to charge the battery based upon the stored reference values.

110. The method of claim 109, wherein the storing reference values step comprises storing a sequence of values for the characteristic parameter.

111. The method of claim 110, wherein the storing reference values step comprises storing a plurality of sequences of values for the characteristic parameter under different charging conditions, and the method further includes the steps of:
choosing, based upon the results of comparing the values of the charging parameter monitored with the stored corresponding reference values, one of the sequences of values for the characteristic parameter; and
determining the remaining period necessary to charge the battery based upon the chosen stored sequence of reference values.

112. The method of claim 111, wherein the different charging conditions comprise different starting states of charge.

113. The method of claim 111, further comprising the steps of:
comparing, at a plurality of times during at least part of the process of charging the battery, the values of the charging parameter monitored with the stored corresponding reference values,
choosing, based upon the results of the most recent comparing the values of the charging parameter monitored with the stored corresponding reference values, one of the sequences of values for the characteristic parameter; and determining the remaining period necessary to charge the battery based upon the chosen stored sequence of reference values.

114. The method of claim 110, wherein the storing reference values step comprises storing a plurality of sequences of values for the characteristic parameter for different types of batteries, and the method further includes the steps of:

choosing, based upon the results of comparing the values of the charging parameter monitored with the stored corresponding reference values, one of the sequences of values for the characteristic parameter; and determining the remaining period necessary to charge the battery based upon the chosen stored sequence of reference values.

115. The method of claim 109, further comprising the steps of:

comparing, at a plurality of times during at least part of the process of charging the battery, the values of the charging parameter monitored with the stored corresponding reference values, redetermining the remaining period necessary to charge the battery based upon the stored reference values in accordance with successive comparisons.

116. A method of charging a rechargeable battery, comprising:

storing indicia of a respective period of time necessary to complete charging corresponding to each of a plurality of values of at least one characteristic parameter of the charging process;

controllably applying a current of a first predetermined value to the battery;

monitoring the battery voltage;

controllably applying a current of a second predetermined value, less than the first predetermined value to the battery in accordance with the battery voltage reaching a first predetermined value;

during a period in accordance with the battery voltage reaching a second predetermined value, determining the value of the one characteristic parameter; and terminating the charging in accordance with the time period corresponding to the value of the characteristic parameter.

117. The method of claim 116, wherein the second predetermined battery voltage value equals the second predetermined battery voltage value.

118. The method of claim 116, wherein the period in accordance with the battery voltage reaching a second predetermined value is a period beginning upon the battery voltage reaching the second predetermined value.

119. The method of claim 116, comprising the steps of:

determining the value of the one characteristic parameter during at a plurality of sequential points during the period in accordance with the battery voltage reaching a second predetermined value; and terminating the charging in accordance with the time period corresponding to at least one of the determined values of the characteristic parameter.

120. An apparatus for charging a rechargeable battery, said apparatus comprising:

an electrical power supply circuit;

a measuring device for generating indicia of the value of at least one characteristic parameter of the charging process at sequential points of time during charging;

a storage circuit for storing indicia of measured parameter values, calculated parameter values and reference values;

a control unit, cooperating with the power supply circuit and the storage circuit, for determining a possible stop point of time for the charging process at least some of the measurement points of time, the stop point time being determined in accordance with a comparison of the measured characteristic parameter with the reference values, and to determine an optimum remaining charging time and thereby an optimum stop point of time from a plurality of possible stop points of time resulting from such comparisons, each comparison being based on a correlation between parameter values at subsequent points of time and their distances in time from their respective possible stop point of time.

121. An apparatus according to claim 120, further comprising a switch cutting-off the charging current to the battery for a brief period before the voltage across the connection terminals of the battery is measured.

122. A method of charging a rechargeable battery having a pair of terminals, said method comprising connecting an electrical power source to the terminals of the battery, monitoring at least one charging parameter during at least part of the process of charging of the battery, comparing a sequence of values of said at least one charging parameter with stored reference parameter sequences representing idealistic or desirable processes of charging the battery for different starting states of charge of the battery, selecting the reference sequence corresponding to the sequence of values of said at least one charging parameter, and controlling the process of charging the battery so as to cause the sequence of subsequent values of said at least one parameter to approximate the selected reference parameter sequence.

123. The method of claim 122, wherein said at least one charging parameter is selected from the group consisting of: the potential across the battery terminals: the magnitude of the charging current supplied to the battery: the temperature of the battery: the rate of change of any of such parameters: and any combination thereof.

124. The method of claim 122, further including the step of briefly supplying voltage to the battery prior to the initiation of the charging process so that charging parameters can be measured, the results of these measurements determining whether the charging process is to be initiated.

125. The method of claim 122, wherein the process of charging is controlled by controlling the voltage supplied to the terminals of the battery.

126. The method of claim 125, wherein the voltage supplied to the battery is controlled so as to maintain the electric charging current supplied to the battery at substantially the same maximum value during a major part of the charging process.

127. An apparatus for charging a rechargeable battery, said apparatus comprising:

connecting means for connecting the battery to an electrical power source, means for monitoring at least one charging parameter during at least part of the process of charging the battery, storing means for storing a plurality of reference parameter sequences representing idealistic or desirable processes of charging the battery for various starting states of charge of the battery, means for comparing the sequence of values of said at least one charging parameter with the stored reference parameter sequences and for selecting the reference course corresponding to the sequence of values of said at least one charging parameter, and means for controlling the process of charging the battery so as to cause the sequence of subsequent values of said at least one parameter to the selected reference parameter sequence.

128. An apparatus according to claim 127, wherein the control means is adapted to briefly supply a voltage to the battery prior to the initiation of the charging process and to measure charging parameters and to determine in response to the measurement results whether the charging process is to be initiated.

129. An apparatus according to claim 127, wherein the control means is adapted to control the process of charging the battery by controlling the voltage supplied to the connecting means.

130. An apparatus according to claim 129, wherein the control means are adapted to control the voltage supplied to the connecting means so as to maintain the electric charging current supplied to the battery connected to the connecting means substantially at the same maximum value during a major part of the charging process.

* * * * *

UNITED STATES PATENT AND TRADEMARK OFFICE
CERTIFICATE OF CORRECTION

PATENT NO. : 5,686,815
DATED : November 11, 1997
INVENTOR(S) : John Reipur, et. al.

It is certified that error appears in the above-identified patent and that said Letters Patent is hereby corrected as shown below:

Column 11, line 54, "temperatur slightly when the charging drop" should read --temperature of the battery may even drop--.

Column 29, line 20, "cede" should read --code--.

Column 30, line 66-67, "representing battery" should read --representing desirable charging processes for different types of battery and--.

Column 32, lines 29-30, "the of comparison of such measure of such measured" should read --the comparison of such measured--.

Column 33, line 5, "a, second" should read --a second--.

Column 34, line 28, "the of comparison" should read --the comparison--.

Column 35, line 12, "a, second" should read --a second--.

Column 38, lines 66-67 delete "applying a current of a first predetermined value to the battery".

Column 41, line 44, "second" should read --first--.

Column 41, line 53, "during at a" should read --during a--..

UNITED STATES PATENT AND TRADEMARK OFFICE
CERTIFICATE OF CORRECTION

PATENT NO. : 5,686,815
DATED : November 11, 1997
INVENTOR(S) : John Reipur, et. al.

It is certified that error appears in the above-identified patent and that said Letters Patent is hereby corrected as shown below:

Column 42, line 4, "process at least" should read --process at at least--.

Signed and Sealed this

Seventh Day of April, 1998

Attest:

BRUCE LEHMAN

Attesting Officer   Commissioner of Patents and Trademarks

Disclaimer 5,686,815—John Reipur, Klampenborg; Ebbe Juul-Hansen, Stenlose, both of Denmark. METHOD AND APPARATUS FOR CONTROLLING THE CHARGING OF A RECHARGEABLE BATTERY TO ENSURE THAT FULL CHARGE IS ACHIEVED WITHOUT DAMAGING THE BATTERY. Patent dated November 11, 1997. Disclaimer filed November 2, 2000, by the assignee, Chartec Laboratories A/S.

Hereby enters this disclaimer to all claims of said patent.

(*Official Gazette*, January 16, 2001)